US010256812B2

(12) United States Patent
Leong et al.

(10) Patent No.: US 10,256,812 B2
(45) Date of Patent: Apr. 9, 2019

(54) HALF BRIDGE COUPLED RESONANT GATE DRIVERS

(71) Applicant: Infineon Technologies Austria AG, Villach (AT)

(72) Inventors: Kennith Kin Leong, Villach (AT); Wenduo Liu, Thousand Oaks, CA (US); Gerald Deboy, Klagenfurt (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 19 days.

(21) Appl. No.: 15/432,743

(22) Filed: Feb. 14, 2017

(65) Prior Publication Data

US 2018/0013422 A1   Jan. 11, 2018

Related U.S. Application Data

(60) Provisional application No. 62/360,028, filed on Jul. 8, 2016.

(51) Int. Cl.
*H03K 17/687* (2006.01)
*H02M 3/156* (2006.01)
*H03K 17/06* (2006.01)

(52) U.S. Cl.
CPC ........ *H03K 17/6871* (2013.01); *H02M 3/156* (2013.01); *H03K 17/063* (2013.01); *H03K 2217/009* (2013.01); *H03K 2217/0045* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS 5,408,150 A *  4/1995  Wilcox .................. H02M 1/38
                                                326/104
9,698,768 B2 * 7/2017  Leong ................. H03K 17/167
(Continued)

OTHER PUBLICATIONS

Heyday Integrated Circuits, "Create the best power modules ever . . . ," http://heyday-ic.com, printed Oct. 27, 2017; 4 pages.
(Continued)

*Primary Examiner* — Cassandra Cox
(74) *Attorney, Agent, or Firm* — Slater Matsil, LLP

(57) ABSTRACT

In accordance with an embodiment, a method of controlling a switch driver includes energizing a first inductor in a first direction with a first energy; transferring the first energy from the first inductor to a second inductor, wherein the second inductor is coupled between a second switch-driving terminal of the switch driver and a second internal node, and the second inductor is magnetically coupled to the first inductor; asserting a first turn-on signal at the second switch-driving terminal using the transferred first energy; energizing the first inductor in a second direction opposite the first direction with a second energy after asserting the first turn-on signal at the second switch-driving terminal; transferring the second energy from the first inductor to the second inductor; and asserting a first turn-off signal at the second switch-driving terminal using the transferred second energy.

26 Claims, 64 Drawing Sheets

(56) References Cited

U.S. PATENT DOCUMENTS

2014/0077778 A1\* 3/2014 Sato .................. H01L 29/407
                                                    323/282
2016/0043624 A1\* 2/2016 Jarvinen ............. H02M 1/084
                                                    323/271

OTHER PUBLICATIONS

Yao, Kaiwei, "A Novel Resonant Gate Driver for High Frequency Synchronous Buck Converters," IEEE Transactions on Power Electronics, vol. 17, No. 2, Mar. 2002, 7 pages.

\* cited by examiner

Floating Side Logic -- Hard switching (CCM)

HALF BRIDGE COUPLED RESONANT GATE DRIVERS

This application claims the benefit of U.S. Provisional Application No. 62/360,028, filed on Jul. 8, 2016, which application is hereby incorporated herein by reference in its entirety.

TECHNICAL FIELD

The present invention relates generally to electronic circuits and more particularly to half bridge coupled gate drivers.

BACKGROUND

Switched-mode power supplies and motor drives often use half-bridge or full-bridge switching topologies to transfer energy from an input supply to a regulated output node. A half-bridge topology includes, for example, two switches that are connected in a totem pole configuration, while a full-bridge includes two half-bridge circuits coupled in parallel. A gate driver circuit is used to drive the each of the switches in the half-bridge configuration.

In various switched-mode power supply applications, a low side gate driver and a high side gate driver circuit may be used to control a low side switch and a high side switch respectively in the half-bridge. The low side switch is often referenced to a ground voltage and the low side gate driver circuit is designed to generate a gate control signal that is also referenced to the ground voltage. The high side driver, on the other hand, may not be referenced to ground and may use bootstrapped power supply techniques in order to supply power to the high side switch. One such bootstrap technique involves using a bootstrap capacitor to effectively create a local floating power supply for the high side switch driver that is referenced to a node of the high side switch. During each switching cycle, the bootstrap capacitor provides energy to the high side switch driver and then is recharged via a diode that is connected to the low side switch. In typical systems, additional level shifting circuits are used to activate the high side switch driver with ground referenced logic signals.

SUMMARY

In accordance with an embodiment, a method of controlling a switch driver includes energizing a first inductor in a first direction with a first energy; transferring the first energy from the first inductor to a second inductor, wherein the second inductor is coupled between a second switch-driving terminal of the switch driver and a second internal node, and the second inductor is magnetically coupled to the first inductor; asserting a first turn-on signal at the second switch-driving terminal using the transferred first energy; energizing the first inductor in a second direction opposite the first direction with a second energy after asserting the first turn-on signal at the second switch-driving terminal; transferring the second energy from the first inductor to the second inductor; and asserting a first turn-off signal at the second switch-driving terminal using the transferred second energy.

BRIEF DESCRIPTION OF THE DRAWINGS

For a more complete understanding of the present invention, and the advantages thereof, reference is now made to the following descriptions taken in conjunction with the accompanying drawings, in which:

FIG. 6b illustrates waveform diagram that corresponds with the embodiment resonant gate driver of FIG. 6a;

FIG. 7b illustrates waveform diagram that corresponds with the embodiment resonant gate driver of FIG. 7a;

FIG. 8b illustrates waveform diagram that corresponds with the embodiment resonant gate driver of FIG. 8a;

FIG. 9b illustrates waveform diagram that corresponds with the embodiment resonant gate driver of FIG. 9a;

FIG. 14a illustrates a flow chart of an embodiment method of operating a high side resonant gate driver of the first alternative embodiment resonant gate driver of FIG. 6a;

FIG. 14b illustrates a flow chart of an embodiment method of operating a low side gate driver of the first alternative embodiment resonant gate driver system of FIG. 6a;

FIG. 15a illustrates a flow chart of an embodiment method of operating a low side gate driver of the third alternative embodiment resonant gate driver system of FIG. 8a;

FIG. 15b illustrates a flow chart of an embodiment method of operating a high side gate driver of the third alternative embodiment resonant gate driver system of FIG. 8a;

FIG. 16a illustrates a flow chart of an embodiment method of operating a high side gate driver of the third alternative embodiment resonant gate driver system of FIG. 9a;

FIG. 16b illustrates a flow chart of an embodiment method of operating a low side gate driver of the third alternative embodiment resonant gate driver system of FIG. 9a;

Corresponding numerals and symbols in different figures generally refer to corresponding parts unless otherwise indicated. The figures are drawn to clearly illustrate the relevant aspects of the disclosed embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present disclosure will be described with respect to preferred embodiments in a specific context, namely a system and method for operating a resonant gate driver circuit driving a half-bridge configuration. Embodiments of the present disclosure may also be applied to various systems that utilize switching transistors, such as switched-mode power supplies (SMPS) and various H-bridge drivers. Embodiments may also be directed toward driving half-bridge and full-bridge topology that include devices such as, but not limited to, a MOSFETs, IGBTs, gallium nitride (GaN) MOSFET.

In an embodiment, a low side resonant gate driver circuit and a high side resonant gate driver circuit are designed to drive a half-bridge switching circuit that may be used in a switched-mode power supply. In a first step, the low side driver energizes a low side inductor in one direction and transfer energy from the low side inductor to a magnetically coupled high side inductor. The transferred energy is used to charge a bootstrap capacitor that acts a reservoir of energy for the high side gate driver. Once the bootstrap capacitor is charged, the transferred energy may be used to turn on a high side switching device by charging a gate node of a high side switching device in the half-bridge.

While deactivating the high side switching device, the low side inductor is energized again in opposite direction and is used to charge a gate control node of the high side switching device. In other embodiments, the high side drive is powered via the magnetic coupling between the high side inductor and the low side inductor. In such case, a bootstrap diode, which is typically coupled between a low side driver and the high side driver, is not used.

Figure 1:
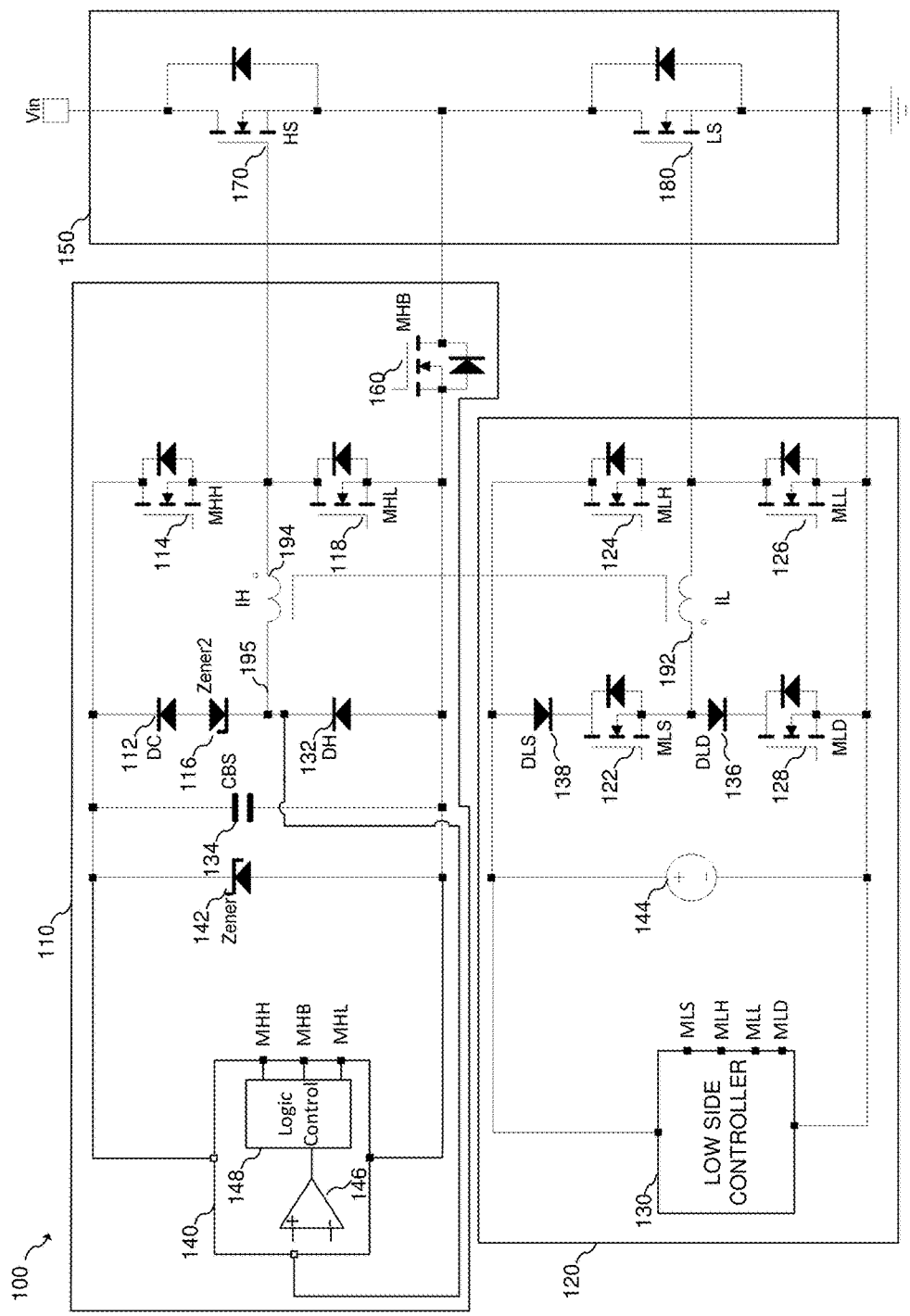
FIG. 1 illustrates an embodiment resonant gate driver system.

FIG. 1 illustrates a block diagram of an embodiment half-bridge resonant gate driver circuit 100 that includes a high side gate driver 110, a low side gate driver 120 and a half-bridge switching circuit 150. A low side inductor 192 is connected to the low side gate driver and it is magnetically coupled to a high side inductor 194 that is connected to the high side gate driver 110. Low side driver 120 uses a power supply 144 to control a gate node of a low side switching device 180 in the half-bridge switching circuit 150. Low side inductor 192 is connected between gate node of the low side switching device 180 and an internal node of low side gate driver 120.

As shown, the low side gate driver circuit 120 is implemented by switches 122, 124, 126 and 128 in a full H-bridge configuration having low side inductor 192 coupled between the outputs of each half of the full H-bridge. During operation, low side inductor 192 is magnetized in one direction by connecting it between the power supply 144 and a reference node of the low side gate driver using switches 124 and 128. Low side inductor 192 is also magnetized in an opposite direction by selecting switches 122 and 126. Switch 124 is also used to pull the gate node of the low side switching device 180 to input supply 144.

In the present embodiment, the switches 122, 124, 126 and 128 are implemented using NMOS transistors. Alternatively, the switches 122, 124, 126 and 128 may be implemented using other transistor types or other switching structures, for example, a PMOS transistors and bipolar transistors. In another embodiment, a diode 138 may be connected between the drain of switch 122 and power supply 144. Similarly, another diode 136 may be connected between a source of switch 122 and a drain of switch 128. Alternatively, diode 138 may be coupled between the source of switch 122 and inductor IL, and diode 136 may be coupled between the source of switch 128 and ground.

High side gate driver no includes a half H-bridge configuration that uses a pull up switch 114 and a pull down switch 118 to pull one end of an inductor terminal to an input power supply or to a reference node. This is done by connecting one end of the high side inductor 194 to the common point of the half H-bridge, which is also connected to the gate control node. The other end of the inductor is connected to an internal node of high side driver no. A sensing diode 132 is connected between a high side reference node and the internal node. The voltage at the internal node is used to control switches 114 and 118 during the operation of the high side gate driver. A second diode 112 is coupled between the internal node of the high side driver and a top terminal of a bootstrap capacitor 134. A bottom terminal of the bootstrap capacitor is connected to the high side reference node. By connecting the bootstrap capacitor across the high side gate driver, power is provided to the high side gate driver by the charge stored across the bootstrap capacitor. A first zener diode 142 is connected in parallel with bootstrap capacitor 134 to limit charging bootstrap capacitor to a zener voltage with respect to the high side reference node.

Diode 112 and zener diode 116 provides a current path for the inductor current to bootstrap capacitor 134 when the internal node 195 of the high side gate driver swings very high. These diodes effectively clamp internal node 195 to a voltage above bootstrap capacitor 134 that is approximately the sum of the zener voltage of diode 116 and the forward voltage of diode 112.

During operation, low side inductor 192 is energized in a first direction using a current from input power supply 144. Switches 124 and 128 are turned for a predetermined time to store a specific amount of energy across the low side inductor 192. Switch 124 is turned off after the predetermined time and gate charge that is responsible for turning on low side switching device 180 is then transferred to low side inductor 192. Low side switching device 180 turns off due to this transfer of energy. The energy stored in low side inductor 192 is transferred to high side inductor 194 when switch 128 is turned off.

The transferred energy at the high side inductor 194 is used to charge the gate control node of high side switching device when switch 118 is turned off based on the voltage of the internal node of the high side gate driver. Next, low side inductor 192 is magnetized in a second direction that is opposite to first direction, by turning on switches 122 and 126 for a predetermined time. A second energy is stored in the low side inductor 192 after switch 122 is turned off. The second energy is transferred to high side inductor 194 and used to discharge the gate control node of high side switching device 170 when switch 114 is turned off.

High side gate driver no includes a control circuit 140 that includes a comparator 146 and a logic circuit 148 that generates control signals MHH, MHB and MHL based on an output of comparator 146. In some embodiments, two or more comparators may be used to generate control signals MHH, MHB and MHL. Comparator 146 compares a voltage at the internal node of high side gate driver no with a two target reference voltages, one of which is a positive voltage for example, +0.5V and the other is negative voltage, for example, −10 V. Switch 118 is turned off when the internal node crosses a reference voltage of +0.5 V and switch 114 is turned on when the internal node crosses a reference voltage of −10 V. These two reference voltages are an example and many different values can be chosen based on different designs. Control circuit 140 may be powered from bootstrap capacitor 134 to eliminate the use of a boot strap diode. Furthermore, level-shift circuits to control switches 114 and 118 are also eliminated since the control of the high side circuit no is entirely dependent on the voltage across the diode 132.

FIGS. 2a-2h illustrate current flow and switch states of the embodiment resonant gate driver 100 during a period of controlling switching devices in half-bridge 150. FIGS. 3a-3d illustrate corresponding waveform diagrams that correspond with resonant gate driver shown in FIGS. 2a-2h. The waveform diagrams of FIGS. 3a-3d include switch control signals MHH, MHL, MLH, MLL, MLD, and MLS with a high level corresponding to an on-state of the switch and a low level corresponding to an off-state; voltage VDH across diode 132; voltage VBSC across bootstrap capacitor 134; a current IL through low side inductor 192 and a current IH through high side inductor 194.

Figure 3A:
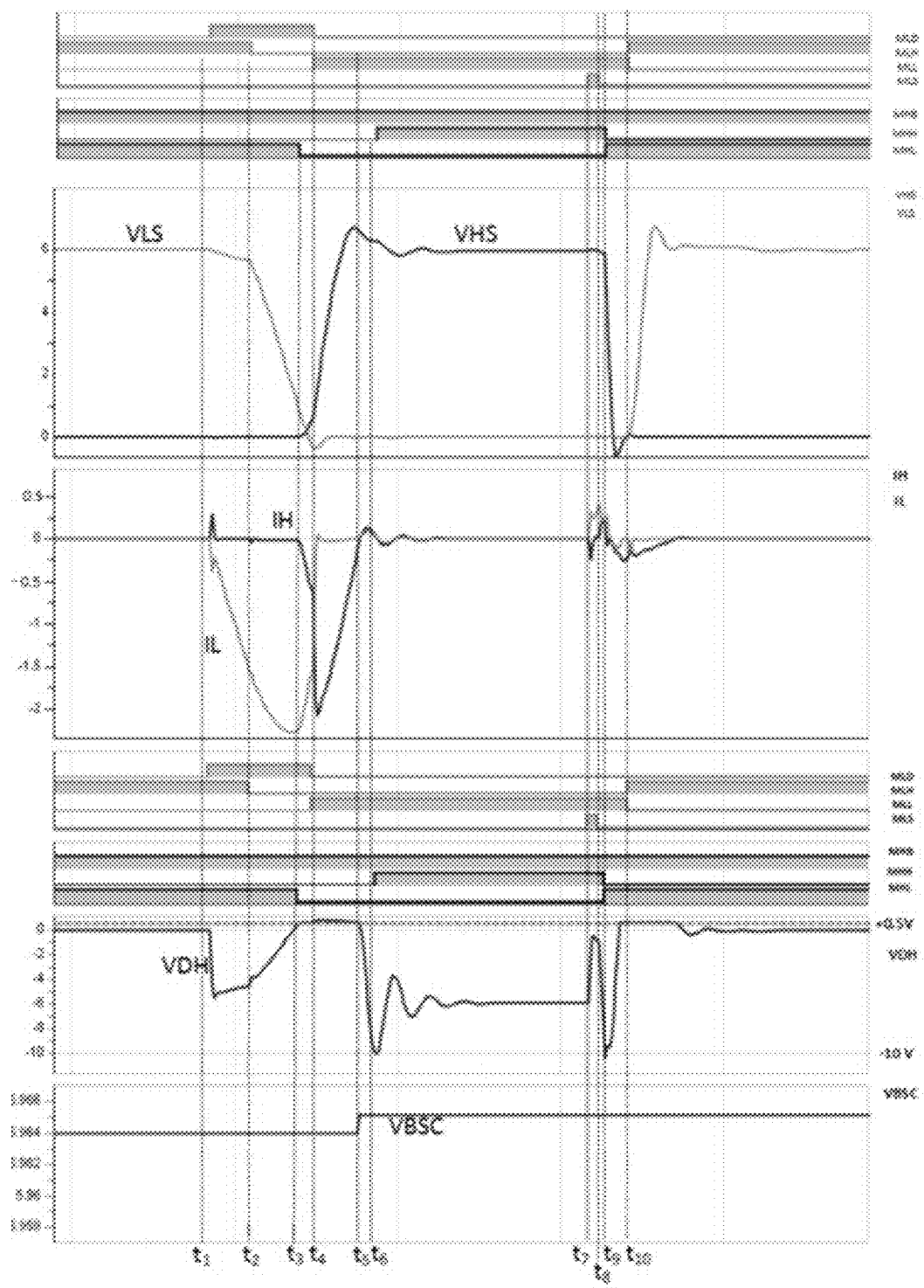
FIGS. 3a-3d illustrate waveform diagrams that correspond with the resonant gate driver system of FIGS. 2a-2h.

The signal traces in waveform diagram of FIG. 3a illustrate a full cycle of switching half-bridge that begins with a turned on low side switching device at a time $t_{10}$. The full cycle of the switching half-bridge includes turning off low-side switching device 180, turning on high-side switching device 170, turning off high-side switching device 170, and then turning on low-side switching device 180.

Figure 2A:
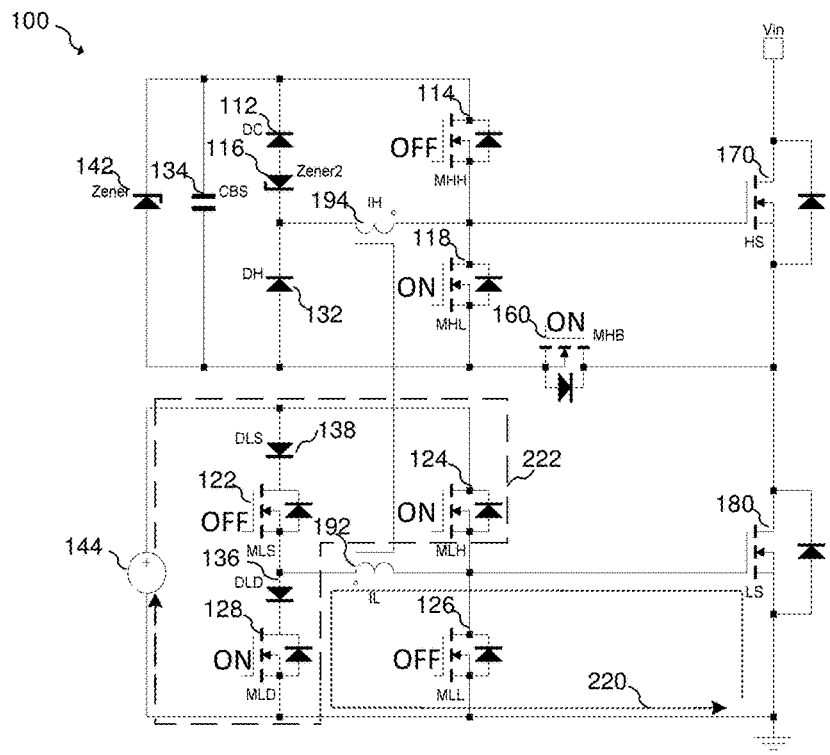
FIGS. 2a-2h illustrate current flow and switch states in an embodiment low side and high side resonant gate drivers according to an embodiment resonant gate driver system.
Figure 3B:
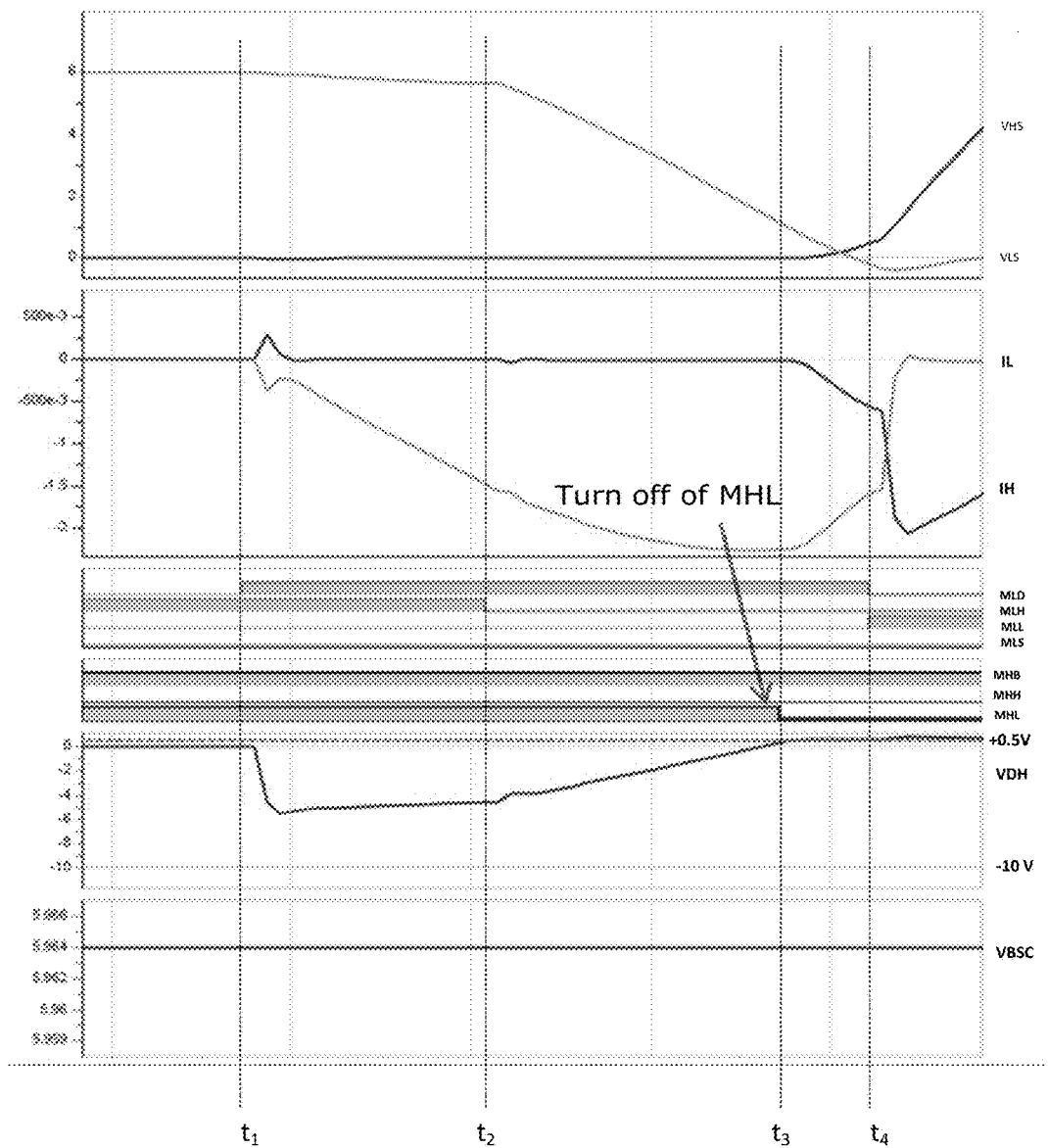

The operation of the present embodiment will be described by dividing the circuit operation into several continuous time periods, from time $t_0$ to $t_{10}$. FIG. 2a illustrates a configuration of resonant gate driver 100 during a first time period between time $t_1$ and $t_2$. The waveforms in FIG. 3b is an expanded view of time $t_1$ to $t_4$. As shown in FIG. 2a, the embodiment gate driver circuit 100 begins with a turned on low side switching device 180 and a turned off high side switching device 170. The switches 118, 124 and 160 are in ON state and switches 122, 126, and 128 are in OFF state as shown in FIG. 2a.

At time $t_1$, low side inductor 192 is energized by a current flow from the input power supply 144 within current loop 222. Energy stored in inductor 192 is transferred to high side inductor 194 and is used to recharge the bootstrap capacitor 134. In such embodiments, the energy may be transfers from low side inductor 192 to bootstrap capacitor 134 without using bootstrap diode. Between time $t_1$ and $t_2$, high side switching device 170 remains turned off by having switch 118 shorting the gate control node to a source node that is also the common node between the low side switching device 180 and the high side switching device 170. The gate to source voltage of high side switching device 170 is denoted as voltage VHS throughout the various waveform diagrams in the specification. As shown, voltage VHS remains around zero throughout the period $t_1$ and $t_2$. At the end of this period or at time $t_2$, switch 124 is turned off to allow transfer of gate charge of low side switching device 180 to low side inductor 192.

Figure 2B:
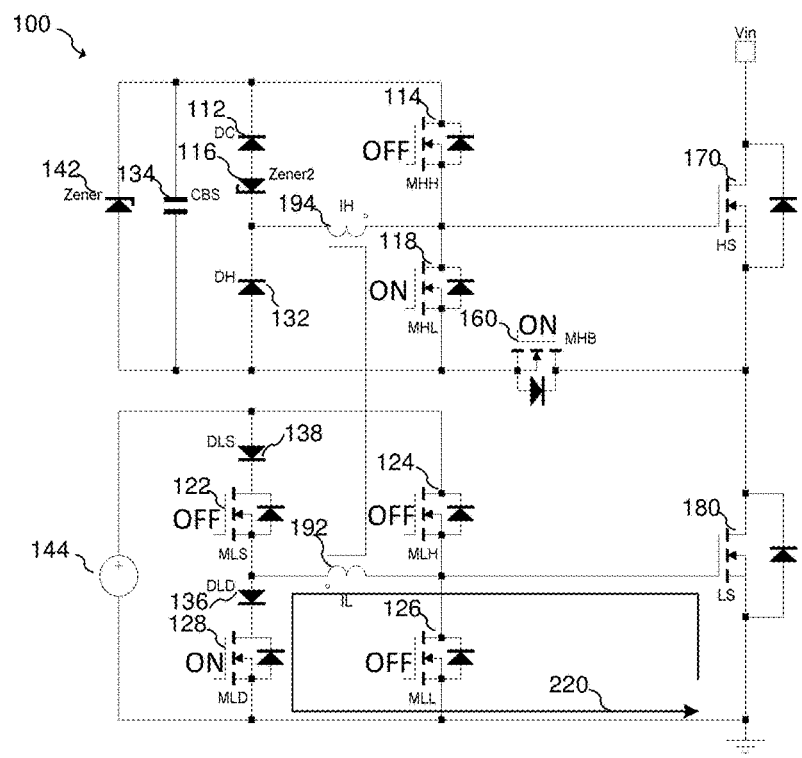

FIG. 2b illustrates the state of the circuit during the time period from time $t_2$ to time $t_3$ in which switches 114, 122 and 126 are off, and switches 118, 128 and 160 are on. During this time period, low side inductor 192 is further energized as the gate of switching device 180 discharges through inductor 192 and switch 128 within current loop 220. As shown in FIG. 3b, gate-source voltage VLS of the low side switching device 180 becomes more negative throughout this period between time $t_2$ and $t_3$, while current IL though low side inductor 192 continues to increase in the negative direction and levels off.

The waveform diagram of FIG. 3b that illustrates an expanded time scale between $t_1$ to $t_4$. As shown, a high side inductor current IH gradually increases after time $t_3$ and voltage VHS also begins to increase. Low side inductor current IL is decreases and voltage VLS approaches zero during the time period of $t_3$ and $t_4$. Switch signals MLD, MLH, MLL, MLS, MHH and MHL toggles between high and low based on the state of corresponding switches. A switch signal high corresponds to a switch state ON and a switch signal low corresponds to a switch state OFF as shown in FIGS. 2a-2h. Switch 160 remains on throughout FIGS. 2a-2h to insure connection between the reference node of the high side gate driver no and the source node of the high side switching device 170.

Voltage VDH, which is the forward voltage of diode 132, is monitored by comparator 146. When voltage VDH crosses a threshold of +0.5 V at time $t_3$, comparator 146 toggles and turns off switch 118, which is responsible for keeping gate-source voltage of high side switching device 170 at zero or at a sufficiently low to keep it turned off. It should be noted that in this embodiment, threshold is selected to be +0.5 V, however; in other application it may be different voltage based on design requirements. After time $t_3$, current IL starts decreasing when switch MHL is turned off based on voltage VDH crossing a threshold of +0.5 V. A comparator may be used to monitor voltage VDH with a reference voltage of +0.5 V and switch signal MHL is controlled by the output of the comparator.

Figure 2C:
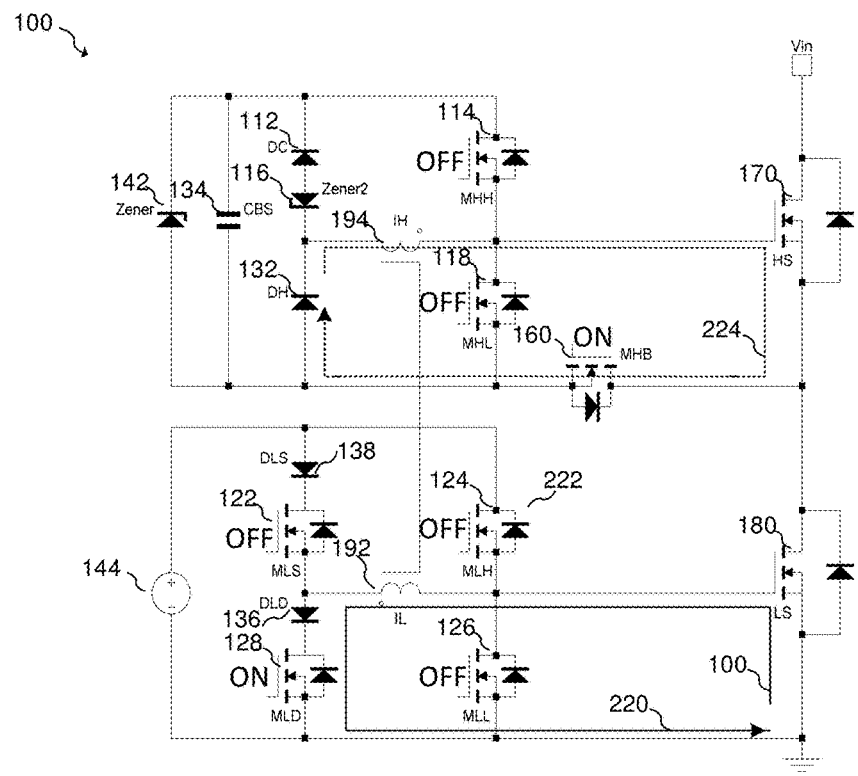

FIG. 2c illustrates a third time period between time $t_3$ and $t_4$ when high side switching device 170 begins to turn on by a current in a current loop 224. A delay may be used on the low side gate driver between turning off switch 124 and turning on switch 126 at time $t_4$. Current loop 224 flowing through the high side inductor 194 charges the gate control node of high side switching device 170. During this time period current loop 220 further discharges the gate control node of low side switching device 180. At the end of this period or at time $t_4$, switch 128 is turned off and switch 126 is turned on.

Figure 2D:
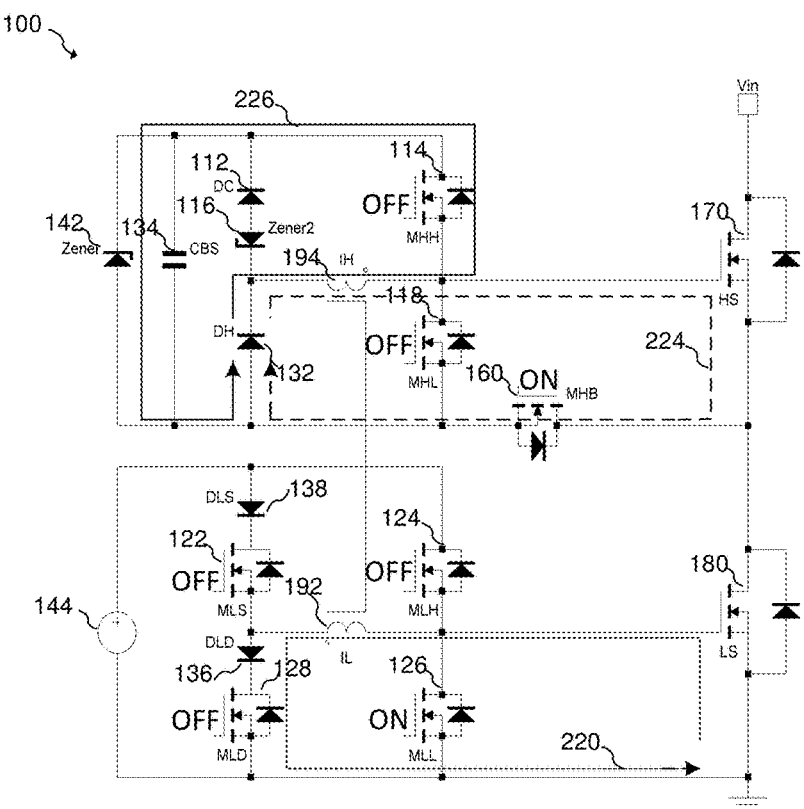

FIG. 2d illustrates a fourth time period between time $t_4$ and $t_5$ when high side switching device 170 starts turning on by the current loop 224. At time $t_4$, switch 126 is turned on and switch 128 is turned off. By turning off switch 128 the current path for current loop 220 is blocked. The current path via the body diode of switch 122 is blocked by the diode 138. The energy in the low side inductor 192 is transferred to the high side inductor 194 at this time and current IH in the high side inductor finds a conduction path from the source node of high side switching device 170 via switch 160, diode 132 and to the gate control node of high side switching device 170 as shown by current loop 224.

Figure 3C:
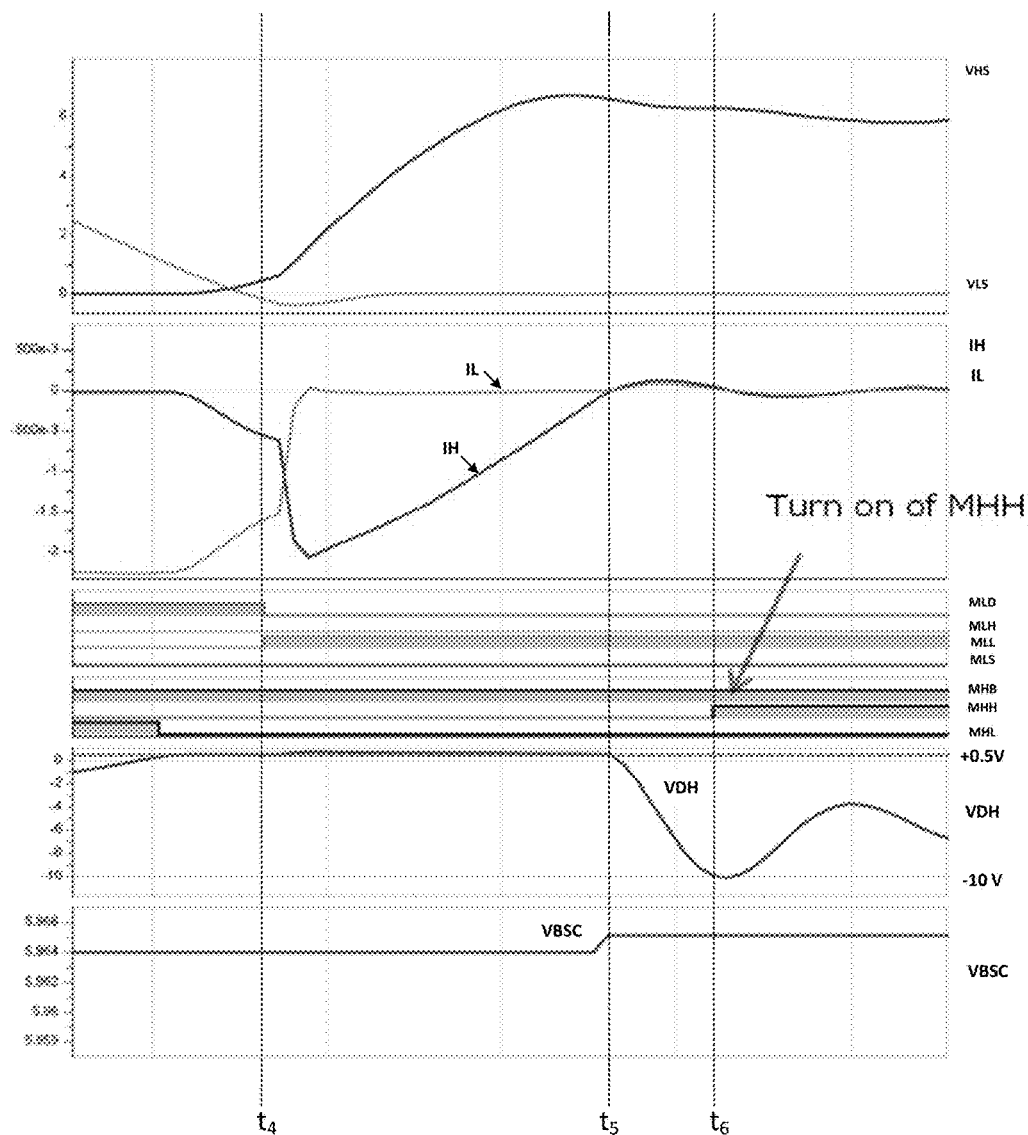

FIG. 3c illustrates a waveform diagram with expanded time steps between time $t_4$ to $t_6$ and depicts different traces of voltages and currents as shown in FIG. 3a. A second current loop 226 is formed via diode 132, body diode of switch 114 and bootstrap capacitor 134 and provides a small amount of current through the high side inductor 194 and charges bootstrap capacitor 134 and raises bootstrap capacitor voltage VBSC as shown by the signal trace VBSC. Voltage VDH across diode 132 remains forward biased till time $t_5$ and reverse biases to −10 V at time $t_6$ due to resonance. It should be understood that the reverse bias voltage of −10V is only an example of many possible reverse bias voltage values. In alternative embodiments, other reverse bias voltages may be used. Switch 114 is tuned on when VDH goes below a reference threshold at time $t_6$ which is described in detail in the next paragraph. Current IH in high side inductor rises immediately to peak value of approximately −2 A after time $t_4$ and decays to zero by time $t_5$ due to demagnetization of the high side inductor 194.

Figure 2E:
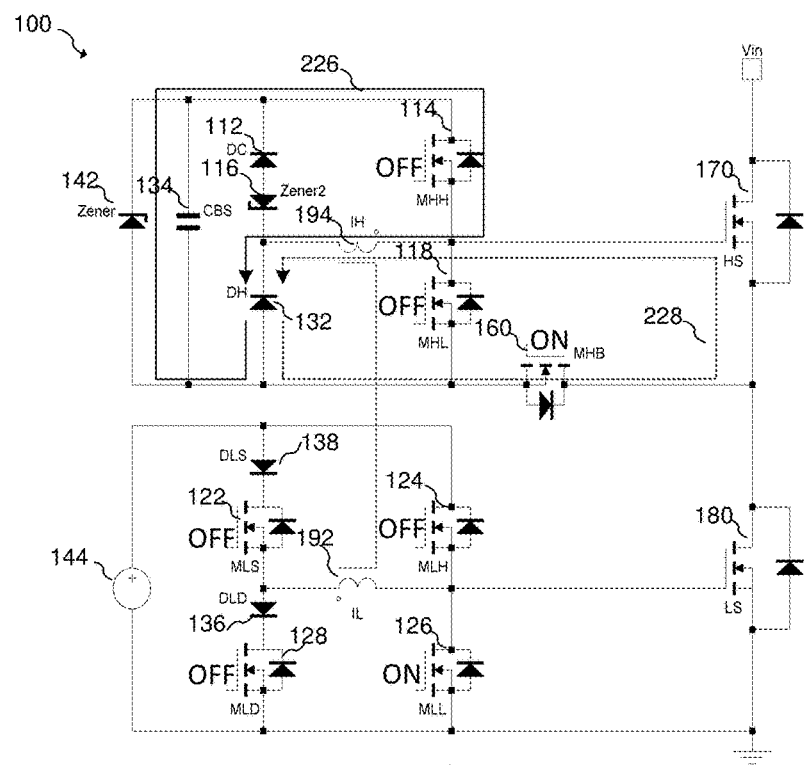

FIG. 2e illustrates the state of circuit 100 during a fifth time period between time $t_5$ and $t_6$. During this period, the current IH in high side inductor has reversed its polarity from its previous direction and is slightly conducting in the reverse direction via current loops 226 and 228. Voltage VDH across diode 132 reverses from positive polarity to a negative polarity. As a result, comparator 146 toggles when voltage VDH crosses a predetermined threshold and turns on switch 114. In the present embodiment, comparator 146 toggles when VDH crosses a threshold of −10 V.

Figure 3D:
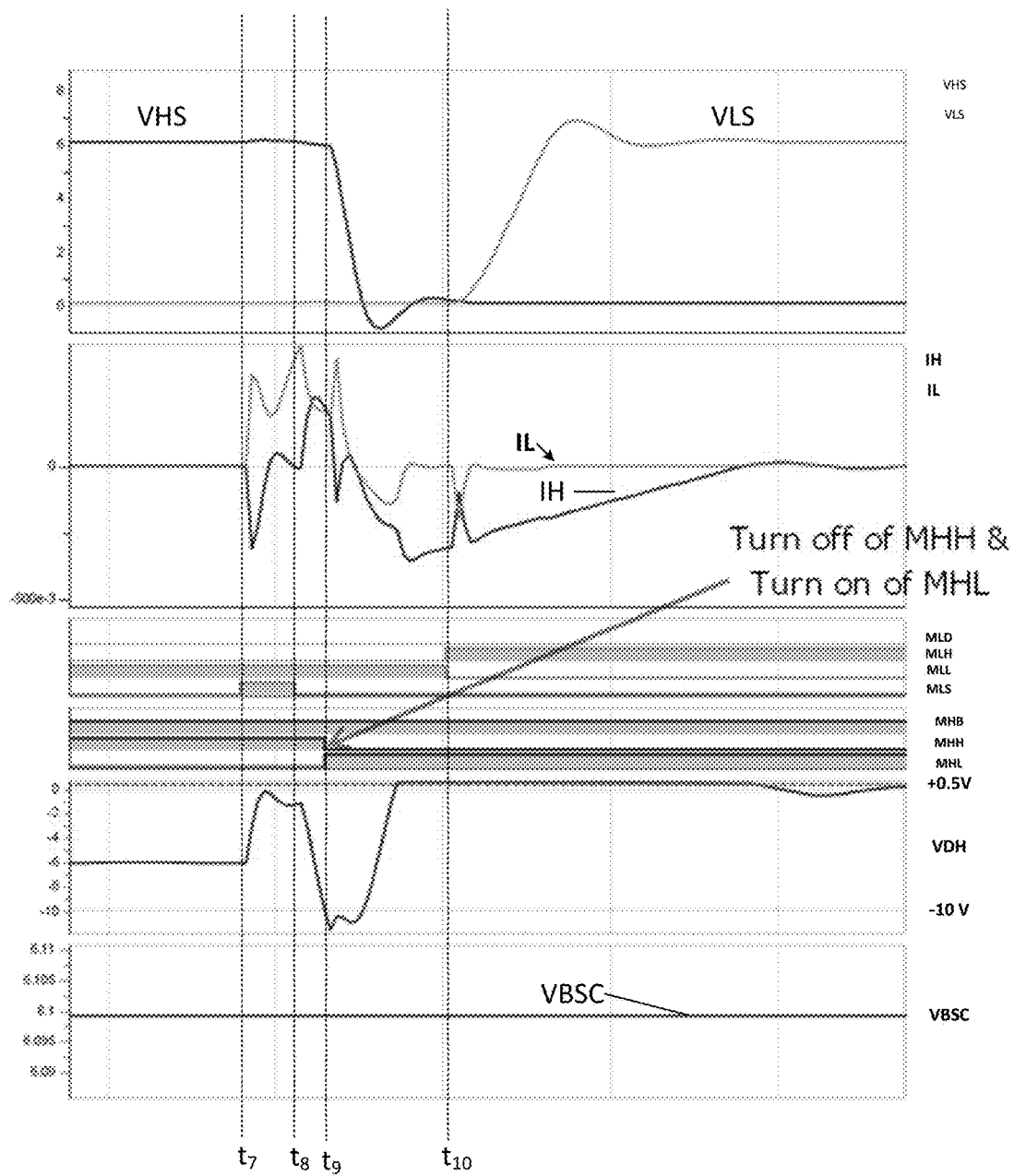

A sixth time period between time $t_6$ to $t_7$ indicates a steady state situation when high side gate switching device 170 remains turned on and low side switching device 180 remains turned off. Currents IH and IL in the high and low side inductors respectively, have decreased to zero. Switch 114 and switch 126 remains turned on until time $t_7$ as shown in FIG. 3d.

Figure 2F:
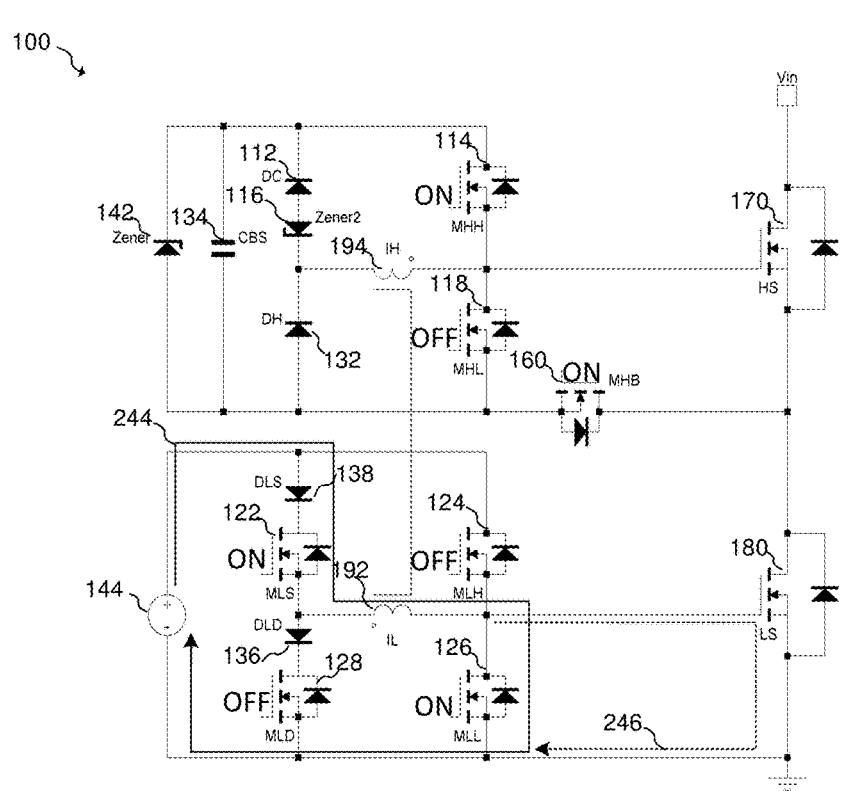

FIG. 2f illustrates the state of circuit 100 during a seventh time period between time $t_7$ and $t_8$. This time period is a second energizing period where low side inductor 192 is charged with a second energy in a second direction opposite to the first direction by turning switch 122 on and generating a current loop 244 that is supplied by input supply 144 via switch 122 and switch 126. The gate of 180 is also slightly charged above zero volts via the current loop 246; however, energy stored within the gate of low side switch is discharged though switch 126 as long as switch 126 remains on.

The second energy stored in low side inductor 192 during this period between time $t_7$ and $t_8$ is transferred to high side inductor 194 at a later period in order to send a signal to turn off the high side switching device 170. The waveform diagram of FIG. 3d shows an expanded time axis and shows various voltage and current signals for the time period between time $t_7$ and $t_{10}$.

Figure 2G:
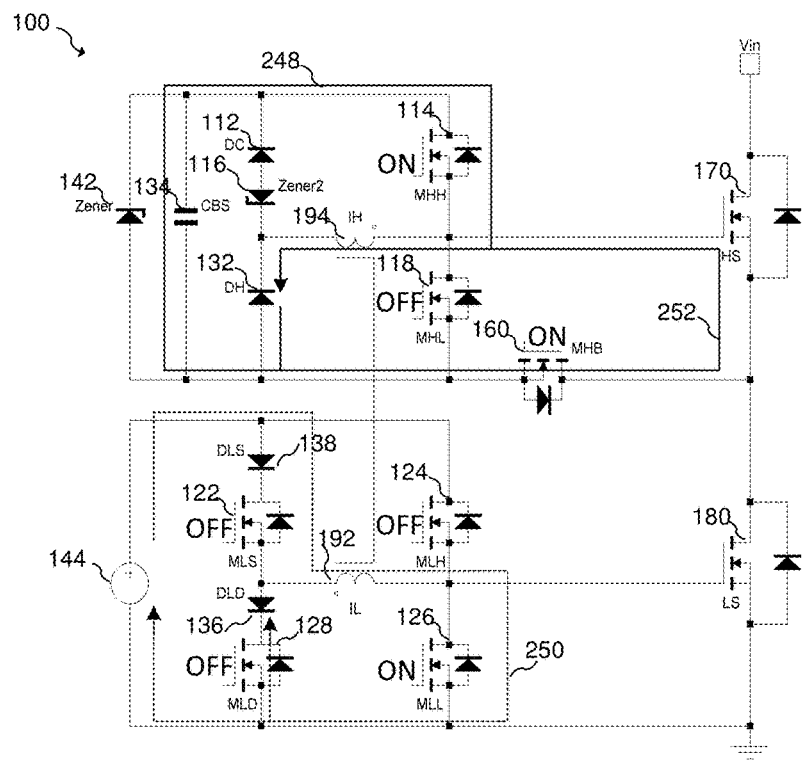

FIG. 2g illustrates an eighth time period between time $t_8$ and $t_9$. The period begins with switch 122 turned off at time $t_8$ and current through high side inductor flows in a direction shown by current loop 250. The current in the current loop 250 charges various output capacitances associated with the control switches in the low side gate driver 120. The high side gate control node remains high as long as switch 114 remains on. Internal node of the high side gate driver is charged by the current in current loop 248 and voltage VDH of diode 132 keeps going negative as a result of this charging current and at time $t_9$, voltage VDH crosses a second threshold of −10 V. Switch 114 is turned off and switch 118 is turned on based on the comparison of VDH and the reference voltage of −10 V. As stated earlier, the second threshold is set to −10 V; however, other threshold voltages can be chosen based on the application and design requirements.

Figure 2H:
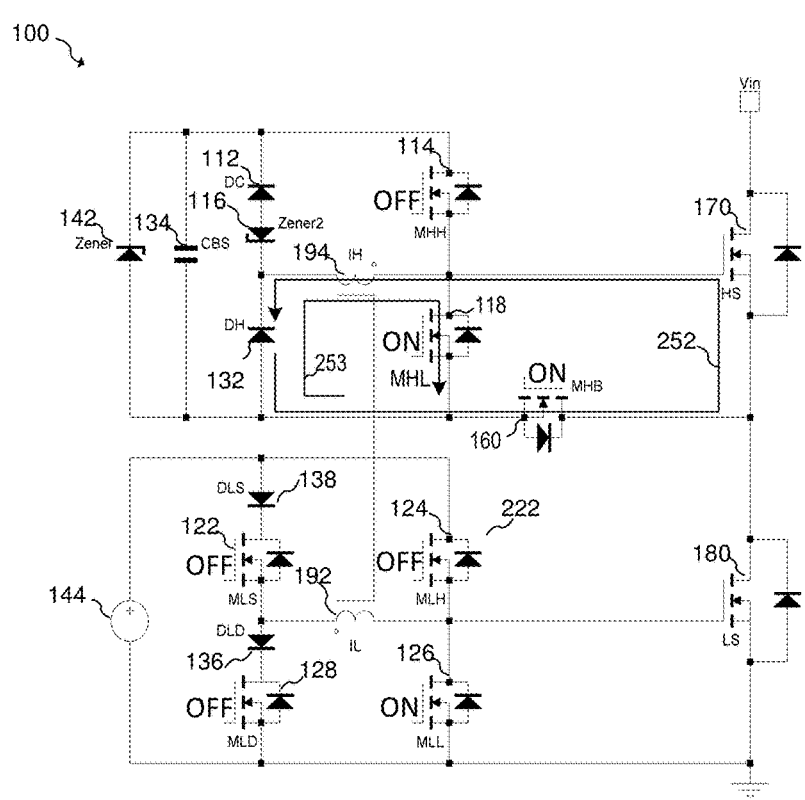

FIG. 2h illustrates an eighth time period between time $t_9$ and $t_{10}$ where current flowing through high side inductor 194 forms a current loop 252. The current associated with the current loop 252 discharges the high side gate control node and turns high side switching device 170 off. The high side switching device 170 is turned off by shorting the source node to the gate node of 170 via the switches 118 and 160. The eighth time period ends by activating switch 124 to turn on the low side switching device 180.

As shown in FIG. 3d, voltage VHS remains at around 6 V until time $t_9$. At time $t_7$, Current IL starts rising due to the energizing of low side inductor 192 in the opposite direction. At time $t_8$, switch 122 is switched off and the voltage VDH across diode 132 decrease towards −10V. After the VDH crosses −10V at time $t_9$, and the state of 114 and 118 toggle, VDH increases towards zero and reaches a positive voltage when the energy stored in the coupled inductor 194 and 192 starts discharging via the current loop 253. The high side switching device 170 starts turning off around time $t_9$ when the state of 114 and 118 toggle. After time $t_{10}$, signal MLH is set high to turn on low side switching device 180 and the whole cycle is repeated. The period between t8 and t10 can be set as a delay. In various embodiments, the length of this delay depends on the individual switches and design.

In an embodiment of the present disclosure, the bootstrap capacitor may be charged to a desired level before driving the half-bridge. The charging of the bootstrap capacitor is done by using a transferred energy from the low side inductor to the high side inductor during a start-up period. An embodiment start-up sequence uses magnetically coupled low side inductor and the high side inductor to transfer energy to the bootstrap capacitor in the high side driver. A bootstrap diode that is typically used to charge the bootstrap capacitor via low side gate driver power supply may be eliminated by using embodiment start-up method.

Figure 4A:
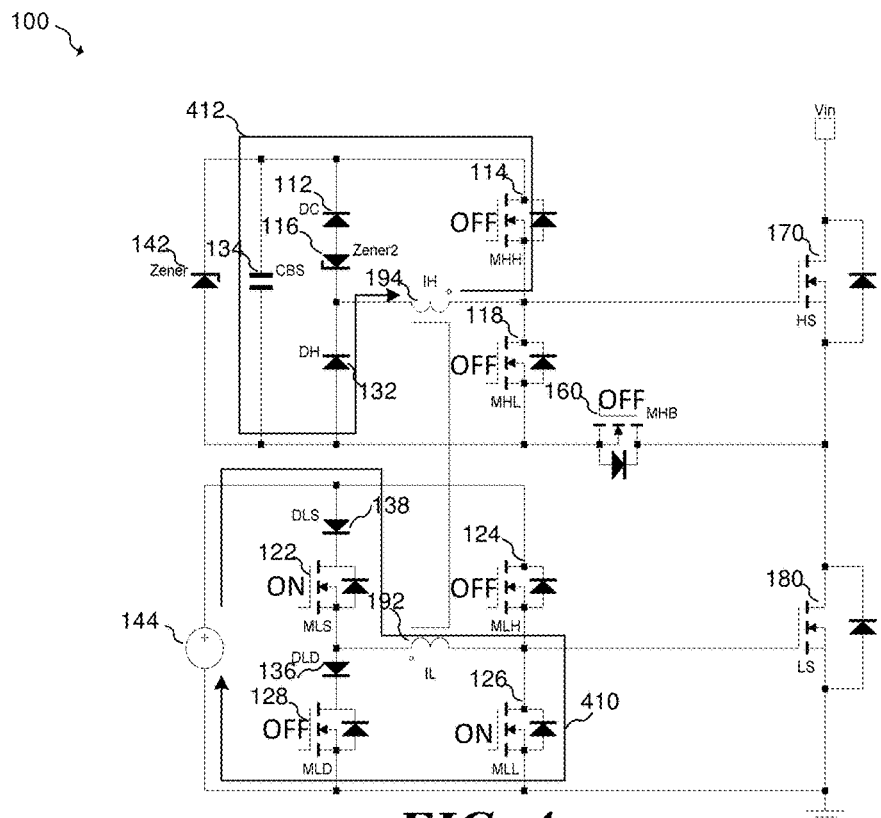
FIGS. 4a-4f illustrate current flow and switch states in an embodiment start-up method of an embodiment resonant gate driver system.

FIG. 4a-4f describes the step by step operation of the embodiment start-up method to charge the bootstrap capacitor 134 of resonant gate driver 100. The waveform diagrams of FIG. 5a-5c illustrate various voltages and currents describing the functional behavior of the embodiment start-up operation. FIG. 5b is an expanded time of start-up sequence that includes three energizing sequence of low side inductor when bootstrap capacitor voltage VBSC is very low. FIG. 5c illustrates a waveform diagram during start-up sequence when VBSC is around a target voltage, for example, +6 V. As shown in FIG. 4a, low side inductor 192 is energized in a direction shown by current loop 410. The low side inductor 192 is charged from power supply 144 via diode 138, switch 122 and switch 126. During the start-up, low side switching device 180 remains turned off via switch 126. Switch 126 remains turned on throughout the start-up sequence. Similarly, high side switching device 170 also remains turned off throughout the start-up sequence off by having switch 160 turned off and a reference or source node of high side switching device 170 remains isolated from the high side driver. A second current loop 412 shows a path for transferred energy that is used to charge the bootstrap capacitor 134. The current loop 412 flows through the diode 132 via the high side inductor 194, and a body diode of the switch 114 to charge the bootstrap capacitor 134. Thus, the gate driver circuit operates like forward resonant circuit using the body diode of switch 114 for the current loop 412.

The energizing of low side inductor 192 is performed for a predetermined period of time when both switch 122 and 126 are turned on. After the predetermined time has elapsed, the switch 122 is turned off and current IL in low side inductor is allowed to decrease before it is ready to be energized again. In an embodiment, the start-up process with repeated charging of the inductor may continue for a fixed period of time, for example, 200 us. In another embodiment, the start-up process may continue until the bootstrap capacitor reaches a target threshold voltage, for example, 6 volts. The fixed period of start-up time can be of any time period based on, for example, value of the bootstrap capacitor, value of the inductors and the value of low side input supply, and the like. Similarly, the target threshold voltage may be chosen based on design and application requirements.

As shown in FIG. 5a, voltages VHS and VLS remain zero until time $t_s$, when the start-up sequence ends. Current IL is ramped to a value of 1 A and decays at a frequency set by the period of switch signal MLS. Current IL reaches a peak value of 6.5 A at the beginning when bootstrap capacitor voltage VBSC is around zero. Once bootstrap capacitor VBSC reaches a value around 4.2 volts, current IL decreases to peak value of 1.5 A. A zener leakage current Izener2, which is the current through zener diode 116, is also shown in FIG. 5a. Izener2 is the clamping current when the internal node voltage of high side gate driver reaches a voltage of about the sum of the zener voltage of diode 116 and the forward voltage of diode 112. At the end of start-up, Izener2 stops flowing.

During the start-up period, a node voltage at the cathode of diode 132 may swing to a very large value. The high voltage swing may be limited if the zener diode 116 is placed in series with diode 132. In an embodiment, a maximum swing of the cathode node of diode 132 may be limited by adding another zener diode 142 in parallel with bootstrap capacitor 134. In such an embodiment, the maximum voltage at the cathode node may be further limited to approximately the sum of the zener diode clamp voltages of zener diodes 142 and 116 and the forward voltage of diode 112 above the voltage of the reference node of the high side driver.

Figure 4B:
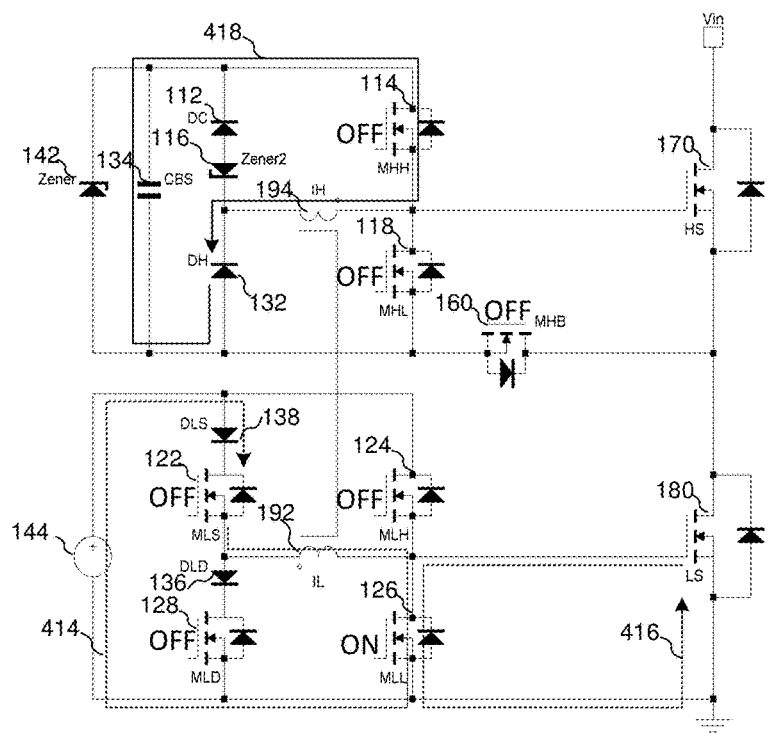
Figure 5A:
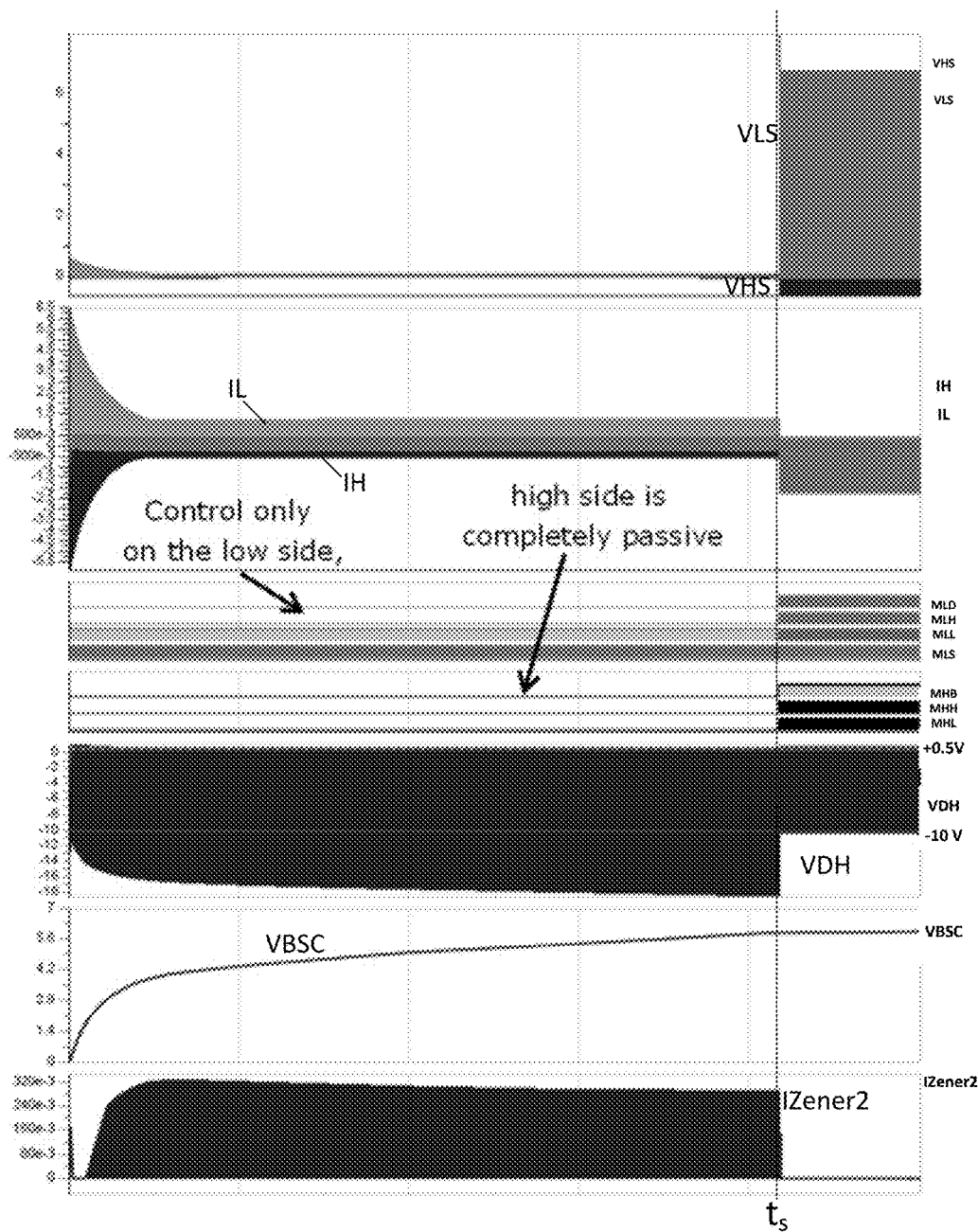
FIGS. 5a-5c illustrate waveform diagrams that correspond with the embodiment start-up method of FIGS. 4a-4f.
Figure 5B:
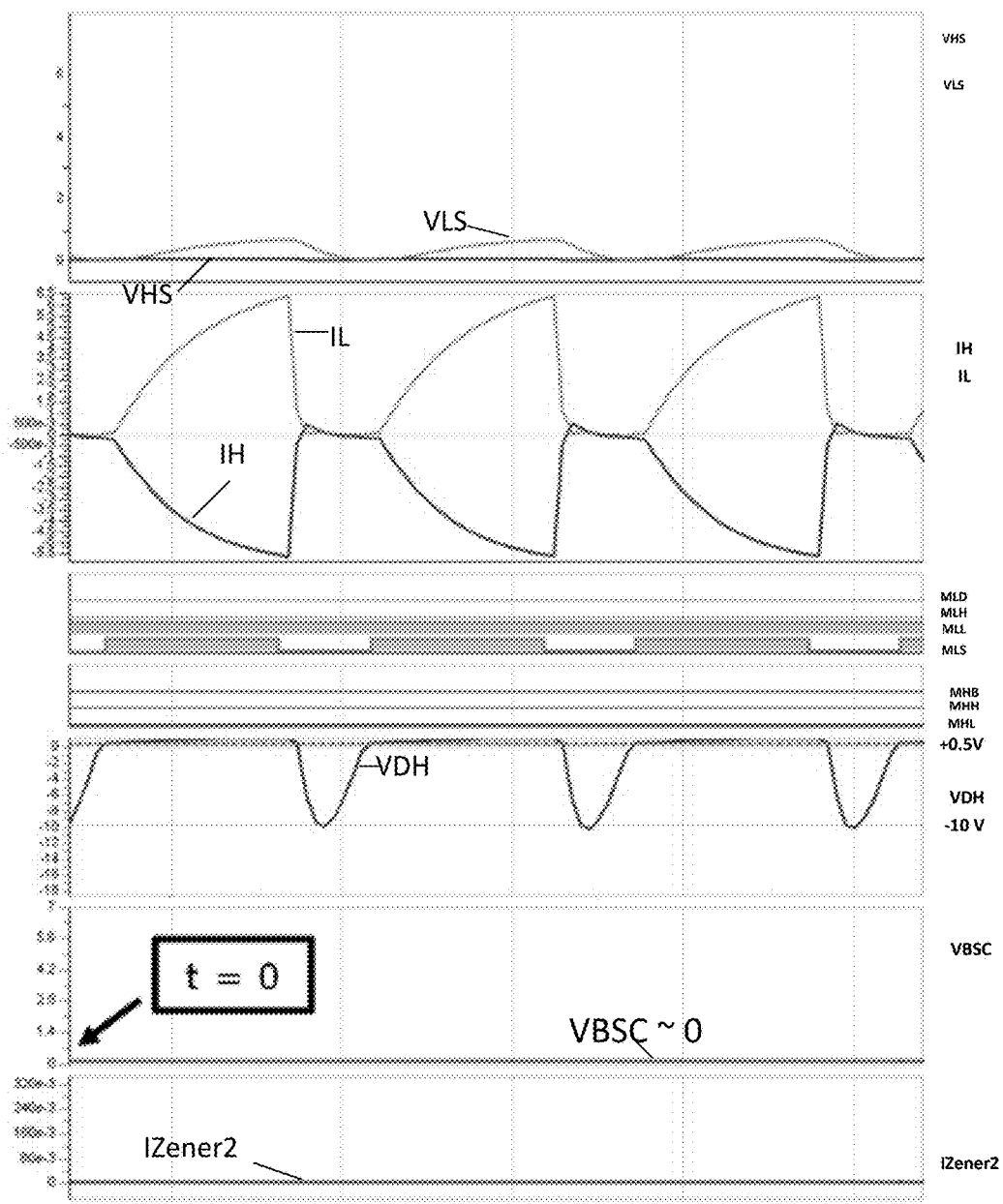
Figure 5C:
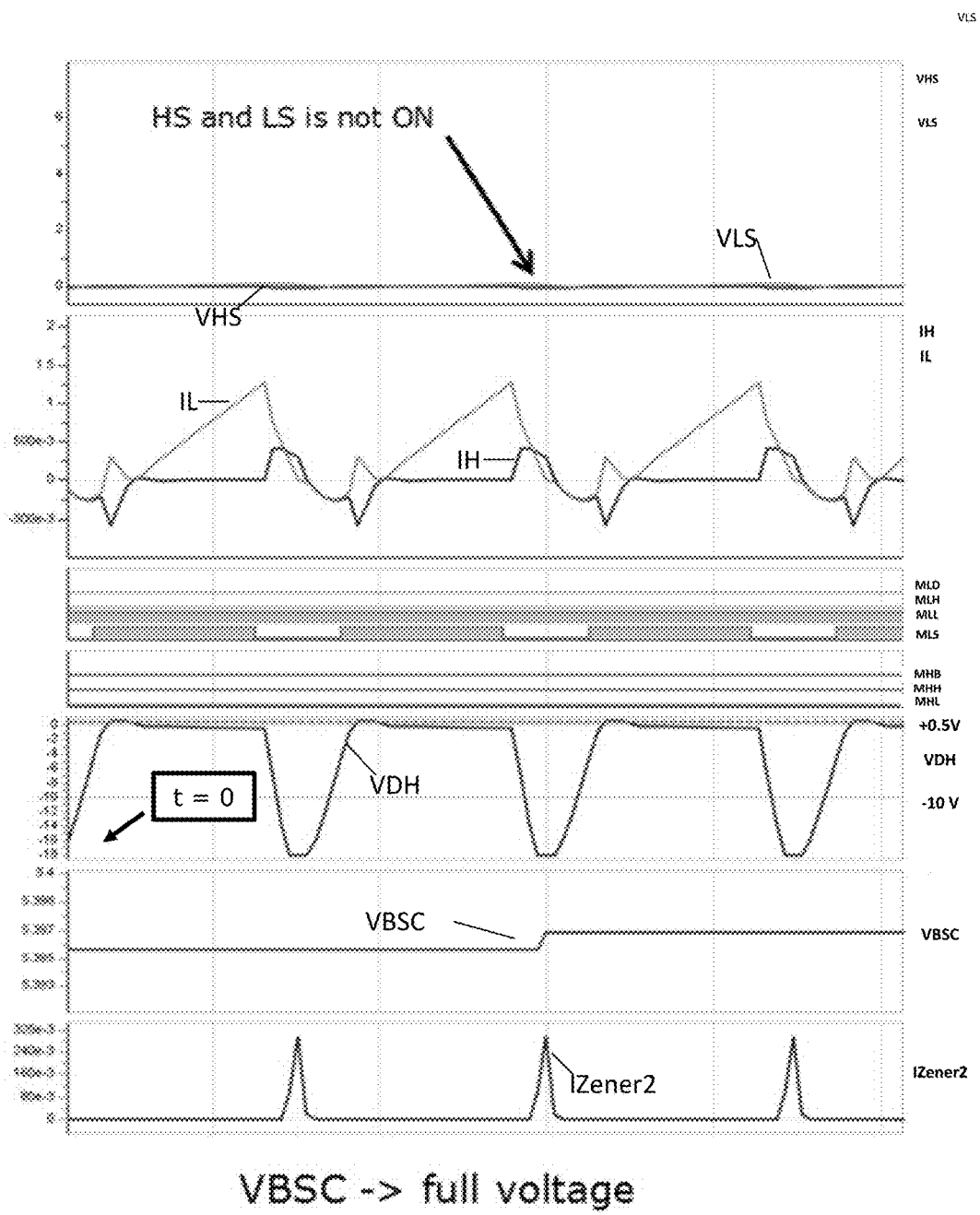

FIG. 4b shows current flow through high and low side inductors when switch 122 is turned off and the bootstrap capacitor voltage is very close zero volts. During this time switch 126 remains on. Charge that may build up at the gate node of the low side switching device 180 is discharged via current loop 416 Another current loop 414 is formed that is responsible to decrease the current in the inductor via switch 126. As shown in FIG. 5b, a current Izener2 flowing through zener diode 116 remains zero as internal node of high side gate driver does swing high enough to clamp zener diode 116. The reverse bias voltage of diode 132 or voltage VDH reaches a value of −10V. The current IH through high side inductor is used to charge bootstrap capacitor 134.

Figure 4C:
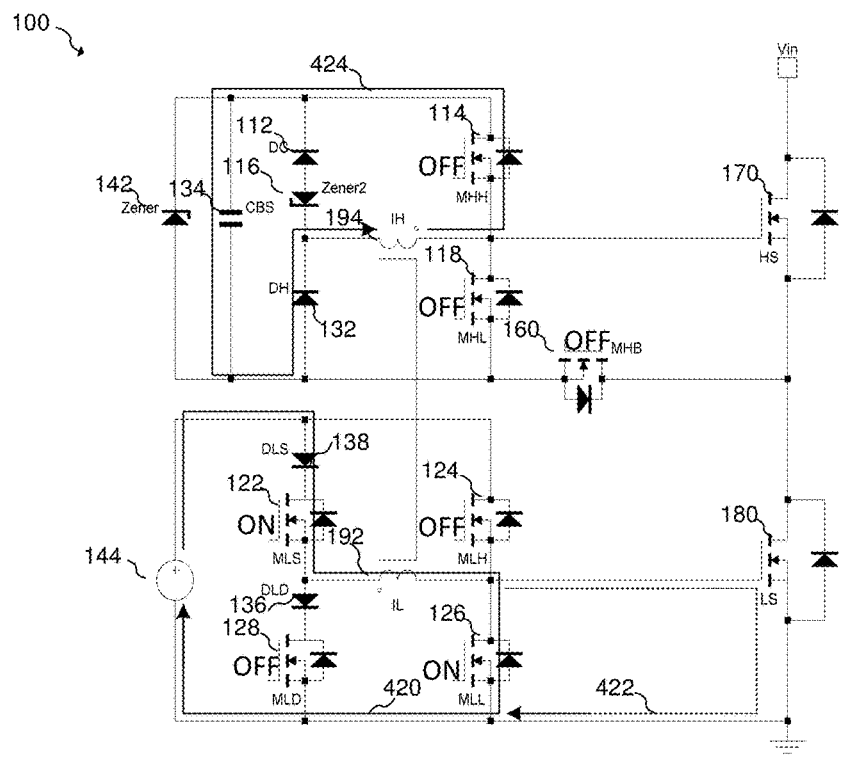

FIGS. 4c-4f illustrate the start-up sequence when the voltage across bootstrap capacitor is greater than or equal to a target voltage. The current loops described in FIG. 4c are similar to those described in FIG. 4a. However, the power transfer to the high side driver via magnetically coupled high side inductor changes due to the voltage build up at the bootstrap capacitor. The energy transfer between the low side inductor to high side inductor operates as a combination of forward converter and fly back converter.

Figure 4D:
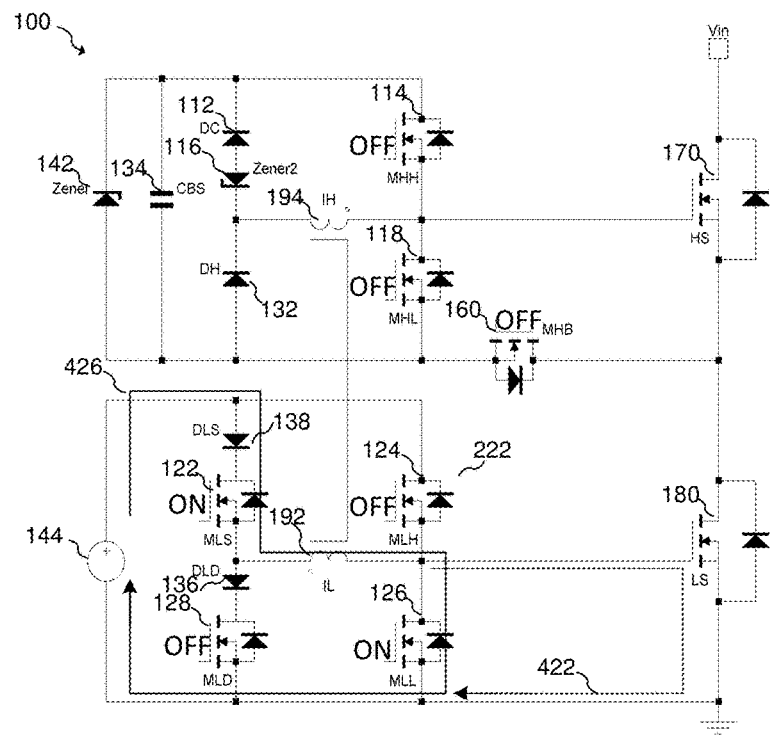

As shown in FIG. 4c, the current loop 420 is the energizing current in the low side inductor and current loop 424 represents the energy being transferred to the high side inductor in a forward resonant manner. The current loop 424 finds a path through the body diode of switch 114 to store energy to the bootstrap capacitor. However, when the voltage across the inductor falls below a voltage that is a sum of the forward voltages of diode 132 and body diode of 114 and a voltage opposite the voltage across the bootstrap capacitor 134, the current flow stops as the body diode of switch 114 is no longer forward biased. The energy is no longer transferred to the high side inductor; rather it is stored in the low side inductor. This is shown in FIG. 4d, where no current loop is present in the high side inductor as the voltage across the high side inductor 194 falls below a level that is equal to the sum of opposite voltage across the bootstrap capacitor 134 and sum of two forward bias diode voltages.

Figure 4E:
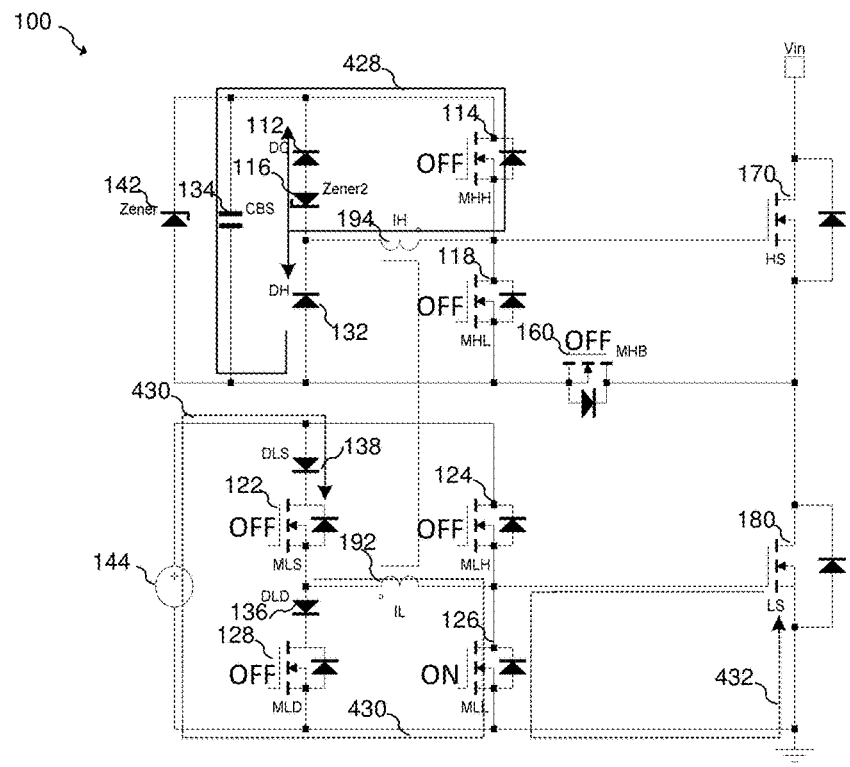

FIG. 4e illustrates current loop 428 when switch 122 is turned off as a part of start-up sequence. The voltage VDH across the diode 132 rises sharply as a negative voltage as shown in the waveform diagram of FIG. 5c. The voltage at the cathode keeps on rising until it reaches a value that is about equal to a sum of two zener diodes. The zener diode 116 carries a current Izener2 during clamping of the internal node of the high side gate driver and prevents any increase of voltage VDH beyond the clamp voltage of −18 V shown in waveform diagram of FIG. 5c. Currents IH decays to zero because of Izener2. The currents decay to zero value and further crosses zero to reverses direction due to resonance and in the process charges bootstrap capacitor 134.

Figure 4F:
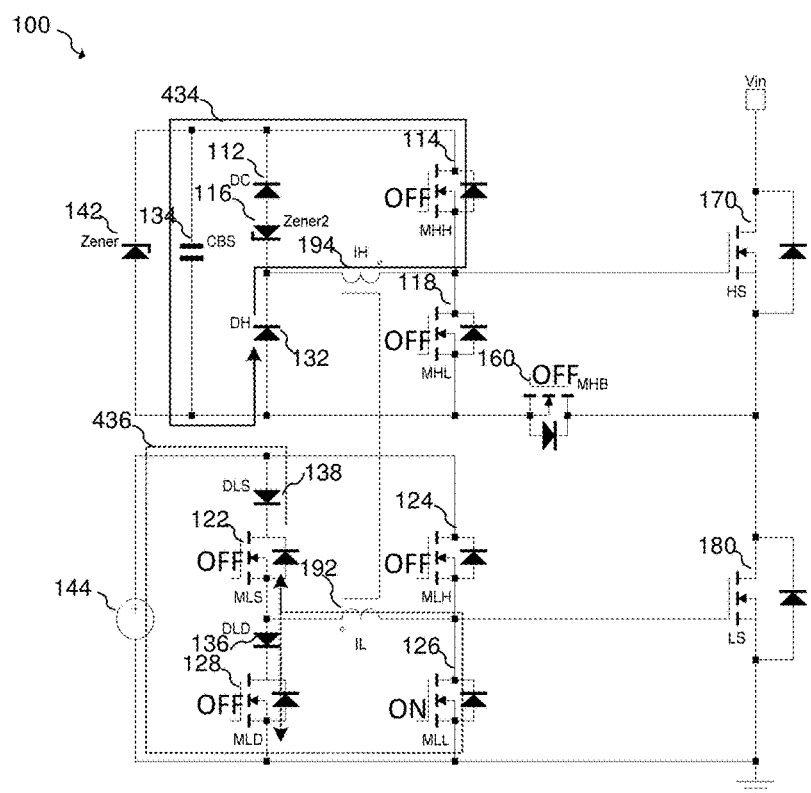

FIG. 4f illustrates the current loop 434 when voltage at the cathode node goes high and current through the zener decays to zero. At this time the bootstrap capacitor 134 is again charged via current loop 434. Ash shown in waveform diagram 5c, the voltage VBSC.

In another embodiment of the present disclosure, energy transferred to a high side inductor from a low side inductor may be used directly to turn on a high side switching device without using a bootstrap capacitor. In an embodiment, a bootstrap capacitor is not used from the high side inductor.

Figure 6A:
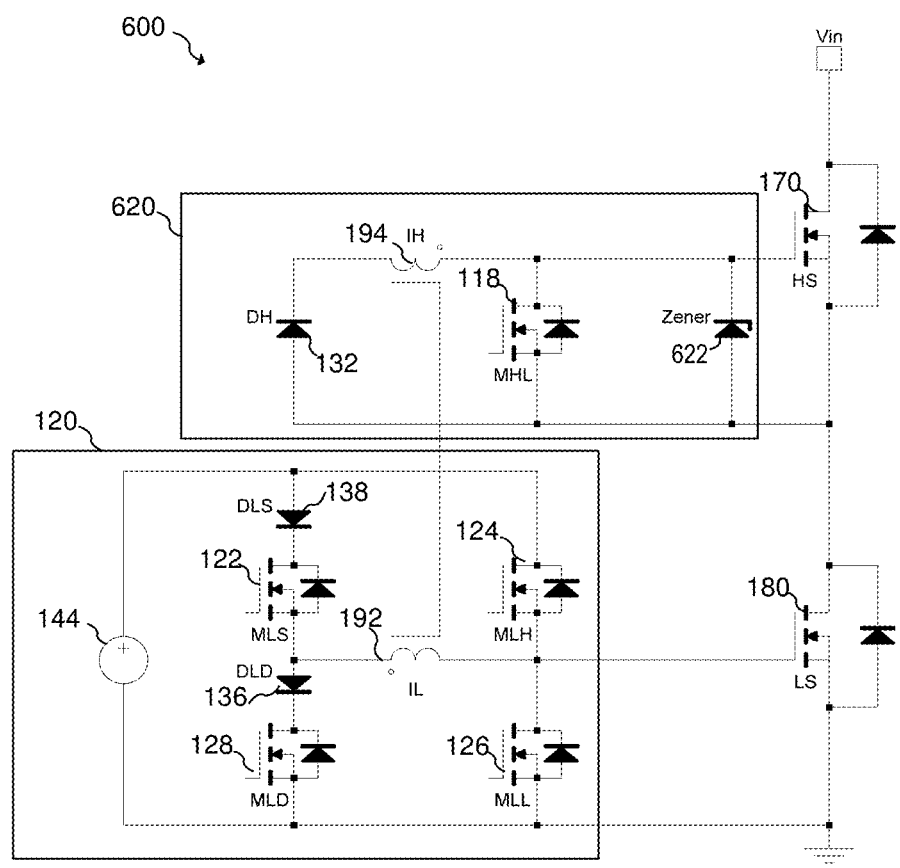
FIG. 6a illustrates a first alternative embodiment resonant gate driver system.

FIG. 6a illustrates an embodiment resonant gate driver 600 that includes a high side gate driver 620. The high side gate driver 620 includes a pull down switch 118 and a sensing diode 132 and the high side inductor coupled between the diode and the pull down switch 118. The switch 118 is also coupled to the gate control node of the high side switching device 170. A zener 622 is clamped across the gate and the source of the high side switch to clamp the gate control node voltage during turning on via high side inductor. The low side gate driver is similar to that described in the previous embodiment.

Figure 6B:
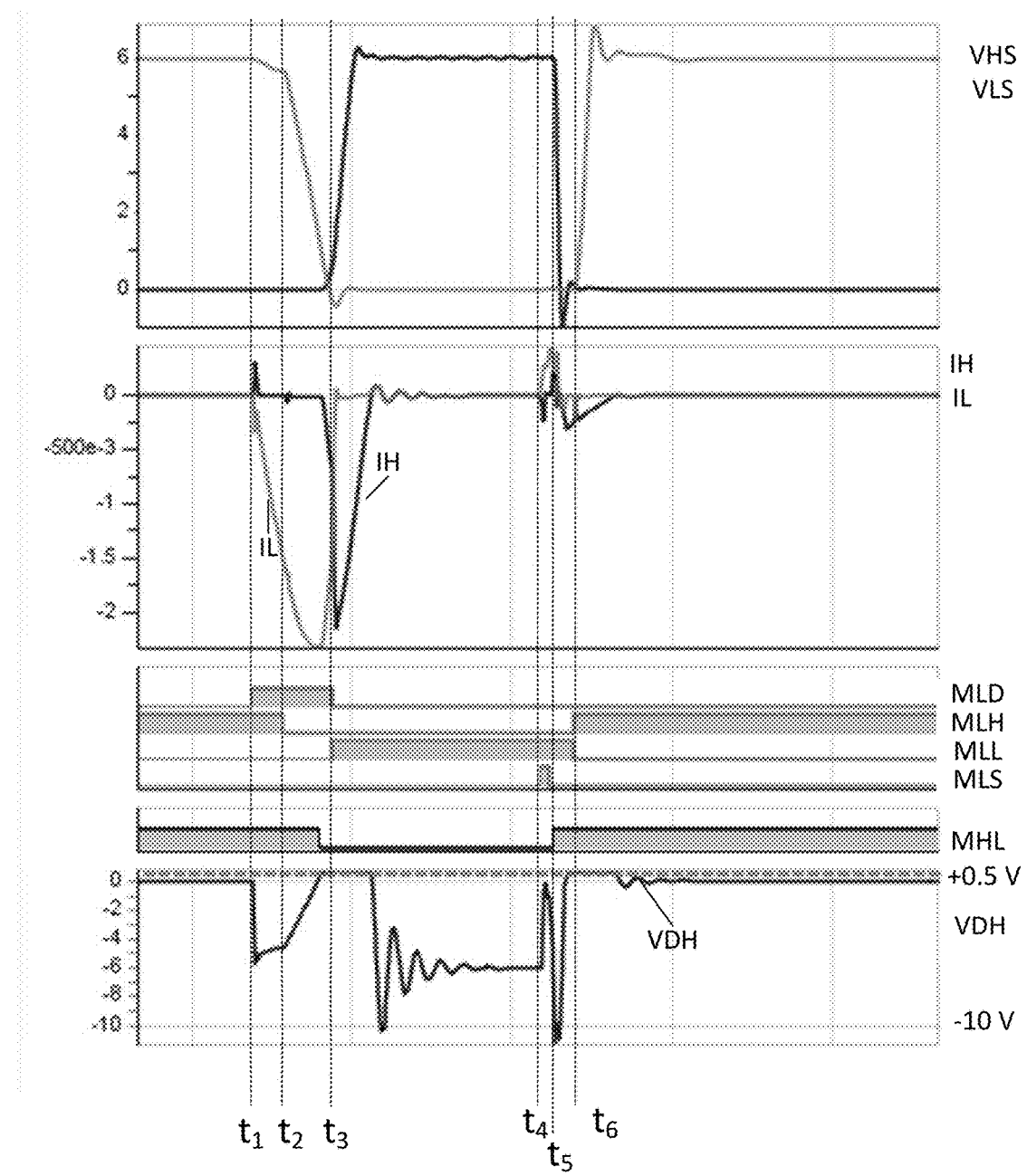

FIG. 6b illustrates the various waveforms for a full cycle of charging a high side switching device and a low side switching device. The sequence begins with low side switching device turned on and the high side switching device turned off. At time $t_1$, switch signal MLD is set high that turns on switch 128 to energize the low side inductor 192. Low side inductor 192 is energized until time $t_2$ when switch signal MLH is set low to turn off switch 124 and the gate of the low side switching device 180 is discharged. The node voltage at the cathode of diode 132 rises in the negative direction as shown by waveform VDH. The energy is stored in the inductor when current IL flows through the low side inductor 192. After time $t_2$, the gate node of low side switching device is discharged. The voltage VDH at the cathode node of diode 132 starts decaying when switch signal MLH goes low, which causes switch 124 to turn off. When voltage VDH crosses a threshold of 0.5 V at time $t_3$, switch signal MHL is set low and switch 118 is turned off. A gate node of the high side switching device 170 that was held to a source node is allowed to be charged and high side switching device 170 is turned on after time $t_3$. The high side gate node is clamped to a zener clamp voltage. At time $t_4$, the low side inductor 192 is charged in an opposite direction to the first direction, and this causes the diode 132 to get forward biased and voltage VDH goes positive. When the charging of the low side inductor 192 occurs the current is reflected at the high side inductor 194 and causes the voltage VDH to decrease and go negative. When switch signal MLS goes low, the switch 122 is turned off and the voltage VDH across the diode 132 decreases more negative. When the voltage VDH crosses a threshold, for example, of −10 V, switch signal MHL is set high at time $t_5$ and switch 118 is activated. This may be done by using a comparator as described earlier. Switch 118 turns off the high side switching device 170 and when switch signal switch signal MLH goes high at time $t_6$, the switch 124 is turned on to pull low side switching device 180 on.

In another embodiment of the present disclosure, in a high efficiency resonant gate driver, energy is recycled between the high side inductor and a low side inductor. In an embodiment, low side gate driver uses a bootstrap diode to charge the bootstrap capacitor from an input supply of the low side gate driver. The low side inductor is charged in a first direction with the charge stored at the node of the low side switching device. The gate charge energy is stored across the low side inductor. Once the low side is turned off by transferring the gate charge to the low side inductor, the energy is then transferred to the high side inductor and used to turn on the high side switching device.

A gate charge of the high side switch is transferred to the high side inductor before turning on the low side. Once the high side switching device is turned off, the energy stored in the high side inductor is transferred to the low side inductor. The transferred energy is reused to turn on the low side gate of the low side switching device.

Figure 7A:
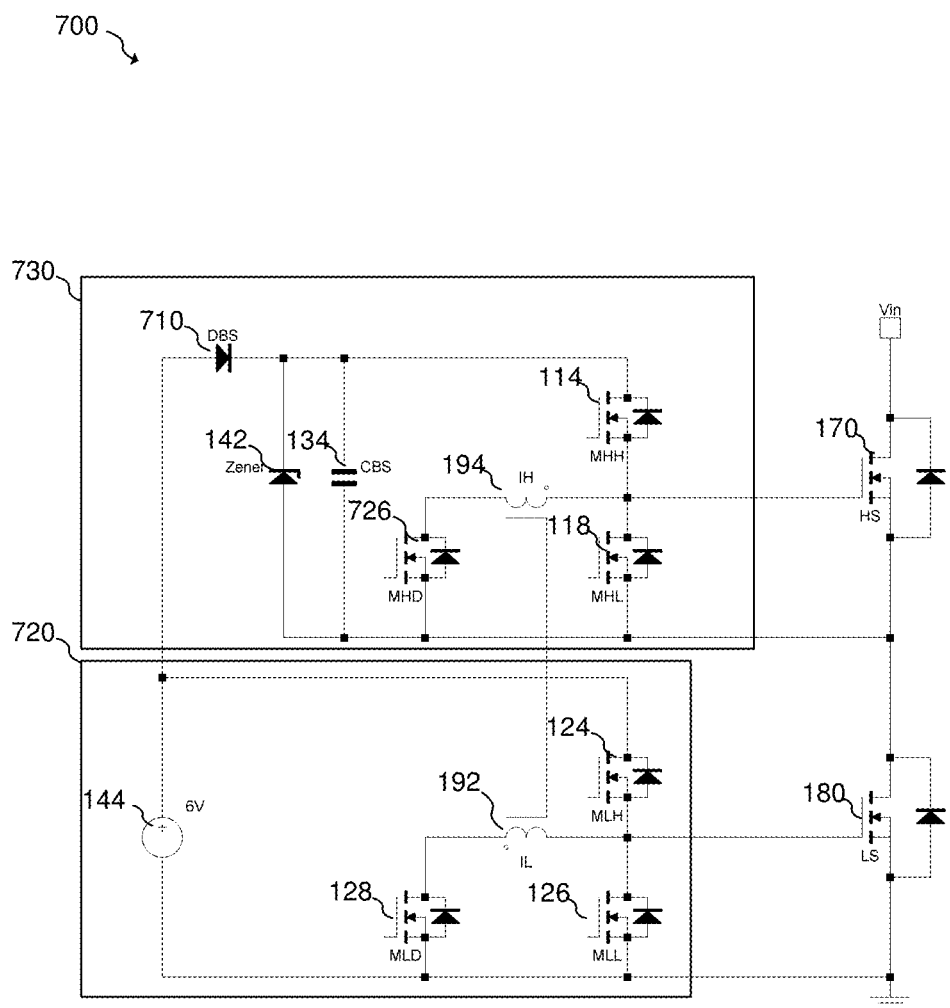
FIG. 7a illustrates a second alternative embodiment resonant gate driver system.

FIG. 7a illustrates a resonant gate driver 700 that includes a bootstrap diode 710 between low side power supply 144 and bootstrap capacitor 134. A low side driver 720 uses switches 124 and 128 to energize low side inductor in a first direction. Switch 126 is controlled to keep the gate node of the low side switching device to a reference voltage. As described previously, the low side inductor is coupled between a common node of switch 124 and switch 126 and the switch 128. The low side switching device is turned off by transferring gate charge to the low side inductor and when the transfer is complete, switch 126 is turned on to keep low side switching device turned off.

High side gate driver includes switch 114 and a pull down switch 726 to transfer gate charge of high side switching device during turn off. The turn on of the high side switching device is performed by transferring the energy of the low side gate charge to high side inductor and causing a current flow through the body diodes of switch 726. In an embodiment of the present disclosure, the gate controls for switches 726, 114 and 118 are level shifted using level shift circuits to match appropriate voltage levels.

Figure 7B:
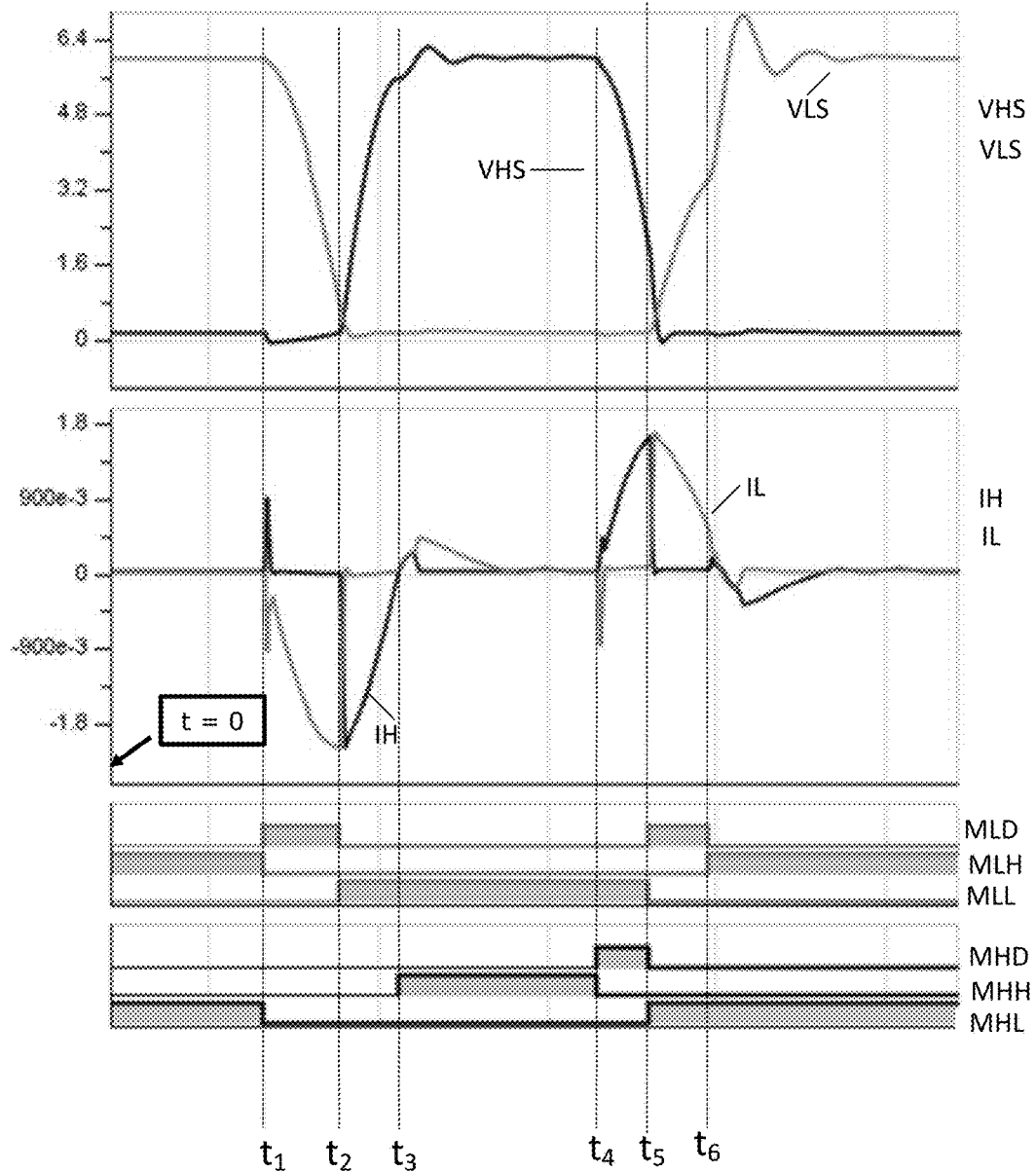

FIG. 7b illustrates a waveform diagram showing various signals within embodiment resonant gate driver 700. As shown, the time information is depicted in horizontal axis and voltage and current information is depicted in vertical axis. The current IL flowing through the low side inductor increases at time t1 due to transfer of gate charge of low side to the low side inductor. IL follows a resonant waveform and peaks at time $t_2$ when low side gate voltage VLS falls below a threshold voltage of the low side switching device. The energy from the low side inductor is transferred to high side inductor and current IH through high side inductor increases from a zero value and starts flowing through the body diode of switch 726. The high side gate voltage VHS starts increasing. At time $t_3$, switch 114 is turned on by activating switch signal MHH to bring voltage VHS to the same voltage level as the boot strap capacitor 134.

The high side switching device is turned off at time $t_4$ when switch MHH is deactivated and switch MHD is turned on to transfer high side gate charge to the high side inductor. Once the charge transfer is complete, the high side switching device is turned off as VHS drops during time $t_4$ to $t_5$. At time $t_5$, the energy at the high side inductor is transferred to low side inductor and energy is then transferred to low side gate to turn on low side switching device. Once the current through low side inductor reaches zero, the switch signal MLH is set high at time $t_6$ on to keep the low side device on until next cycle when low side needs to be turned off.

In another embodiment, the switches in a half-bridge are turned off by having a gate control node voltage go below a reference or a source voltage of the switches. The negative excursion of the gate control voltage is achieved by adjusting the time when a gate charge is transferred from the switching device to the inductor and vice-versa. In another embodiment, the sensing diode 132 is replaced by a switch and a body diode of the switch performs the function of diode 132. The switch can be turned at an appropriate time and allow the current flow through the switch and not the body diode. The power dissipation across the switch is less than power dissipation across the body diode. Thus, an efficiency of the switched-mode power supply can be increased by having the current to flow through the switch instead of the body diode when high side switching device is turned off and low side switching device is turned on.

Figure 8A:
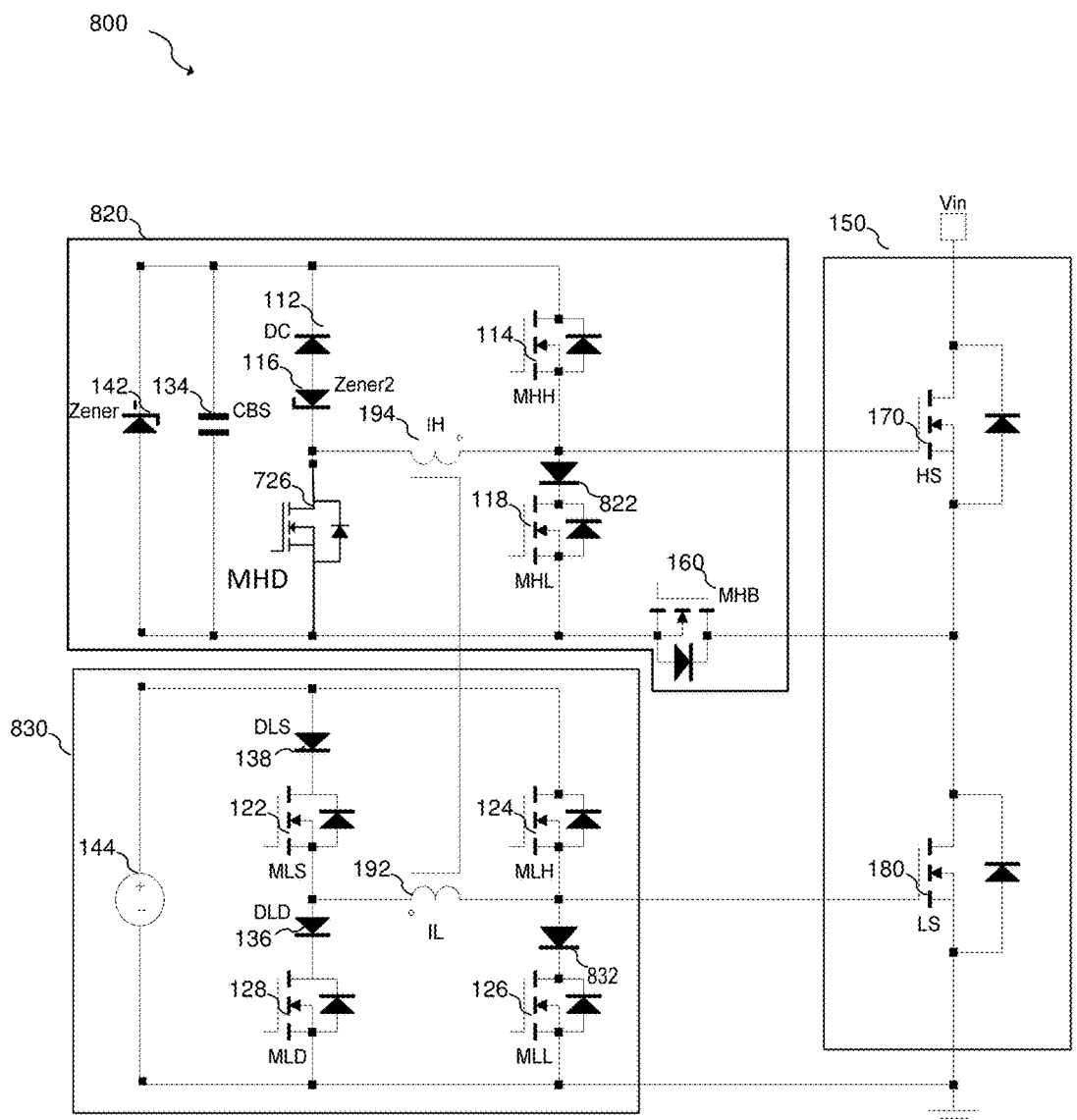
FIG. 8a illustrates a third alternative embodiment resonant gate driver system.

FIG. 8a shows an embodiment resonant gate driver 800 that includes a high side gate driver 820. The high side gate driver 820 uses a switch 726 instead of diode 132 described in the high side driver 110. The body diode of switch 726 performs the function of diode 132 and switch is turned on when the voltage at the internal node (which is the node where a drain of the switch 726 is connected) crosses a threshold voltage. In addition, diode 822 is coupled in series with switch 118 and blocking diode 112 and zener diode 116 are coupled to the inductor terminal and the top plate of the bootstrap capacitor. Low side driver 830 is similar to low side driver 120 with the addition of diode 832 coupled in series with switch 126.

Figure 8B:
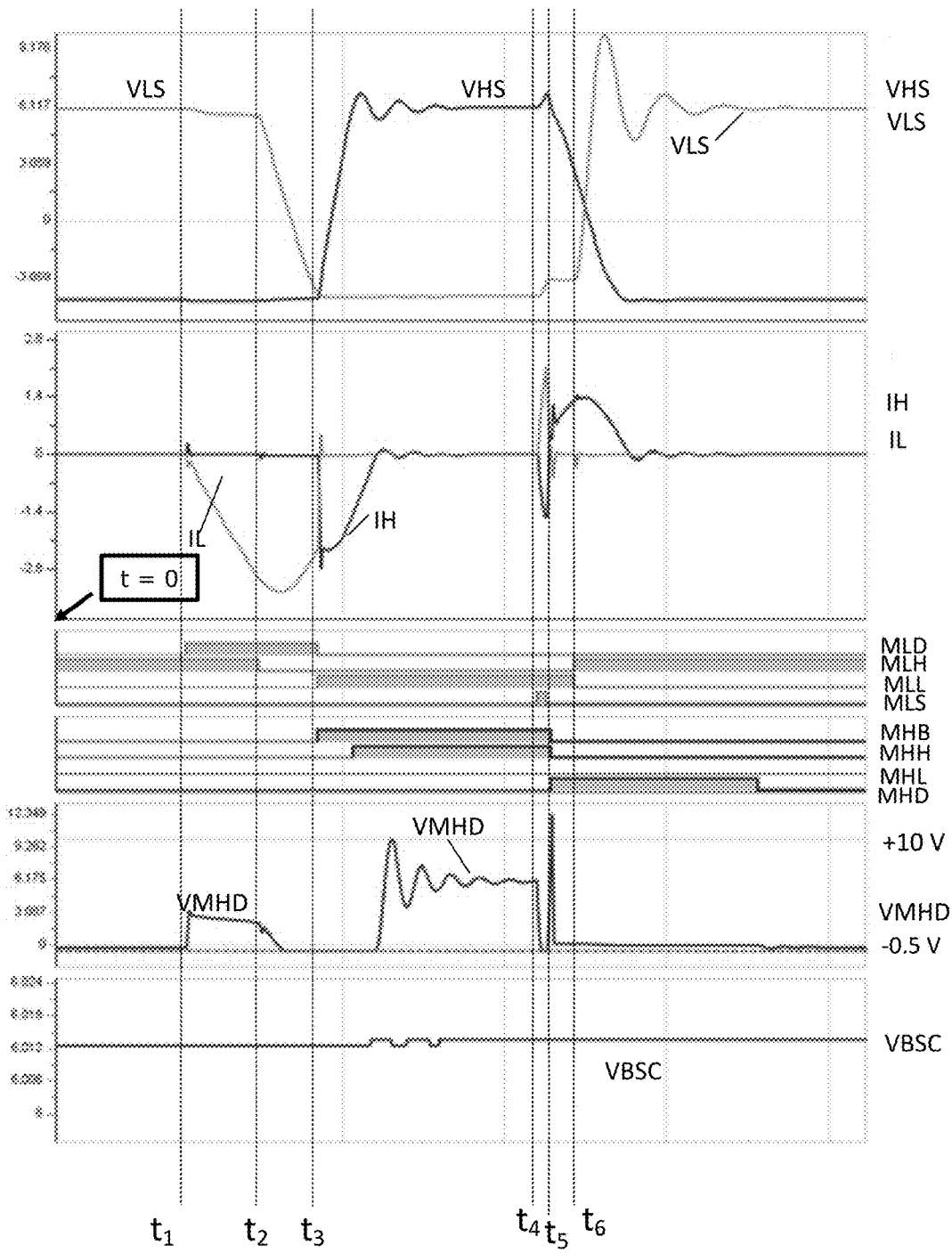

The waveform diagram shown in FIG. 8b describes various signals within embodiment resonant gate driver system 800. The waveform begins with low side switching device turned on and high side switching device turned off. At time $t_1$, the low side inductor is energized from the input power supply 144 when switch signal MLD goes high and until switch signal MLH goes low causing switch 124 to turn off at time $t_2$. During this time, the gate charge at low side switching device is transferred to inductor. The current IL in the low side inductor forms a resonant current and a period of time for switch signal MLD is adjusted to allow low side gate-source voltage VLS to change polarity. Once the low side switching device is turned off at time $t_3$, energy is then transferred to high side inductor and current IH starts increasing and pulling high side gate to the voltage of bootstrap capacitor.

Switch signal MHB remains low until time $t_3$, when it is time to turn on the high side switching device and then switch signal MHB goes high and switch 160 connects the reference node of high side switching device to the reference node of the high side gate driver 820. The switch signal MHB is set high as long as the high side switching device stays on. The switch signal MHB is set low at time $t_5$ and causes high side gate node to go below the source node.

Similarly, the switch signal MHD controlling switch 726 is turned on at time $t_5$. High side inductor transfers more charge from the high side gate based on a longer time period of MLD and turning off of switch signal MHB. It allows high side gate node to go negative as shown after time $t_5$.

Figure 9A:
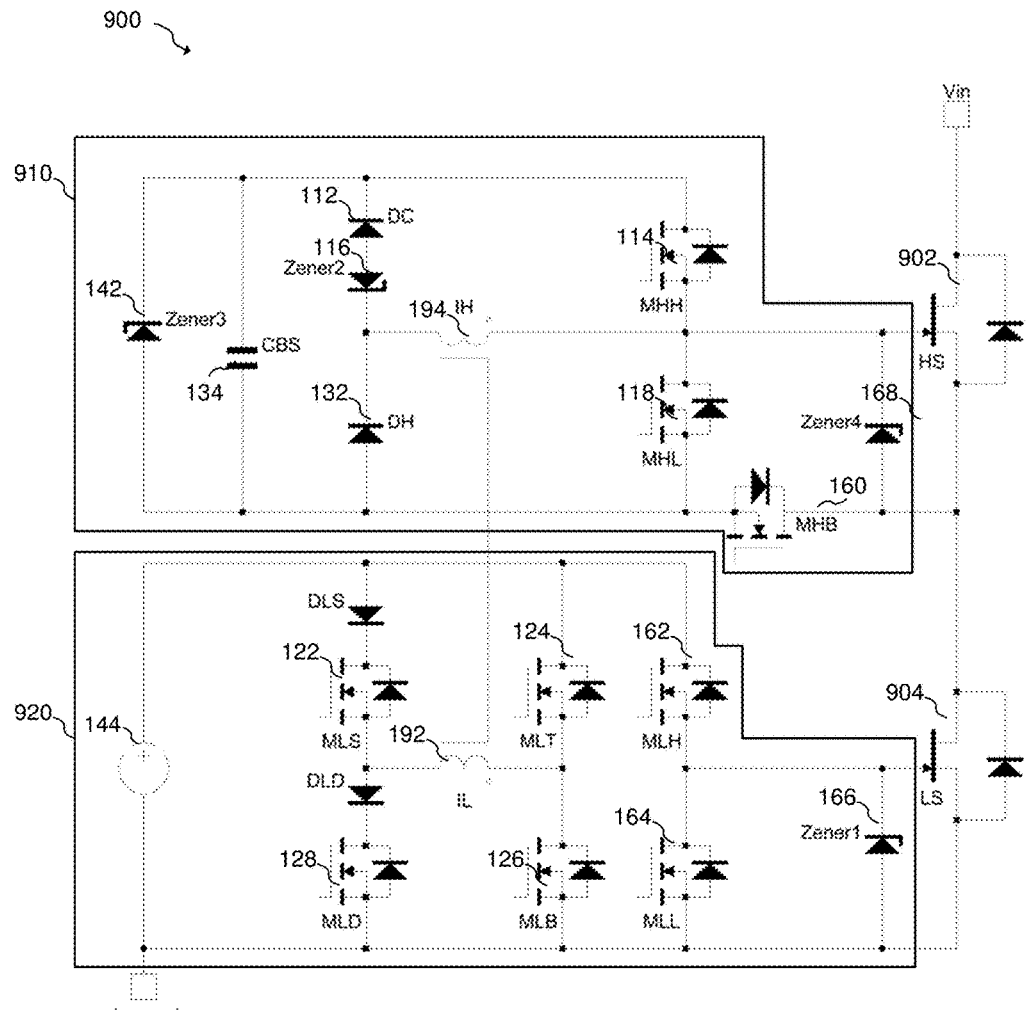
FIG. 9a illustrates a fourth alternative embodiment resonant gate driver system.

In another embodiment of the present disclosure, a resonant gate driver 100 is designed to drive a half bridge gallium nitride (GaN) switch as shown in FIG. 9a. The embodiment resonant gate driver 900 is used to drive a half-bridge that includes a low side GaN switch 904 and high side GaN switch 902. A low side resonant gate driver 920 uses two half H-bridges to charge a low side inductor in two different directions that are opposite to each other. A third half H-bridge configuration using two devices are used to control a gate node of the low side GaN switch 904. The low side inductor 192 is connected between the outputs of two half H-bridges and it is similar to that described in low side gate driver 120; however; the low side inductor is not connected to the gate control node of the low side switching device. The high side inductor is magnetically coupled to the low side inductor and energy transfer is performed in a similar method described in embodiment 100.

The high side GaN switching device 902 is turned on by using energy transferred to the high side inductor 194 from the low side inductor 192. Once the high side GaN switching device 902 is turned on, the low side inductor 192 is charged periodically to transfer more energy to the high side inductor. This transferred energy is used to recharge a bootstrap capacitor 134 during the time when high side GaN switching device 902 is kept on. Gate control node of a GaN device may consume a constant current even after the gate control node is pulled to a required power supply. In such case, bootstrap capacitor may 134 be depleted and high side GaN device 902 may not stay on for longer period of time. In an embodiment, the high side inductor 194 charges the bootstrap capacitor 134 using the transferred energy from the low side inductor 192.

FIG. 9a illustrates an embodiment resonant gate driver 900 that includes a half-bridge implemented by a high side GaN switch 902 and a low side GaN switch 904. The embodiment gate driver 900 includes a high side gate driver 910 and a low side gate driver 920 that are coupled magnetically by low side inductor 192 and high side inductor 194. Switches 162 and 164 are connected in half H-bridge configuration to drive the gate control node of low side GaN switch 904. Switch 162 pulls up gate control node of low side switch 904 to an input supply 144 to turn it on and switch 164 is used to pull down gate control node of switch 904 to a reference node to turn it off. A zener diode 166 is coupled across the gate and reference node of low side GaN switch 904. Switches 122 and 126 are turned on to energize low side inductor 192 in a first direction for a predetermined amount of time. Switch 162 is turned off and switch 164 is turned on to turn off low side GaN switch 904. A diode voltage VDH is monitored with a reference voltage of +0.5 V and when voltage VDH goes above +0.5 V, switch 118 is turned off and energy is transferred to the gate control node of high side GaN switch 902 by turning on switch 114 after a pre-determined time. It should be understood that the reference voltage of +0.5 V is just one example of many possible reference voltages. In alternative embodiments, other reference voltages may be used.

Once the high side GaN switch is turned on and the gate control node is pulled to a voltage equal to bootstrap capacitor 134, low side inductor 192 is again charged in the same direction by turning on switch 122. Energy is transferred between a high side inductor 194 and a low side inductor 192 by turning off switch 122 after a predetermined time. This time, transferred energy is used to charge the bootstrap capacitor via switch 114. The charging of bootstrap capacitor may be performed at predetermined frequency during the period when high side GaN remains turned on. In another embodiment, the transfer of energy may be performed a fixed number of times based on the time the high side GaN switch is on. When it is time to turn off high side GaN switch 902, the low side inductor is charged in an opposite direction to previous charging direction. Switches 124 and 128 are turned on for a predetermined time to charge the inductor. Switch 114 is turned off when voltage VDH crosses a threshold of −10 V. The transferred energy is then used to turn off the gate control node of high side GaN switch. It should be understood that the threshold −10 V is just one example of many possible threshold voltages. In alternative embodiments, other threshold voltages may be used.

The high side gate driver 910 is similar to high side gate driver no described in the embodiment in FIG. 1 with an additional zener diode 168 connected between a gate and a source node of high side GaN switch 902. Zener diode may be used to clamp a gate-source voltage to a zener clamp voltage.

Figure 9B:
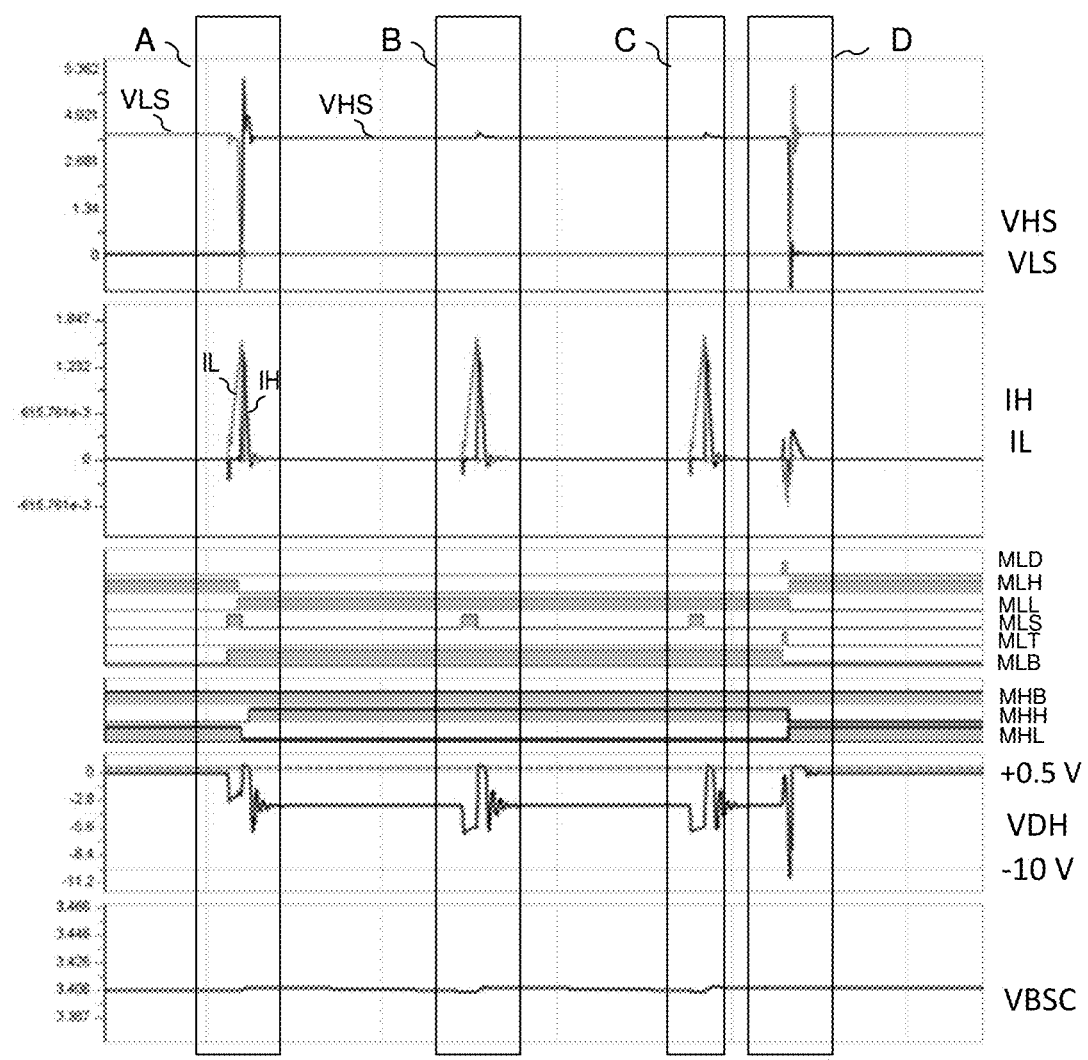

FIG. 9b illustrates a waveform diagram of various node voltages and currents corresponding to resonant gate driver in FIG. 9a. For simplicity in description, the waveform diagram is labelled in three key regions denoted as: region A, region B, region C and region D. Region A is the time period where low side GaN switch is turned off and high side GaN switch is turned on. Region D is the time period where high side GaN switch is turned off and low side GaN switch is turned on. Regions B and C are time periods in which bootstrap capacitor charge is replenished by transferring energy from low side inductor to high side inductor.

In region A, the waveform diagram begins with low side gate-source voltage VLS at a turn-on voltage, for example at around 3.5 V, indicating a turned on low side GaN switch 904. In alternative embodiments, other turn-on voltages besides 3.5 V may be used. Voltage VHS denotes a gate-source voltage of high side GaN switch 902 that is at zero voltage in the beginning of region A. The turning off of low side GaN switch 904 is initiated inside region A by setting switch signal MLS and MLB high. Switch 122 and 126 are turned on for a predetermined time by setting switch signals MLS and MLB high respectively. During this time, low side inductor 192 is magnetizes and current IL starts increasing until the charging is ended by switch signal MLS going low. Before the magnetization of low side inductor is complete, low side GaN switch 904 is turned off by setting switch signal MLH low and setting switch signal MLL high. A shoot-through between high side GaN switch 902 and low GaN switch 904 is avoided by turning off low side GaN switch 904 before turning on high side GaN switch. Voltage VLS starts ramping down quickly to indicate a turn off of low side GaN switch 904. Once low side GaN switch 904 is turned off, the energy in the low side inductor 192 is transferred to the high side inductor 194 and current IH starts ramping up quickly. The current IH is used to charge a gate control node of high side GaN switch 902 once switch signal MHL goes low. Voltage VHS across the gate-source node of high side GaN switch 902 goes high and reaches 3.5 V. Switch signal MHL goes low when voltage VDH crosses a threshold of +0.5 V and allows high side gate to charge. Switch signal MHH turns on after a delay and allows charging of bootstrap capacitor voltage VBSC to increase the same way as described in previous embodiment.

High side switch stays on and in the region B and C where energy is again transferred from low side inductor to high side inductor. In region B and C, current IL reaches a value of, for example, 1.5 A and current IH quickly rises when energy is transferred to high side inductor. Alternatively, other current values besides 1.5 A may be used. Current IH flows via switch 114 to charge bootstrap capacitor 134 and voltage VBSC increases in region B and C.

Region D begins with voltage VHS at around 3.5V and starts ramping down when low side inductor 192 is charged in the opposite direction. Switch signals MLT and MLD go high for a predetermined period to charge the low side inductor 192; Voltage VHS ramps down based on the current in the high side inductor and switch signal MHH goes low and MHL goes high when voltage VDH goes below a negative threshold voltage of −10 V inside region D. The low side GaN switch 904 is turned on when switch signal MLH goes high and voltage VLS ramps to 3.5 V. In other embodiments, the low side GaN switch 904 can remain off even when the high side GaN switch 902 turns off. In other embodiments, the negative threshold voltage and/or bootstrap capacitor voltage VBSC may be chosen different values based on design and application.

Figure 10:
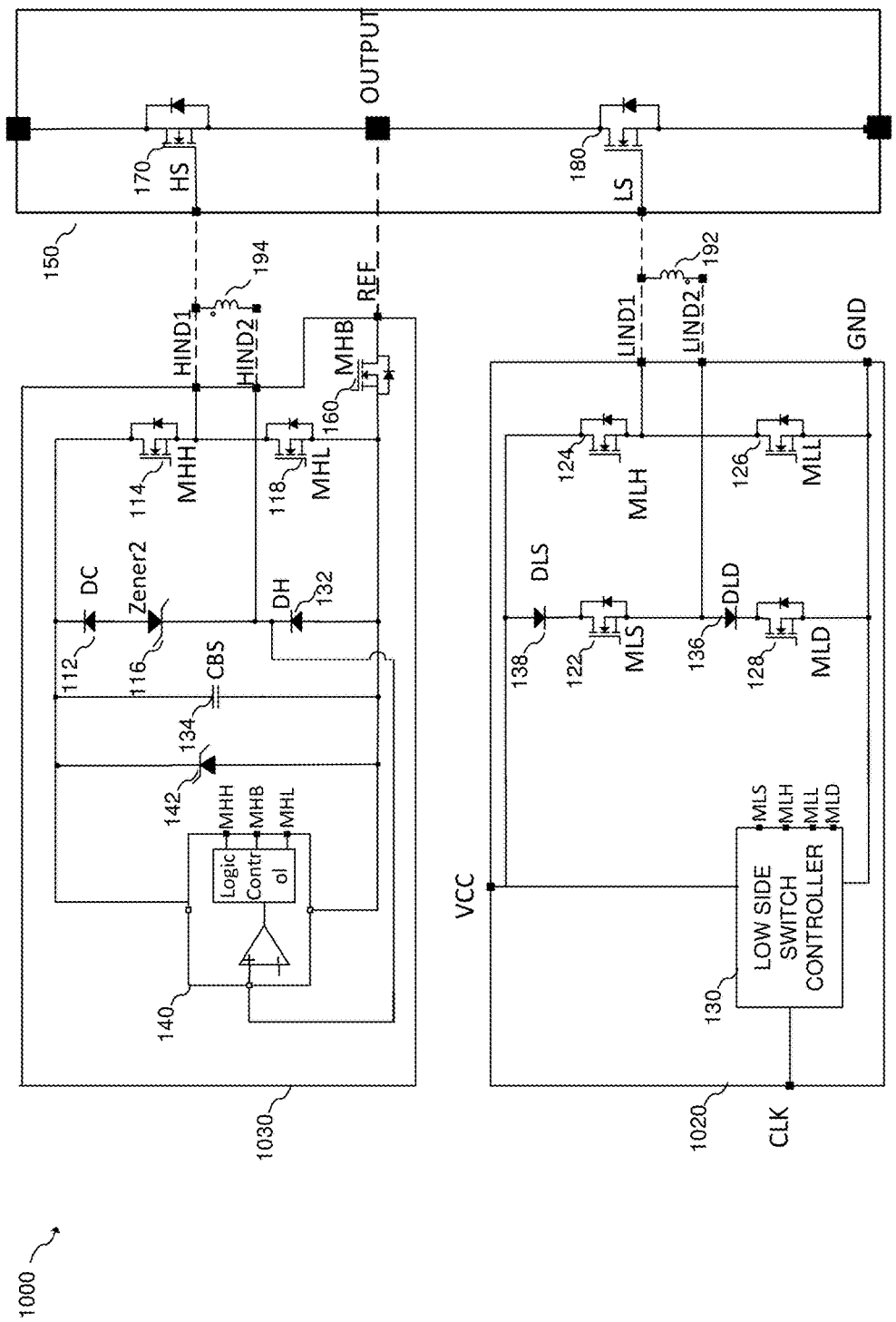
FIG. 10 illustrates an embodiment resonant driver system implemented by two integrated circuits (IC)

FIG. 10 illustrates another embodiment resonant gate driver 1000 where a low side gate driver 1020 is implemented in an integrated circuit (IC) and a high side gate driver 1030 is implemented another IC. Low side IC 1020 is coupled to a gate control node of a low side switching device of half-bridge 150 via a pin LIND1. Low side inductor 192 is connected between pin LIND1 and a pin LIND2. The low side gate driver IC 1020 also includes a switch controller 130 that generates different switch control signals for the switches used in the low side driver. Low side driver IC 1020 includes an input supply pin VCC and a ground reference pin GND and may also include a clock input CLK to control switch controller 130.

High side gate driver IC 1030 includes pin HIND1 that is connected to a gate control node of a high side switching device 170 of half H-bridge 150. A high side inductor 194 is connected between pin HIND1 and another pin HIND2. A reference pin REF is another pin in the high side gate driver IC 1030 that is connected to an output pin of the half H-bridge 150. The output pin is also a common node between the high side switching device and the low side switching device. In an embodiment, low side gate driver IC 1020 and high side gate driver IC 1030 may be packaged together in plastic capsule as a multi-chip module (MCM) IC. In another embodiment, MCM may include the half-bridge 150.

FIGS. 11-17 include a series of flow charts that describe various embodiment methods of operating various embodiment resonant gate driver systems. These flow charts describes states of various switch control signals by their signal names and these signals control various switches in the embodiment low side gate drivers and high side gate drivers. For clarity of explanation, the signal names and its corresponding switch names are described based on embodiment resonant gate driver 100 described in FIG. 1 such that: signal name MLL corresponds to a gate control signal of switch 126; signal name MLH corresponds to a gate control signal of switch 124; signal name MLS corresponds to a gate control signal of switch 122, signal name MLD corresponds to a control signal of switch 128; signal name MHL corresponds to a gate control node of switch 118; signal name MHH corresponds to a control signal of switch 114; signal name MHB corresponds to gate control node of switch 160 and VDH corresponds to a voltage across diode 132.

Figure 11:
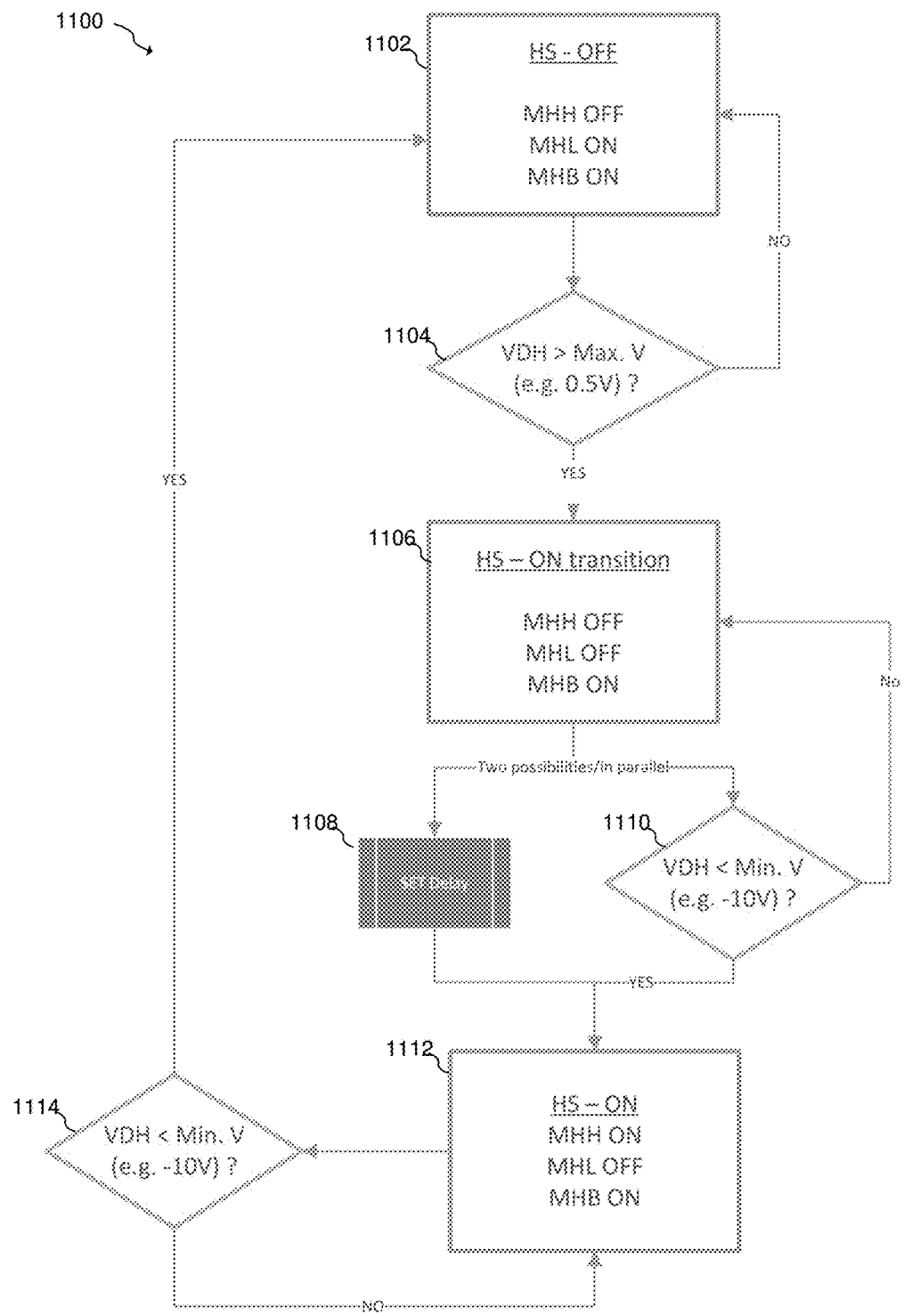
FIG. 11 illustrates a flow chart of an embodiment method of operating a high side resonant gate driver.

FIG. 11 illustrates a flow chart of an embodiment method 1100 that may be applied or used as a basis for controlling or operating a high side gate driver used in an embodiment resonant gate driver system 100. As shown, the operation begins at first step 1102 where high side switching device is turned off and method is preparing to turn on the high side switching device. At step 1102, the switch signal MHH is set low to turn off switch 114 and switch signal MHL is set high to turn on switch 118. A gate control node is held to a source node of the high side switching device by activating switch 118. In addition, switch signal MHB is set high to connect the reference node of high side gate driver no to a source node of the high side switching device 170. The flow chart then moves to step 1104 where diode voltage VDH is compared to a reference of +0.5 V. Switch signal MHL is controlled by an output of the comparison of voltage VDH to the reference of +0.5 V. The flow chart moves to next step 1106 only when voltage VDH crosses the reference of +0.5 V, otherwise it loops between step 1102 and 1104 until VDH reaches the reference +0.5 V. Next in step 1104, the switch signal MHL is turned low and switch 118 is turned off. The gate control node of the high side switch is no longer held to the source node when switch 118 is turned off. The gate control node is charged by the energy transferred to the high side inductor from the low side inductor and high side switching device begins to turn on. Switch signal MHH remains low and switch signal MHB remains high as it was in step 1102.

A transition from step 1106 may have two possibilities. It can be a transition via a predetermined delay step 1108 or it can be a transition via a conditional step 1110. The predetermined delay can be chosen such that high side gate node reaches sufficiently high to turn the high side switching device or to the voltage level of the bootstrap capacitor. However, if step 1110 is chosen, then voltage VDH is further compared to a reference of −10 V, and if VDH reaches a value that is lower than −10 V, flow diagram transitions to step 1112. The flow chart continues to loop between step 1110 and step 1106 until VDH is less than the reference of −10 V.

In step 1112, high side switching device 170 is turned on by setting switch signal MHH high. The switch 114 pulls the gate node of the high side switching device 170 to the bootstrap capacitor voltage and allows recharging of the bootstrap capacitor. The flow chart transitions to another conditional step 1114 and monitors voltage VDH again. If the voltage VDH falls below a threshold of −10 V, the flow chart moves to step 1102, otherwise it keeps going back to step 1112 to monitor voltage VDH again.

Figure 12:
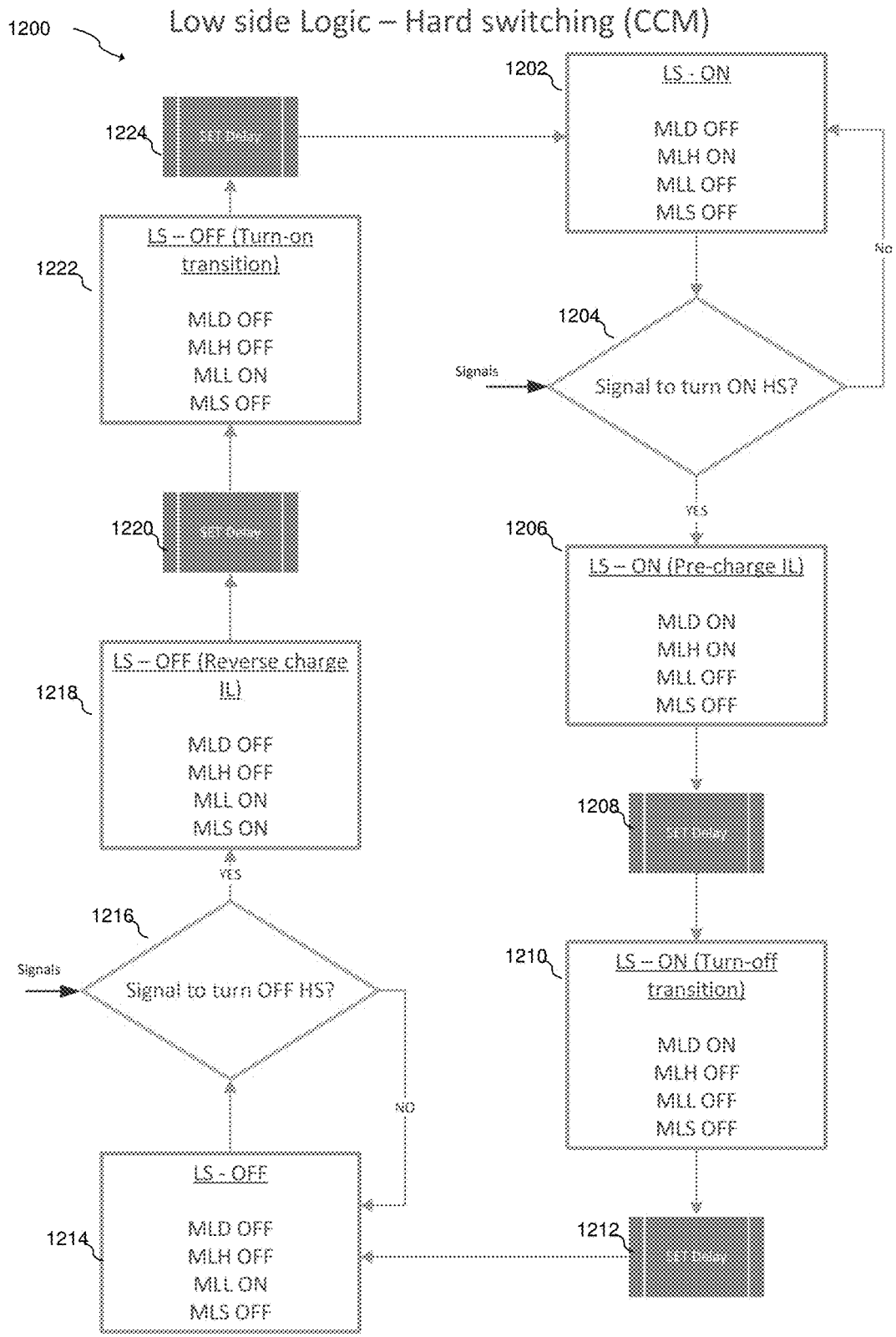
FIG. 12 illustrates a flow chart of an embodiment method of operating a low side resonant gate driver.

FIG. 12 illustrates a flow chart of an embodiment method 1200 that may be applied to a state machine or may be used as the basis for operating a low side gate driver in an embodiment resonant gate driver 100. The flow chart of the embodiment method 1200 describes different steps needed to operate a low side gate driver 120 using a hard switching technique to control half-bridge 150. As shown, the flow chart begins at 1202 where the low side switching device 180 is turned on by having switch signal MLH set high. Switch signals MLL, MLD and MLS remain low and prevents charging of low side inductor 192. Next at step 1204, flow chart waits for a signal to turn on the high side switching device 170. If a signal to turn on the high side switching device 170 is received, the flow chart moves to step 1206, otherwise flow chart goes back to step 1202 until a signal to turn on the high side switching device 170 is received. During step 1206, the low side inductor 192 is pre-charged when switch signal MLD goes high.

At step 1206, switch signals MLL and MLS are set low to allow the pre-charging of the low side inductor in a first direction to store a first energy. Next in step 1208, embodiment method includes a predetermined delay which is the predetermined charging period of the low side inductor 192. Once the predetermined charging period or the delay is complete, the flow chart transitions to step 1210. At step 1210, switch signal MLH is set low to end the energizing of the low side inductor 192 from an input power supply of low side gate driver 120. At step 1210, gate charge of the low side switching device 180 is transferred to the low side inductor 192 and low side switching device 180 turns off once all the charge from the gate is transferred. Next step 1212 includes another predetermined delay to insure the low side driving switch turn off, after which flow chart transitions to step 1214. At step 1214 switch signal MLD is set low and switch signal MLL is set high. Switch 126 pulls the gate node of the low side switching device 180 when switch signal MLL is set high. Low side switching device 180 is kept turned off by switch 126. A transition from step 1214 occurs until a signal to turn off the high side switching device 170 is received at step 1216. Once a high side turn off signal is received, the flow chart transitions to step 1218.

In step 1218, switch signal MLS is set high and the low side inductor 192 is charged in an opposite direction to that in step 1206. The charging of the low side inductor 192 in this state is performed for a predetermined time that is set by delay state 1220. At step 1222, switch signal MLS is set low to transfer energy from low side inductor 192 to the high side inductor 194. This transferred energy is used to signal to the high side to turn off the high side switching device 170. At step 1224, another predetermined delay is allowed until it repeats to the state in 1202.

Figure 13A:
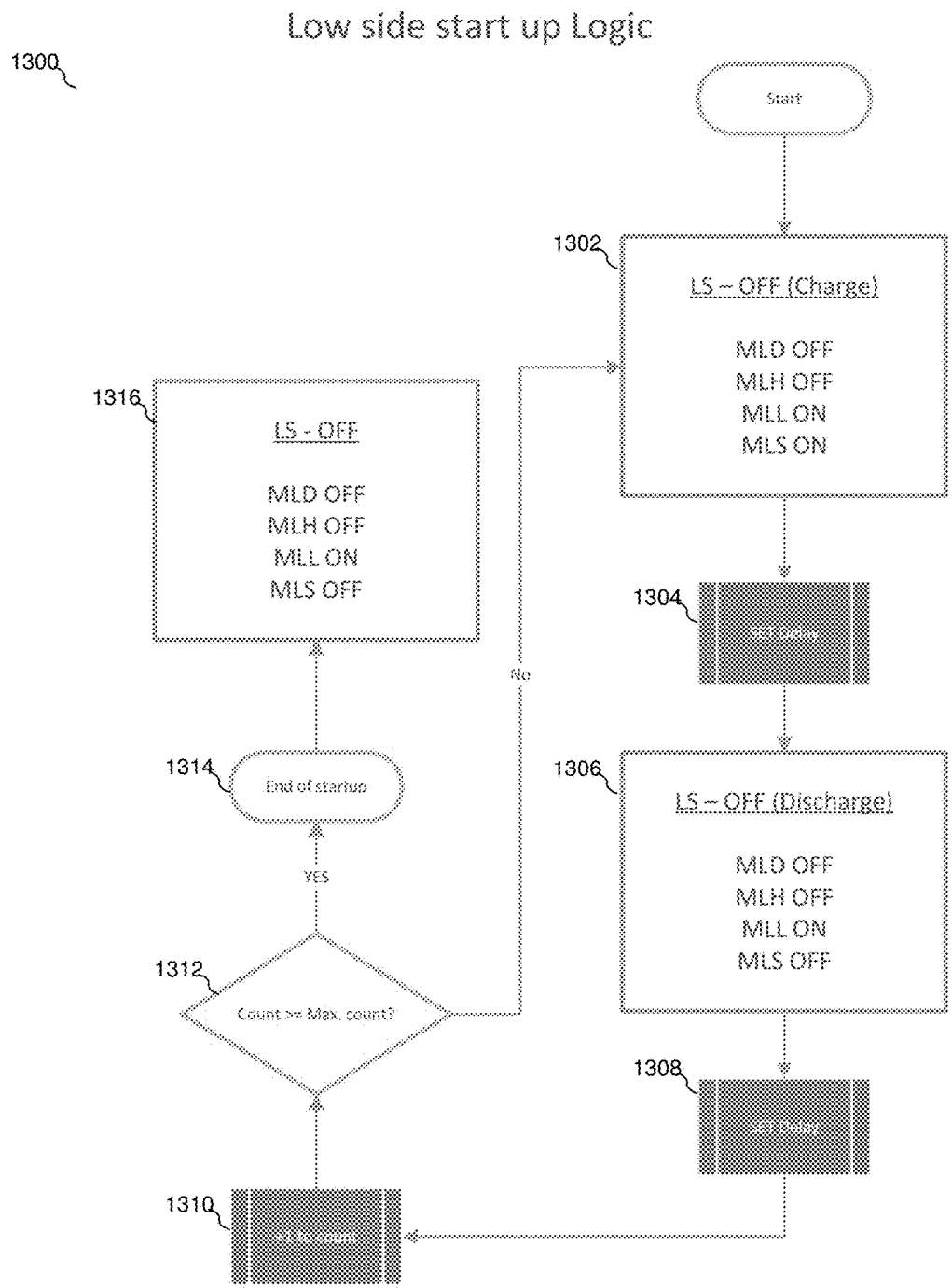
FIG. 13a illustrates a flow chart of an embodiment start-up method used to operate a low side gate driver of a resonant gate driver system.

FIG. 13a illustrates another flow chart of an embodiment method 1300 that may be used as a basis for operating an embodiment start-up sequence of low side gate driver 120. The flow chart begins at step 1302 when switch signals MLL and MLS are set high to energize the low side inductor 192 using a current from an input power supply powering the low side gate driver 120. The switch signals MLD and MLH are set low to allow low side inductor 192 to be charged in the direction that is suitable during a start-up sequence. The charging of the low side inductor 192 continues for a predetermined time as it transitions through a delay step 1304. Next in step 1306, the switch signal MLS is set low that ends the charging of the low side inductor 192. Next in step 1308, another delay is introduced to allow current in the low side inductor 192 to decay to zero. At the next step 1310, a count value is incremented by +1 and the count value is compared to a maximum count value at next step 1312. The count value is used to control the number of times energy is transferred to the high side inductor. The counter is used during the period when low side switching device is turned off and the high side switching device is also turned off. If the count value does not equal to the maximum count value, the flow chart goes back to step 1302 to repeat the steps described above. Once the count value reaches the maximum value, the start-up sequence ends in step 1316.

Figure 13B:
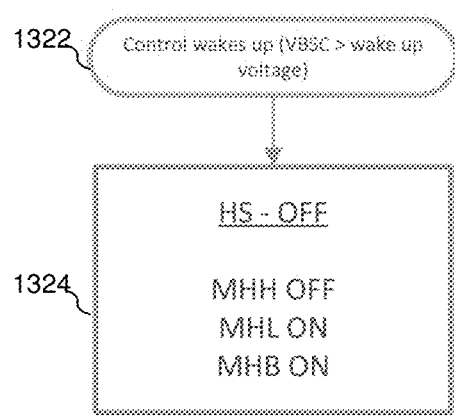
FIG. 13b illustrates a flow chart of an embodiment start-up method used to operate a high side gate driver of a resonant gate driver system.

FIG. 13b illustrates a flow chart of an embodiment method 1320 that may be used to operate a high side resonant gate driver 110. The flow chart begins at step 1322 when a voltage at the bootstrap capacitor crosses a target threshold. Once the target threshold voltage is reached by the bootstrap capacitor, the flow chart transitions to step 1324 where switch signals MHL and MHB are set high. When the bootstrap capacitor voltage reaches a target voltage, the high side gate control circuit 140 functions properly to generate control signals for switches 114 and 118.

Figure 14A:
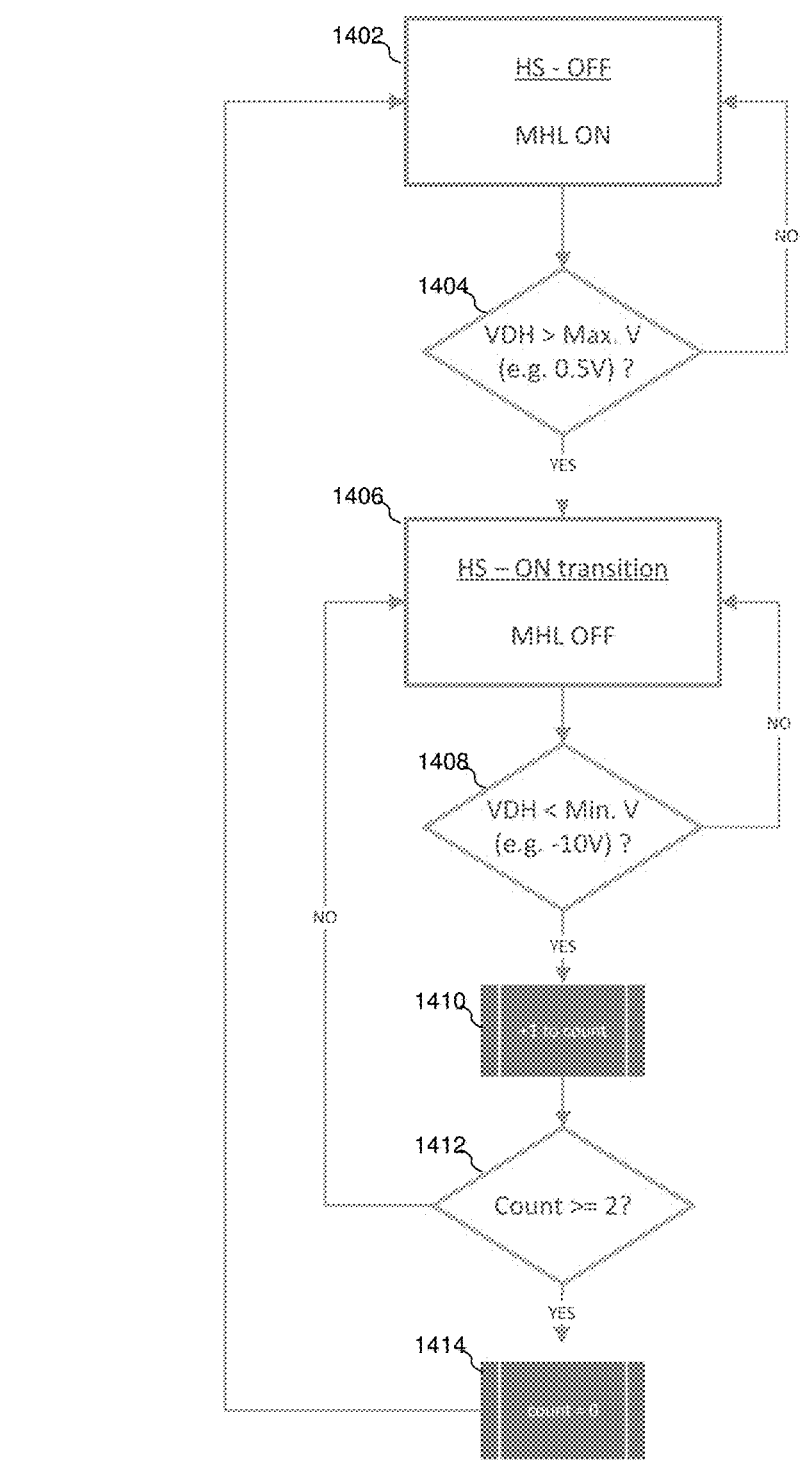

FIG. 14a illustrates a flow chart of an embodiment method 1400 that may be used to operate a high side gate driver 620 used in the embodiment resonant gate driver 600. The embodiment method 1400 describes the way to operate the high side gate driver 620 where a bootstrap capacitor is not used. Instead, the transferred energy is used directly to charge the high side switching device 170. The flow chart begins at step 1402 where switch signal MHL is set high. A high MHL causes switch 118 to pull a gate control node of high side switching device 170 to a source node and turns off the high side switching device 170. Next in step 1404, the diode voltage VDH is compared to a threshold voltage, i.e. +0.5 V. A transition to step 1406 from step 1404 does not occur until diode voltage VDH crosses the threshold of +0.5 V. Next at step 1406, the switch signal MHL is set low and switch 118 releases the gate control node of the high side switching device 170. The high side switching device 170 is then charged by the energy transferred to the high side inductor 194. At step 1408, voltage VDH is again compared to a minimum threshold, i.e. −10 V, and once voltage VDH falls below −10 V, flow chart transitions to step 1410, where a counter value is incremented by a value of +1. Once the counter value has been incremented, the flow chart transitions to step 1412, where the count value is compared to a predetermined value. In the present embodiment, the predetermined value of the count is chosen to be 2; however, the value can be of any number based on the design and application requirements. If the count value is less than the predetermined value, the flow chart transitions back to step 1406 and repeats the process. Once the count value equals the predetermined value, the flow chart transitions to step 1414 where count value is reset to zero and the flow chart goes to step 1402 to repeat the process steps described above.

Figure 14B:
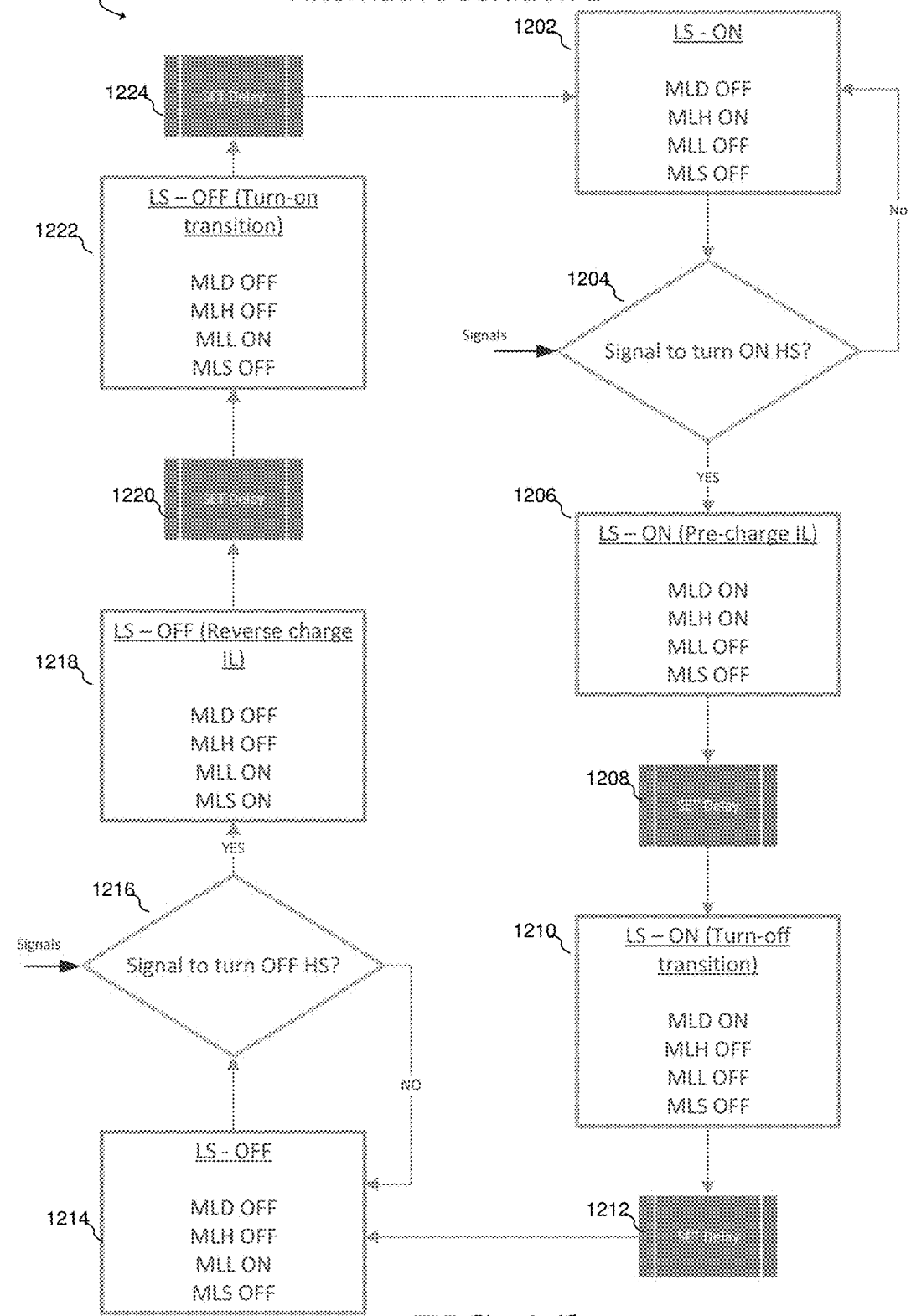
Figure 15A:
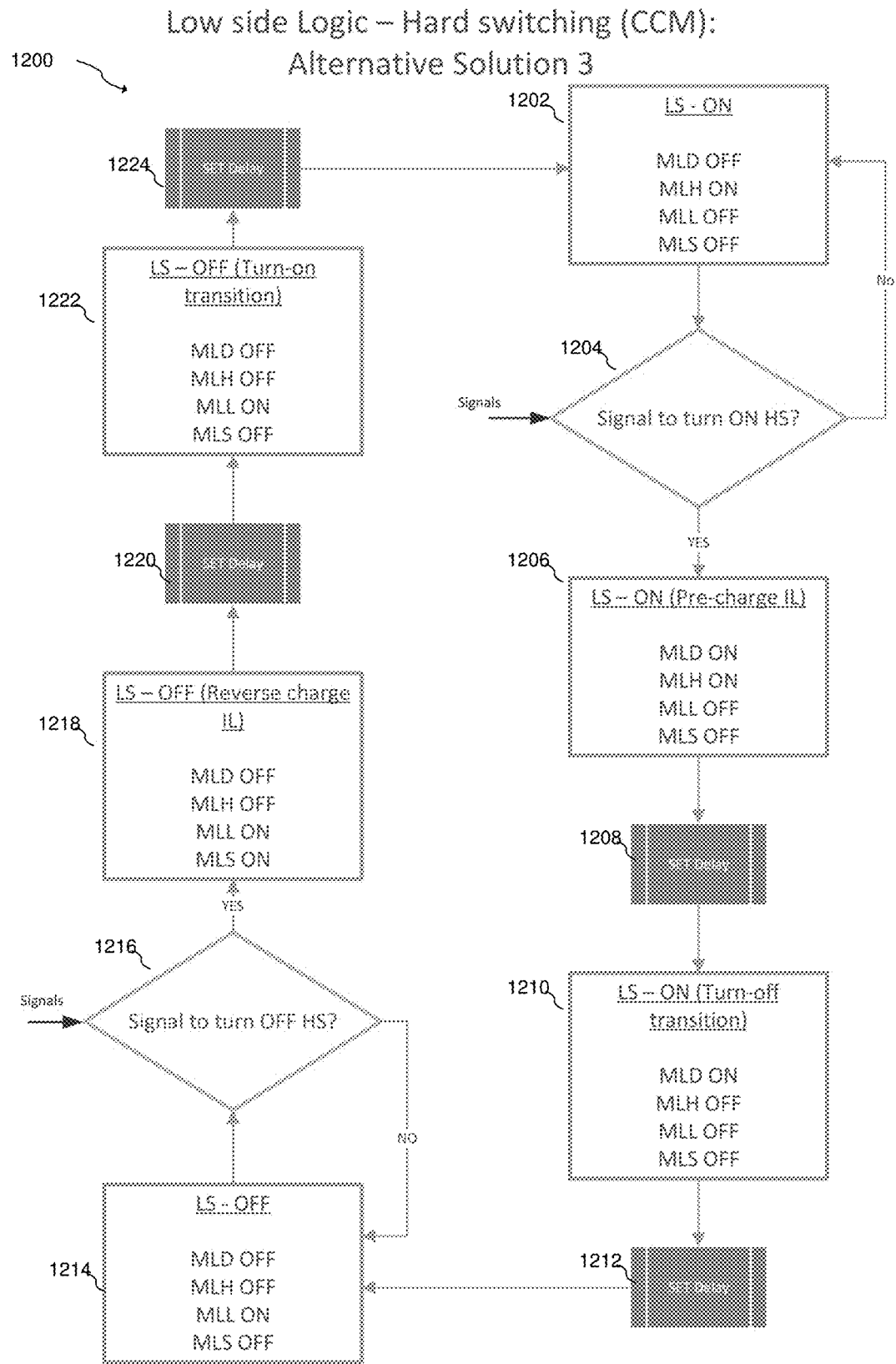

FIG. 14b illustrates a flow chart method of driving a low side resonant gate driver illustrated in embodiment 600. The flow chart shown in FIG. 14b is similar to the flow chart described in FIG. 12. The description of FIG. 12 can be used to understand flow chart shown in FIG. 14b. Similarly, FIG. 15a illustrates the flow chart of low side resonant gate driver illustrated in embodiment 800. The flow chart described in FIG. 15a is similar to the method described in flow chart of FIGS. 12 and 14b. The description of FIGS. 2 and 14b in the earlier paragraph can be referred to understand the flow chart of FIG. 15a.

Figure 15B:
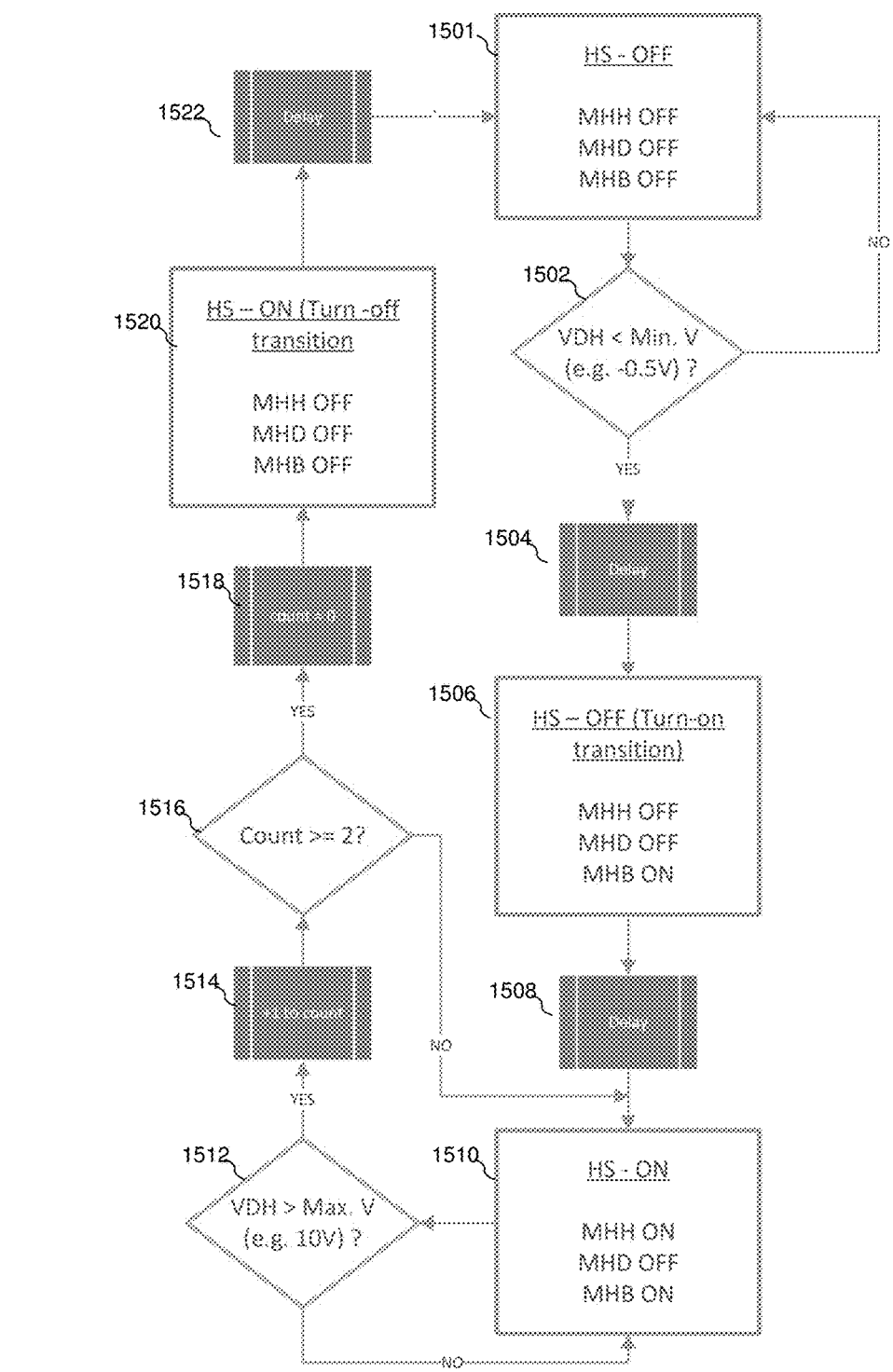

FIG. 15b illustrates a flow chart of an embodiment method 1500 that may be used to operate a high side resonant gate driver 820 described in the embodiment gate driver 800. The embodiment method describes a high side gate control where a high side switching device is turned off by pulling a gate node of the high side switch below a source voltage of the high side switch. In this embodiment, a reference switch 160 is disconnected during the period when high side switch is turned off so that the high side gate driver reference node and the source node of the high side switching device are isolated from each other. The flow chart 1500 begins at step 1501 where high side switching device is turned off and switch signals MHH, MHD and MHB are set low. Next at step 1502, voltage VDH is compared to a minimum threshold value of −0.5 V. In the embodiment 800, the diode 132 is replaced by a switch 726 and voltage VMHD indicates a drain to source voltage of switch 726. The flow chart loops between step 1501 and 1502 until the voltage VMHD is lower than −0.5V. The flow chart then moves to step 1504 to a delay element and after the delay associated with step 1504 the flow chart moves to step 1506. At step 1506, switch signal MHB is set high and it connects the reference node of the high side gate driver 820 to a source node of the high side switching device 170 of the half-bridge 150. The flow chart transitions to another delay step at 1508 and after that delay the flow chart moves to step 1510.

At step 1510, switch signal MHH is set high and it turns on switch 114 that turns on the high side switching device. Next at step 1512, the voltage VMHD is compared to maximum threshold voltage, i.e. +10 V, and when VMHD is greater than the maximum threshold voltage it transitions to a step 1514 and increases a counter value by an increment of +1. The flow chart loops between 1510 and 1512 until voltage VDH is equal to or greater than the maximum threshold voltage. After incrementing the counter value at step 1514, the flow chart moves to step 1516 where it compares the count value to a target value. In the present embodiment the count value is set to 2, however, the value can be any integer based on the design requirements. If the count value is not equal to or greater than the target value, the flow chart moves back to step 1510 and repeats the process. Next at step 1518 the count value is reset to zero and flow chart moves to step 1520. At step 1520 switch signal MHH and MHB are turned off and high side gate driver reference is isolated from the source node of the high side switching device. Based on the amount of delay set at step 1522, the high side gate can be pulled to voltage that is lower than the voltage at the source node of the high side switching device.

Figure 16A:
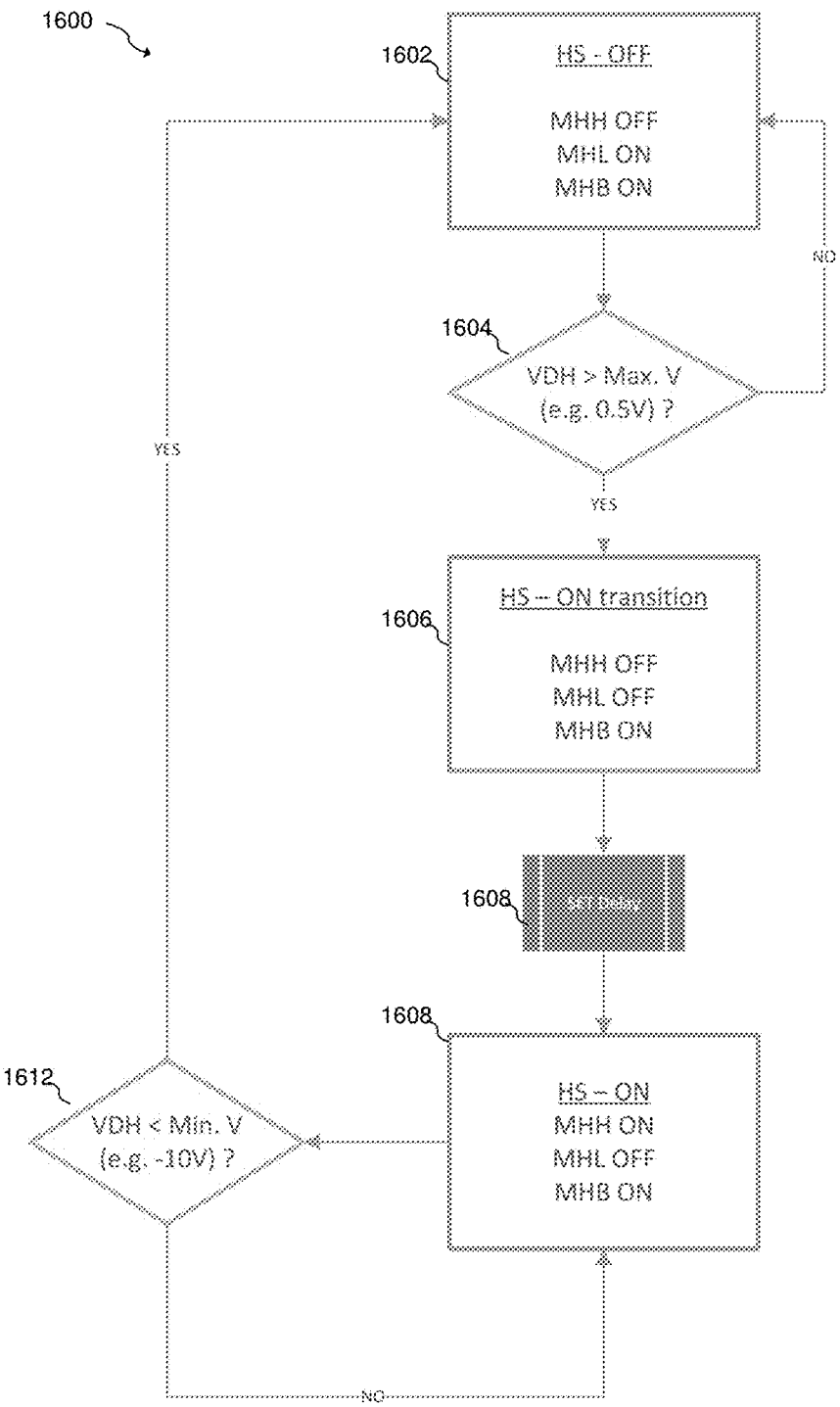

FIG. 16a illustrates a flow chart of an embodiment method 1600 that may be used to operate a high side gate resonant gate driver shown in FIG. 9a. The flow chart of the embodiment method 1600 is similar to the flow chart of the embodiment method 1100 shown in FIG. 11 except the transition from step 1606 to step 1610 includes a predetermined delay of step 1608 in between. In the flow chart of the embodiment method 1100, two different possibilities were provided that included a condition step of 1110 that compares voltage VDH to threshold of −10 V. However, in the embodiment method 1600, a delay step 1608 is used and step 1110 of comparing voltage VDH is not implemented.

Figure 16B:
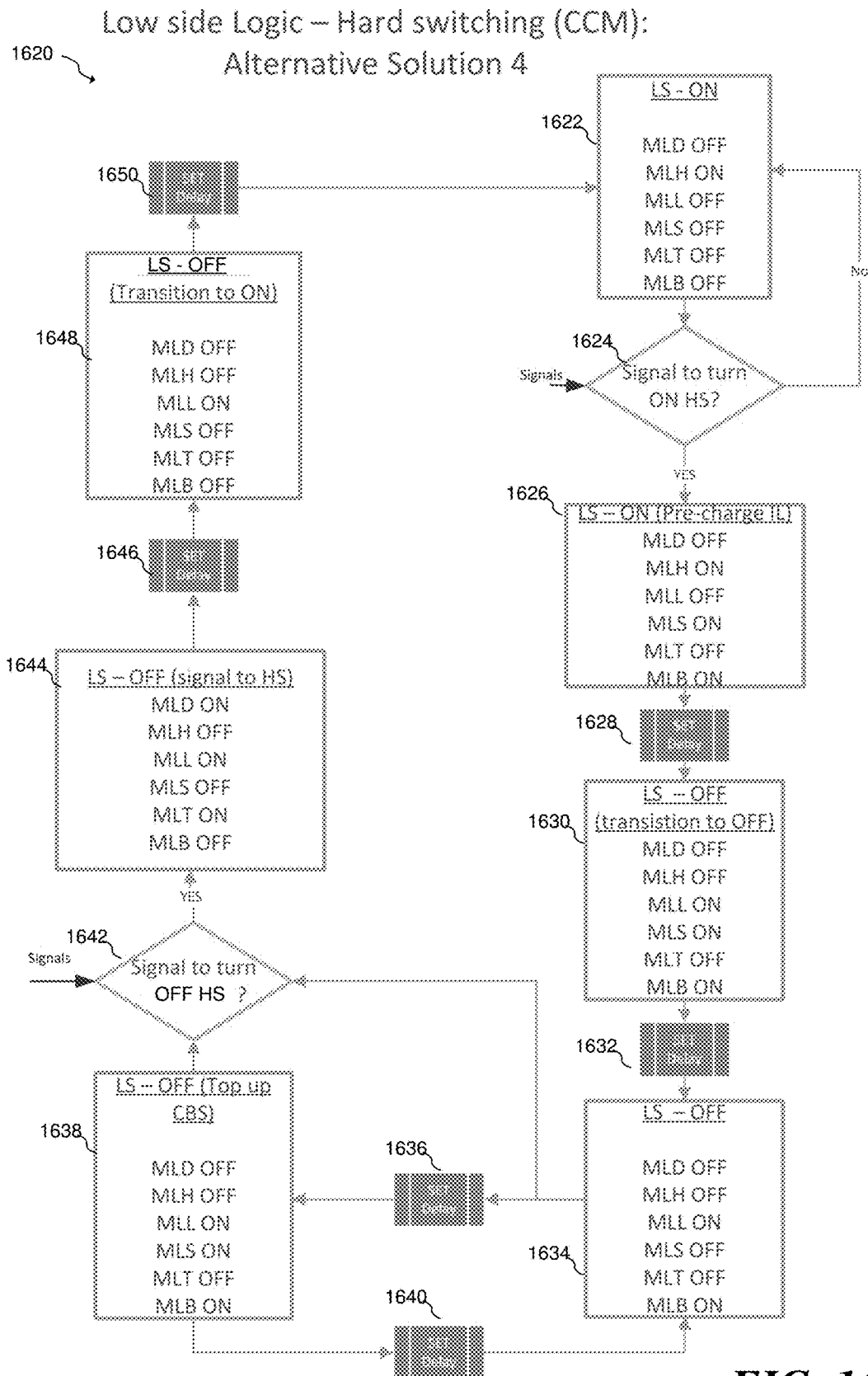

FIG. 16b illustrates a flow chart of an embodiment method 1620 that may be used to operate a low side gate resonant gate driver 920 shown in FIG. 9a. The flow chart 1620 describes steps to operate a low side gate driver 920 using a hard switching technique to control half-bridge implemented by two GaN switches 902 and 904. The flow chart begins at 1622 where the low side switching device 904 is turned on by having switch signal MLH set high. Switch signals MLL, MLD, MLT and MLB, MLS are set low. The step 1622 is considered a low side on period. Next at step 1624, flow chart waits for a signal to turn on the high side switching device 902. If a signal to turn on the high side switching device 902 is received, the flow chart moves to step 1626, otherwise flow chart goes back to step 1622 until a signal to turn on the high side GaN switching device 902 is received. During step 1626, the low side inductor 192 is pre-charged when switch signal MLB and MLS goes high.

Switch signals MLT and MLD remain low to allow the pre-charging of the low side inductor in a first direction. Next step 1628 includes a predetermined delay. After the delay in step 1628, flow chart transitions to step 1630. At step 1630, switch signal MLH is set low to end energizing the low side inductor 192 from an input power supply of low side gate driver 920 and switch signal MLL is set high to insure low side GaN switch 904 remains turned off. Next step 1632 includes another predetermined delay, after which flow chart transitions to step 1634. At step 1634 switch signal MLS is set low to allow energy from low side inductor 192 to transfer to high side inductor 194.

Next in step 1636, another predetermined delay is implemented and flow chart transitions to step 1638. In step 1638, switch signal MLS is set high to energize low side inductor 192 for a certain interval that is based on the delay in step 1640. The flow chart loops between step 1634, step 1636, step 1638 and step 1640 to charge bootstrap capacitor in high side gate driver 910 during when high side GaN switch 902 remains on. The charging of bootstrap capacitor using a transferred energy from the low side inductor 192 continues until a signal to turn off high side GaN switch 902 is received in state 1642. When a turn off signal is received, flow chart moves to step 1644 where switch signals MLD and MLT are set high to charge low side inductor in a direction opposite to the charging performed in step 1626. At step 1644, switch signals MLS and MLB are set low to insure current flow in low side inductor is in opposite direction to that of step 1626.

A transition from step 1644 involves a delay at step 1646. After the delay, flow chart moves to step 1648 where switch signals MLT and MLD are set low to transfer energy from low side inductor to high side inductor. The transferred energy is used to turn off high side GaN switch 902. The flow chart repeats the cycle by transitioning to step 1622 after another delay in step 1650.

Figure 17:
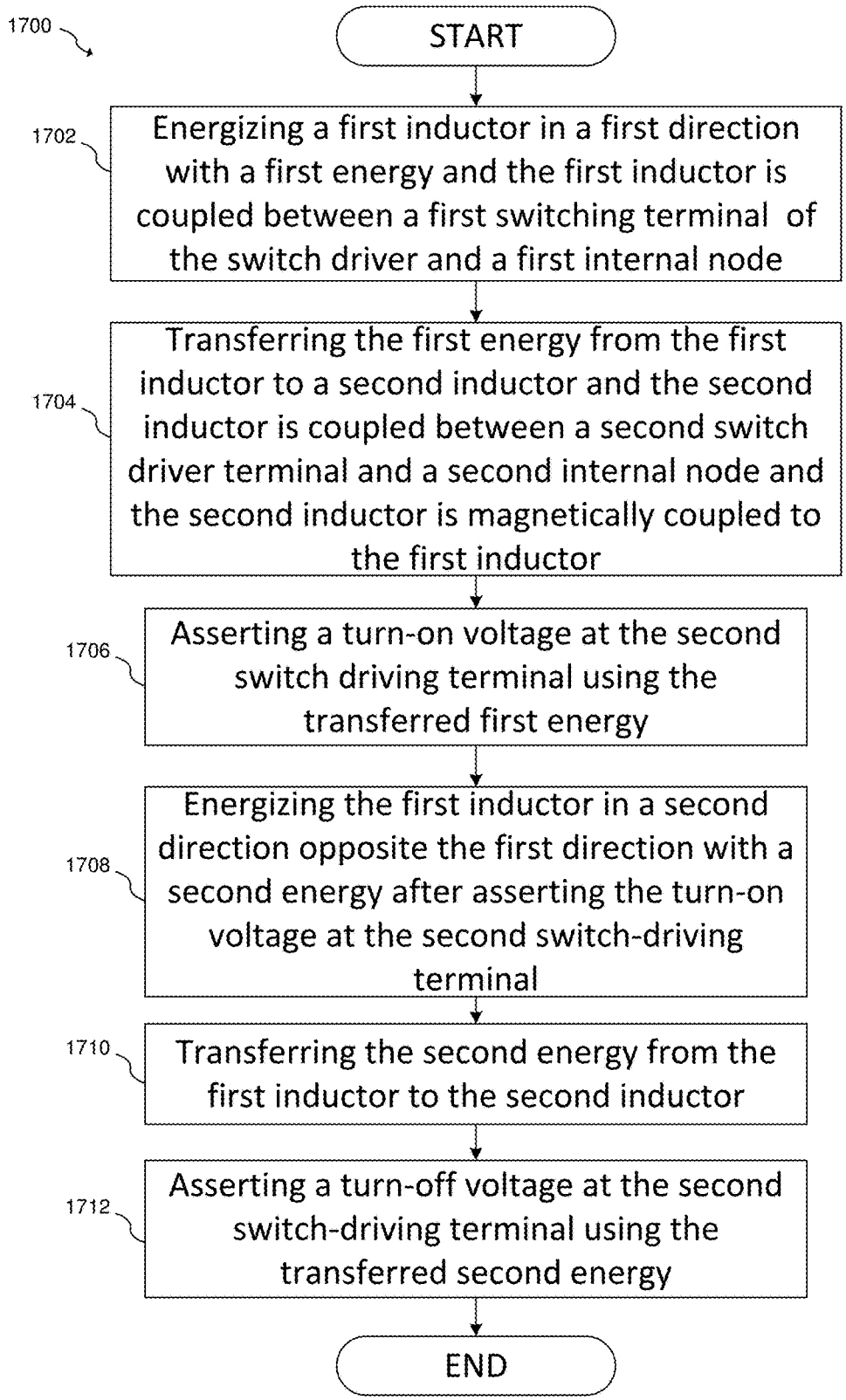
FIG. 17 illustrates a block diagram of an embodiment method.

FIG. 17 illustrates a flowchart of an embodiment method 1700 of controlling a switch driver. In step 1702, a first inductor is energized in a first direction with a first energy. In an embodiment, the first inductor is coupled between a first switch-driving terminal of the switch driver and a first terminal node. Next in step 1704, the first energy from the first inductor is transferred to a second inductor. In an embodiment, the second inductor is coupled between a second switch-driving terminal of the switch driver and a second internal node, and the second inductor is magnetically coupled to the first inductor. Next in step 1706, a turn-on voltage is asserted at the second switch-driving terminal using the first energy. Next in step 1708, the first inductor is energized in a second direction opposite the first direction with a second energy after asserting the turn-on voltage at the second switch-driving terminal. Next in step 1710, the second energy from the first inductor is transferred to the second inductor. Next in step 1712, a turn-off voltage is asserted at the second switch-driving terminal using the transferred second energy.

Figure 18:
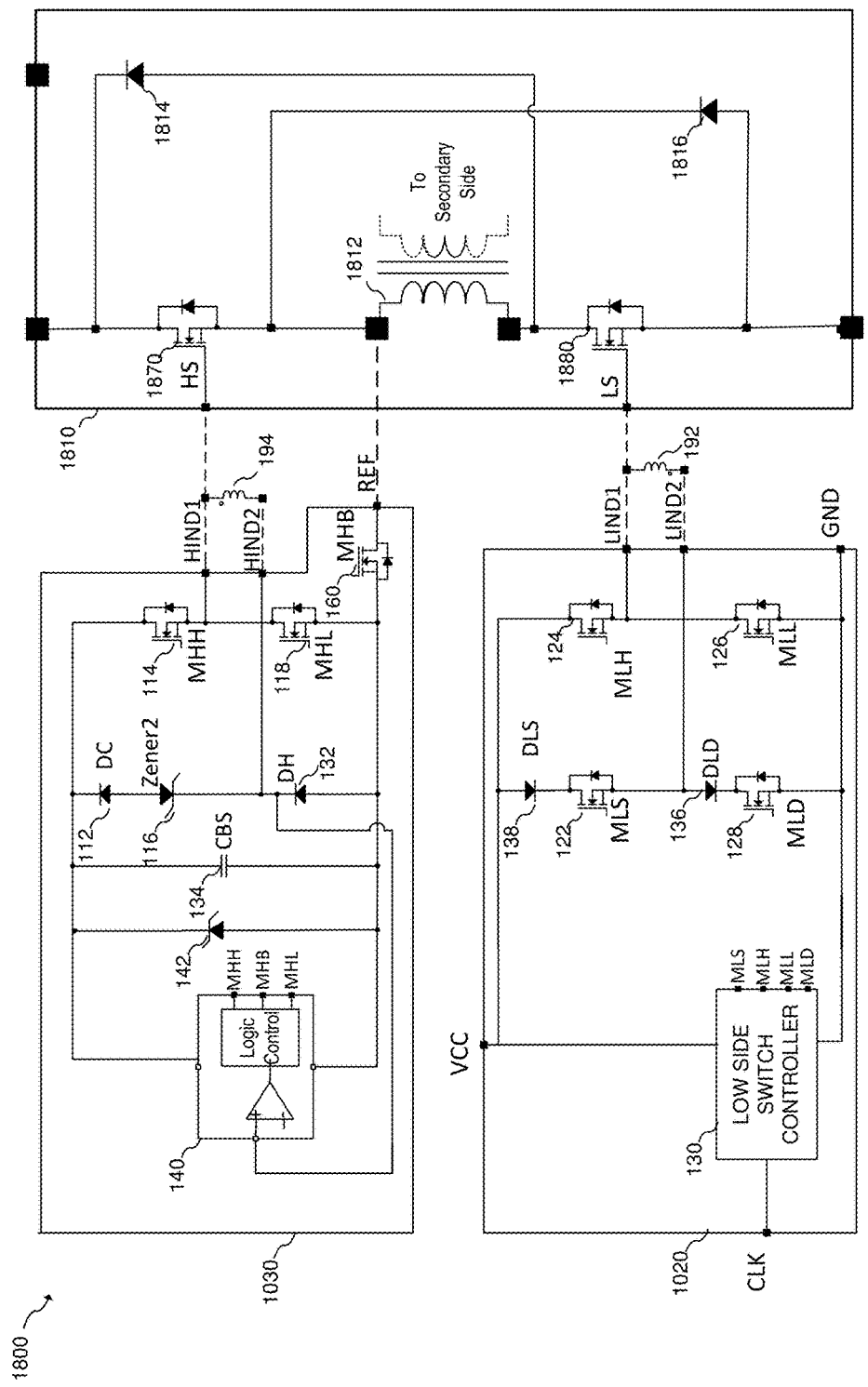
FIG. 18 illustrates a schematic of an embodiment resonant driver system used to drive a two-switch forward power converter.

It should be appreciated that embodiment resonant gate driver circuits and systems may be used to drive other circuits besides H-bridge circuits. As an example, FIG. 18 illustrates an embodiment resonant driver system used to drive a two-switch forward power converter. As shown, low side gate driver IC 1020 and high side gate driver IC 1030, as described hereinabove with respect to FIGS. 10-16, are used to drive the primary side 1810 of a two-switch forward power converter 1810. Primary side 1810 of the two-switch forward power converter is shown to include transformer 1812, high side switch 1870, low side switch 1880, diode 1814 and diode 1816. The secondary side of the forward power converter not shown for clarity of illustration. Alternatively, other embodiment resonant gate driver circuits besides ICs 1020 and 1030, such as the embodiments disclosed and described with respect to FIGS. 1-9 and 17, may also be used to drive non-H-bridge circuit configurations.

Figure 19:
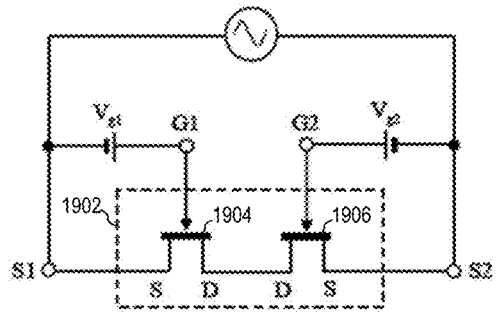
FIG. 19 illustrates a bidirectional GaN switch.

Embodiment driver circuits may also be used to drive a bi-directional switch, such as bi-directional GaN switch 1902 illustrated in FIG. 19, which includes GaN transistors 1904 and 1906 coupled in series with their respective drain terminals D connected together. By using isolated gate drivers represented by voltage sources Vg1 and Vg2 that are referenced to the source terminals S1 and S2 of GaN transistors 1904 and 1906, respectively, bi-directional GaN switch may be operated as a floating switch. In embodiments of the present invention, isolated gate drivers are implemented using embodiment magnetically coupled gate driver circuits. In some embodiments, either source terminal S1 or S2 is referenced to ground. In other embodiments, both terminals S1 and S2 are floating and not referenced to ground. The fundamental concept of such circuits are similar to previously described circuits, with the difference being that instead of turning on and off the switches in a mutually exclusive manner, both switching transistors may be turned on and turned off at about the same time. In some embodiments, there may be slight delays between the turning on and off transistors 1904 and 1906. Synchronization may be achieved by synchronizing the magnetically coupled gate drive circuits via the magnetically coupled inductors. In various embodiments, energy is also transferred on a periodic basis when bidirectional GaN switch 1902 is on in order to provide adequate gate current to keep GaN devices 1904 and 1906 on. It should be understood that the various embodiments disclosed with respect to driving bidirectional GaN switch 1902 may also be used to drive bidirectional switches fabricated using other device technologies besides GaN, such as silicon and silicon carbide.

Figure 20:
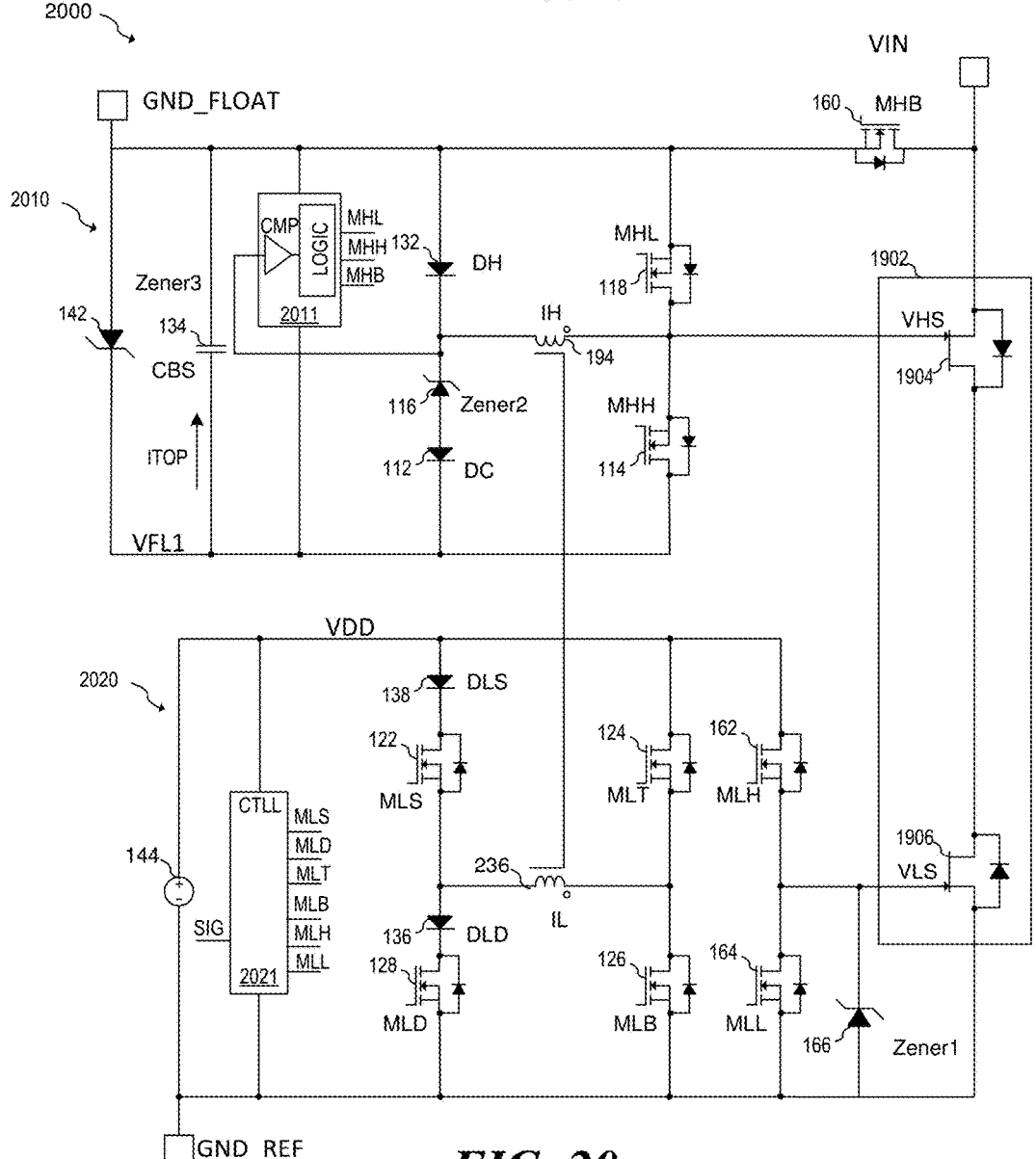
FIG. 20 illustrates a schematic of an embodiment bidirectional switch driving circuit.

FIG. 20 illustrates an embodiment switching system 2000 for driving a bidirectional switch such as bidirectional GaN switch 1902. As shown, switching system 2000 a floating driving circuit 2010 coupled to transistor 1904 of bidirectional GaN switch 1902 and ground referenced driving circuit 2020 coupled to transistor 1906 of bidirectional GaN switch 1902. The principal of operation of activating transistor 1904 by the floating driving circuit system 2000 is similar to the principal of operation of driving high side transistor 170 shown in FIG. 1, namely, ground referenced driving circuit 2020 energizes the inductor 236, and energy transferred from the inductor 236 to the inductor 194. This transferred energy is used to charge the floating capacitor 134 and activate transistor 1904 of bi-directional GaN switch 1902. In order to simultaneously activate both transistors 1904 and 1906 of bidirectional GaN switch 1902, an extra driver circuit that includes transistors 162 and 164 is provided to turn-on and turn-off transistor 1906 at the same time that transistors 1904 is turned-on and turned-off. In addition, during times that transistor 1904 is statically turned-on; energy is periodically transferred from the inductor 236 to the inductor 194 in order to provide a DC gate current to transistor 1904 to keep it on.

As shown, the floating driving circuit 2010 includes a floating controller 2011 that controls transistors 114, 118 and 160 via gate control signals MHH, MHL and MHB, respectively. In an embodiment, the floating controller 2011 is locally referenced to floating ground GND_FLOAT and local floating power supply node VFL1. As shown, the floating controller 2011 includes a comparator CMP and a logic block configured to assert and de-assert control signals MHL, MHH and MHB according to embodiments described below.

The driving circuit 2020 includes a controller 2021 that controls transistors 122, 124, 126, 128, 162 and 164 via gate control signals MLS, MLT, MLB, MLD, MLH and MLL, respectively based on input received at input pin SIG. As shown, low side controller 2021 is referenced to non-floating ground GND_REF and DC power supply node VDD.

Figure 21:
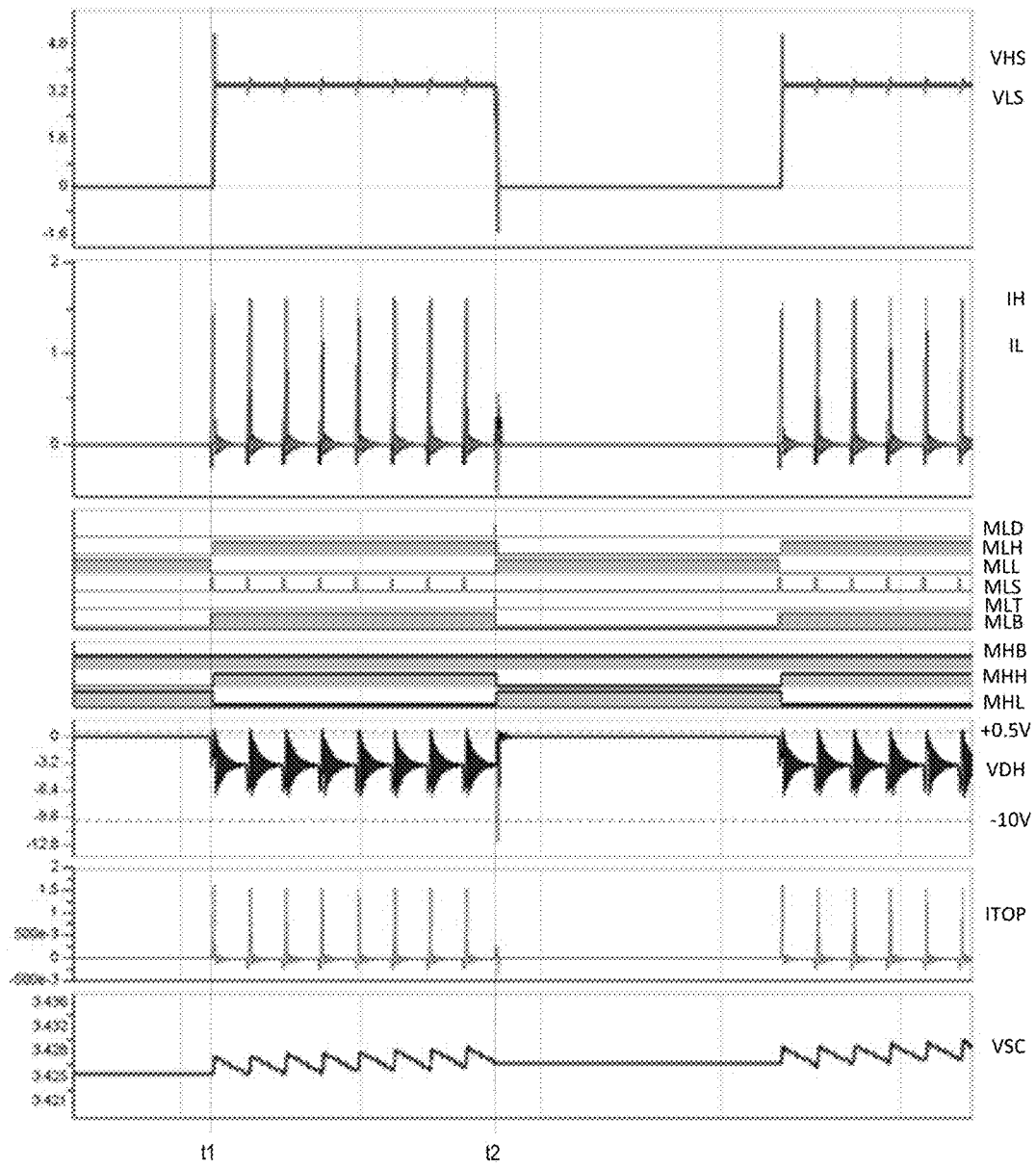
FIG. 21 illustrates a waveform diagram of an embodiment switch driving circuit.

FIG. 21 shows a waveform diagram that illustrates the operation of switching system 2000. As shown, at time t1, signals MLS and MLB are activated to energize the inductor 236. Shortly thereafter, both the floating gate voltage VHS and ground referenced gate voltage VLS goes high, transistor 114 is activated via control signal MHH and transistor 118 is deactivated by control signal MHLon the floating side; and transistor 162 is activated by control signal MLH and transistor 164 is deactivated by control signal MLL. This effectively turns on bidirectional GaN switch 1902. Between times t1 and t2 when the floating gate voltage VHS and ground referenced gate voltage VLS, transistor 124 is periodically activated via signal MLS in order to transfer energy to top off the floating capacitor CBS, which manifests itself in current pulses with respect to current IL in the inductor 236, current IH in the inductor 194 and current ITOP in the floating capacitor 134. When the floating gate voltage VHS and the gate voltage VLS are high, voltage VDH across diode 132 is negative, indicated that diode 132 is reversed biased. In some embodiments, the floating controller used voltage VDH across diode 132 to determine when to activate and deactivate transistors 114, 118 and 160 via control signals MHH, MHL and MHB.

Both the floating gate voltage VHS and ground referenced gate voltage VLS go low when transistor 114 is deactivated via control signal MHH and transistor 118 is activated by control signal MHL on the floating side; and transistor 162 is deactivated by control signal MLH and transistor 164 is activated by control signal MLL on the ground referenced side. This effectively turns off bidirectional GaN switch 1902.

Figure 22A:
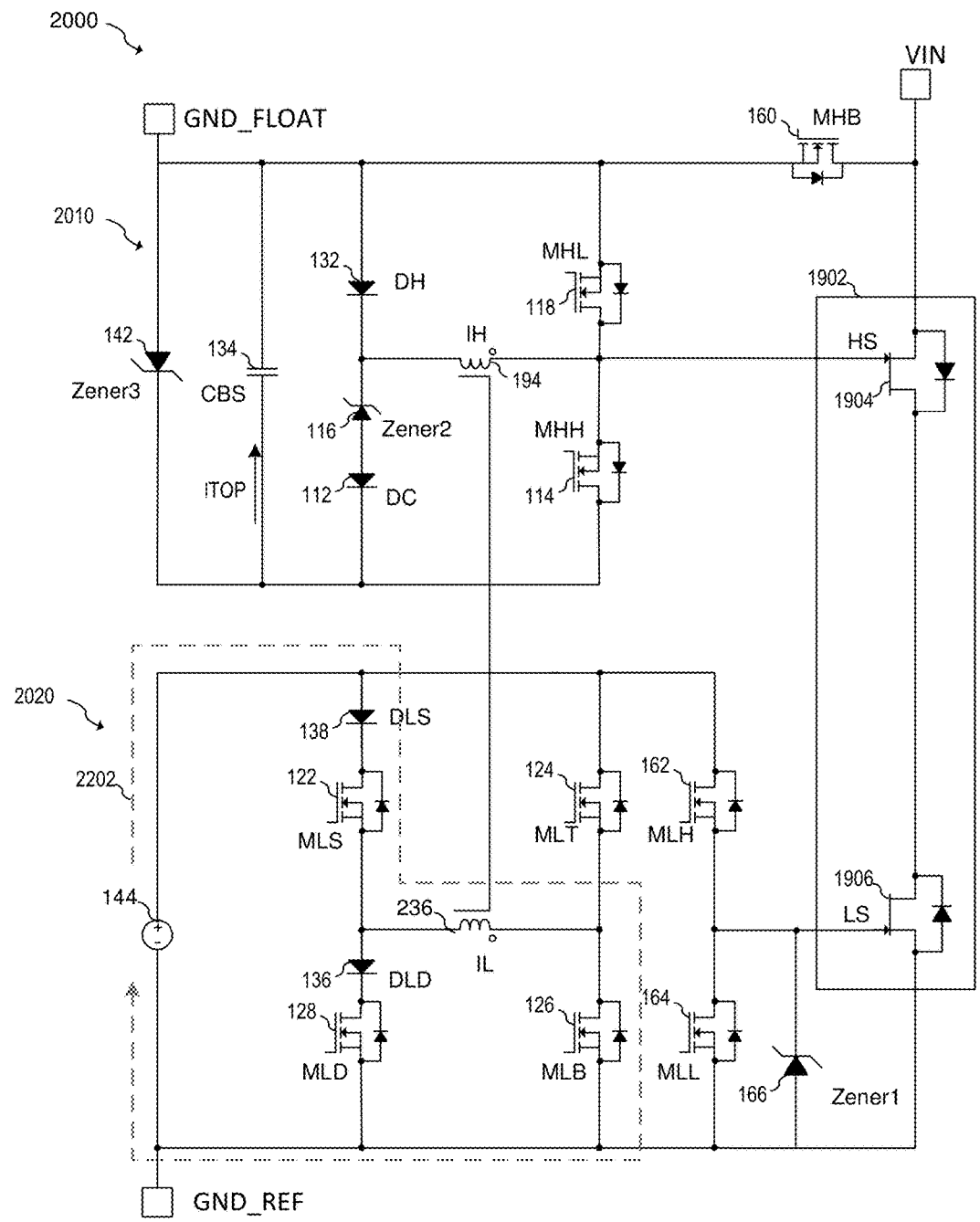
FIGS. 22a-22g illustrate waveform diagrams of an embodiment switch driving circuit.
Figure 22B:
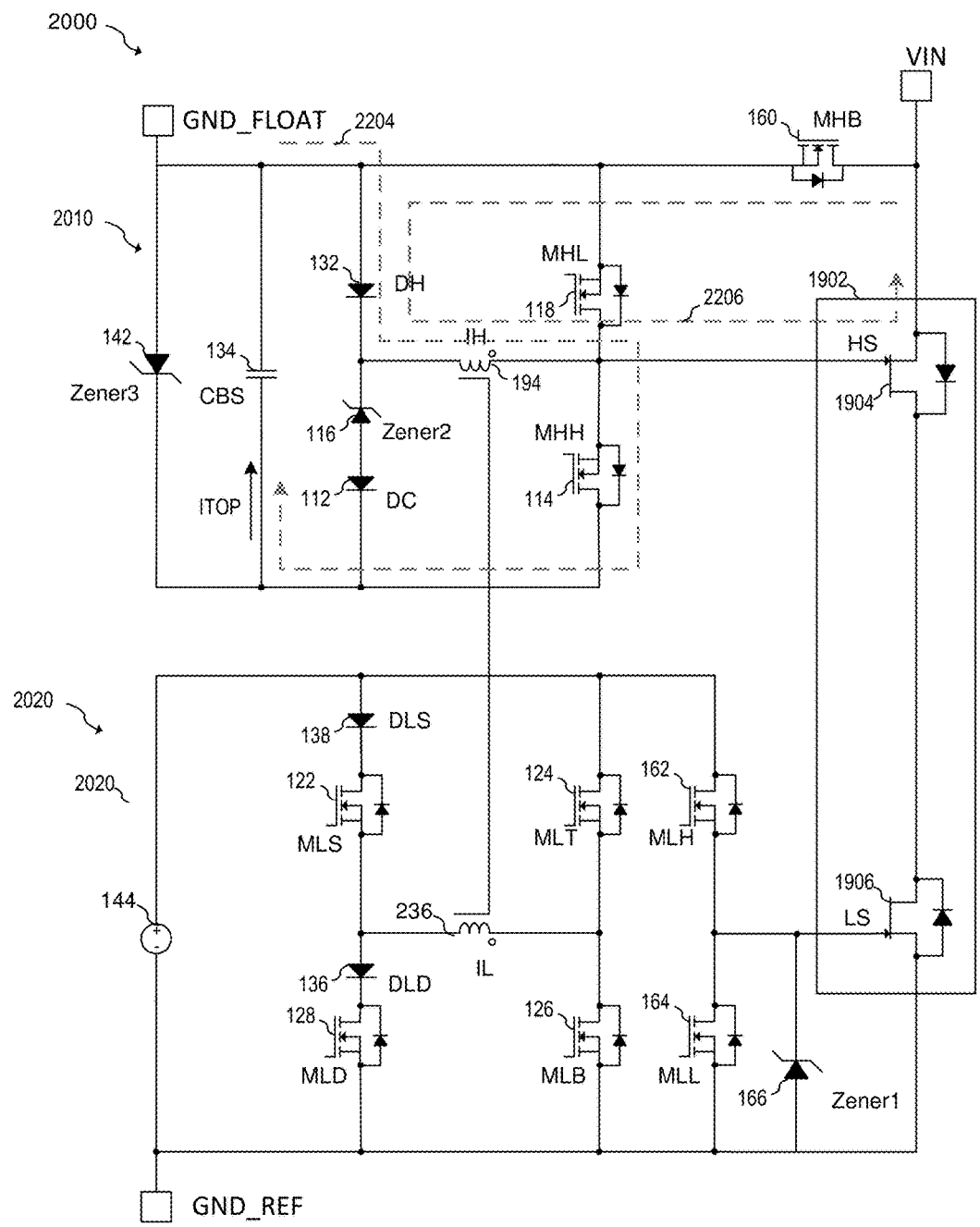
Figure 22C:
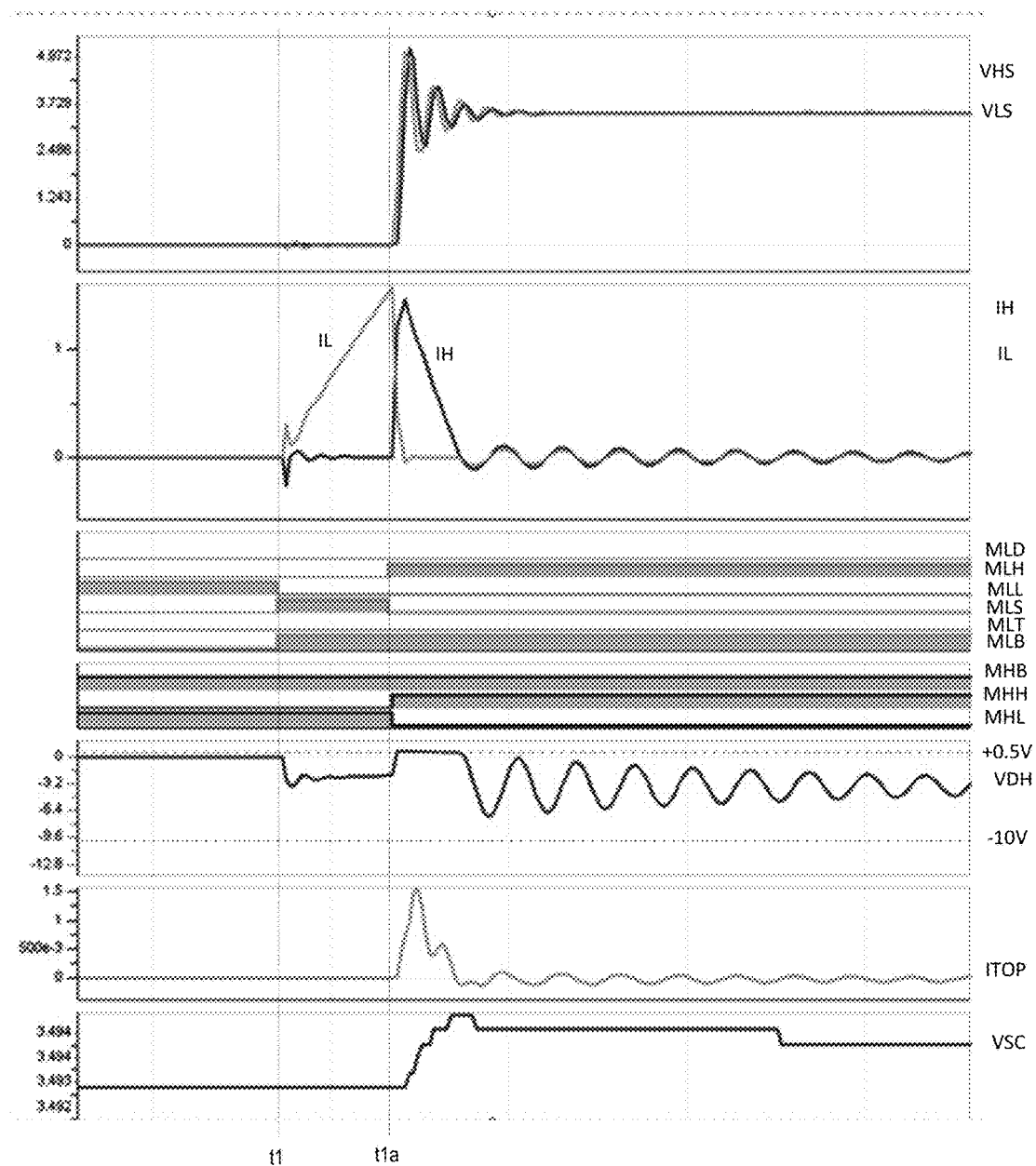

FIGS. 22a and 22b illustrate annotated schematics that show how switching system 2000 activates bidirectional GaN switch 1902, and FIGS. 22C to 22g illustrate accompanying waveform diagrams showing the operation of switching system 2000 when bidirectional GaN switch 1902 is activated and when the floating capacitor 134 is being recharged.

Turning to FIG. 22a, a turn-on sequence of bidirectional GaN switch 1902 is initiated when transistors 122 and 126 are activated via control signals MLS and MLB to form current loop 2202. During this time, inductor 236 is magnetized from energy provided by voltage source 144 as current flows through diode 138, transistor 122, inductor 236 and transistor 126. The turning on of transistors 122 and 126 corresponds to time t1 in the waveform diagram of FIG. 22C. As shown, the current IL through the inductor 236 increases linearly with time as control signals MLS and MLB are asserted.

At time t1a, transistor 122 is shut off by de-asserting control signal MLS, which effectively turns-off the current though the inductor 236. Also, at time t1a, transistor 118 is turned off via control signal MHL and transistor 114 in the floating driver 2010 is turned on via control signal MHH to provide a current path though diode 132, the inductor 194 and transistor 114. This current path, which is designated as current loops 2204 and 2206 in FIG. 22b, represents energy that is transferred from the inductor 236 to the inductor 194 via magnetic coupling. The induced current in the inductor 194 both charges the floating capacitor 134 via current loop 2204, and charges the gate of transistor 1904 of bidirectional GaN switch 1902 via current loop 2206, which turns on transistor 1904. In an embodiment, transistor 118 is turned off and transistor MHH is turned on when control circuit 2011 (FIG. 20) senses that the voltage across diode 132 exceeds a threshold voltage via comparator CMP. In some embodiments, this threshold voltage is about 0.5 V. Alternatively other threshold voltages may be used. Transistor 1906 is also turned on at time t1a by activating transistor 162 via control signal MLH and deactivating transistor 164 via control signal MLL.

Subsequent to time t1a, current ITOP through the floating capacitor 134 momentarily increases and causes a corresponding increase in voltage VSC across the floating capacitor 134. This momentary increase in current ITOP represents the floating capacitor 134 being topped off or recharged.

Figure 22D:
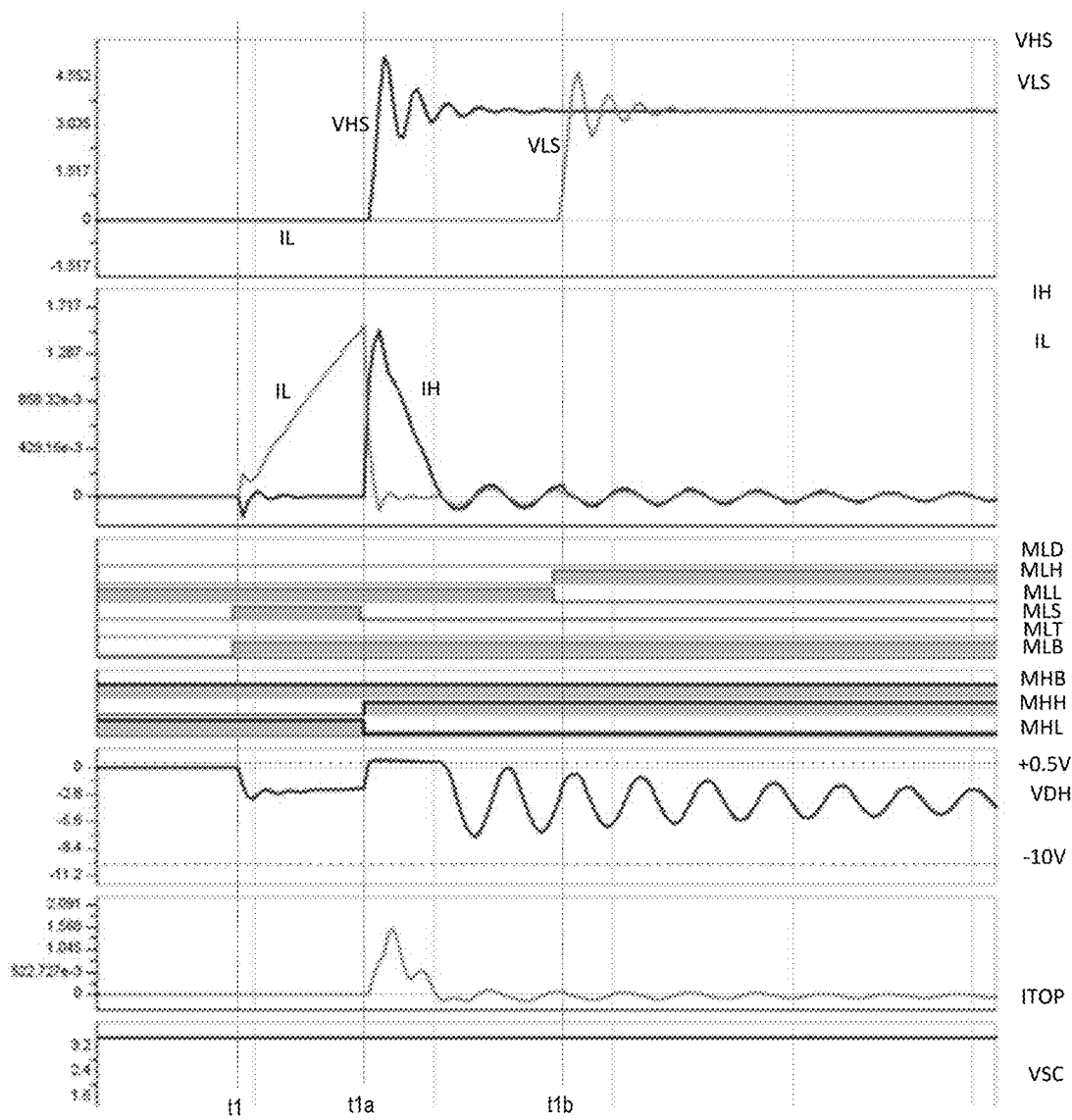

In some embodiments, the transistor 1904 and the transistor 1906 may be turned on and off independently of each other as shown in the waveform diagram of FIG. 22d. Here, the transistor 1906 is turned on at time t1b, which occurs sometime later than time t1a when the floating transistor 1904 is turned on. Turning on the transistor 1906 after the floating transistor may be used, for example, in some embodiment zero voltage switching (ZVS) schemes. For example, when the floating transistor 1904 is turned on first, the voltage across the transistor 1906 is clamped by the channel of the floating transistor 1904. By turning on the floating transistor 1904 before the zero voltage point is reached across ground referenced transistor 1906, safe ZVS operation may be ensured. In addition, the required accuracy needed to achieve ZVS in low-side transistor 1906 is reduced because the voltage would not accumulate across the switch 1904 in the reverse direction. In embodiments where the voltage across bi-directional switch 1902 is reversed, for example, when voltage at terminal VIN is less than the voltage at GND_REF, the transistor 1906 may be turned on before the floating transistor 1904 is turned on.

Figure 22E:
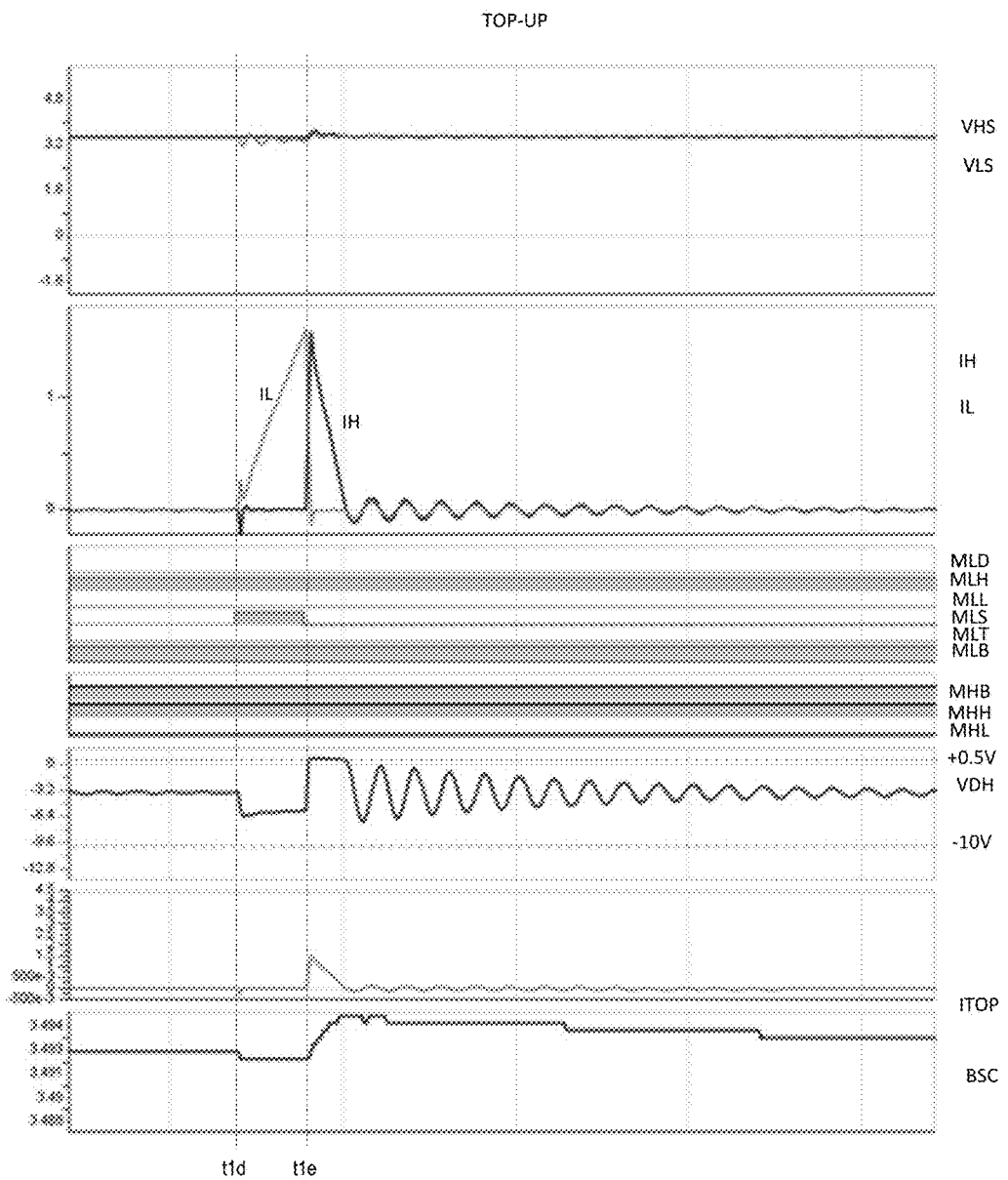

FIG. 22e illustrates a waveform diagram in which the floating capacitor 134 is recharged or "topped up" when bidirectional GaN switch is turned on. As shown, between time t1d and t1e, transistor 122 is turned on pulsing control signal MLS. This magnetizes the inductor 236 and causes a linearly increasing current IL. At time t1e, transistor 122 is shut off, and energy is transferred from inductor 236 to inductor 194. Current induced in the inductor 194 is used to recharge or "top up" the floating capacitor 134 as well as provide energy to maintain a DC current through the gate of the floating transistor 1904. The current flow through switching system 2000 during the recharge operation of FIG. 22a is similar to the turn on operation described above with respect to current loop 2202 shown in FIG. 22a and current loops 2204 and 2206 shown in FIG. 22b.

Figure 22F:
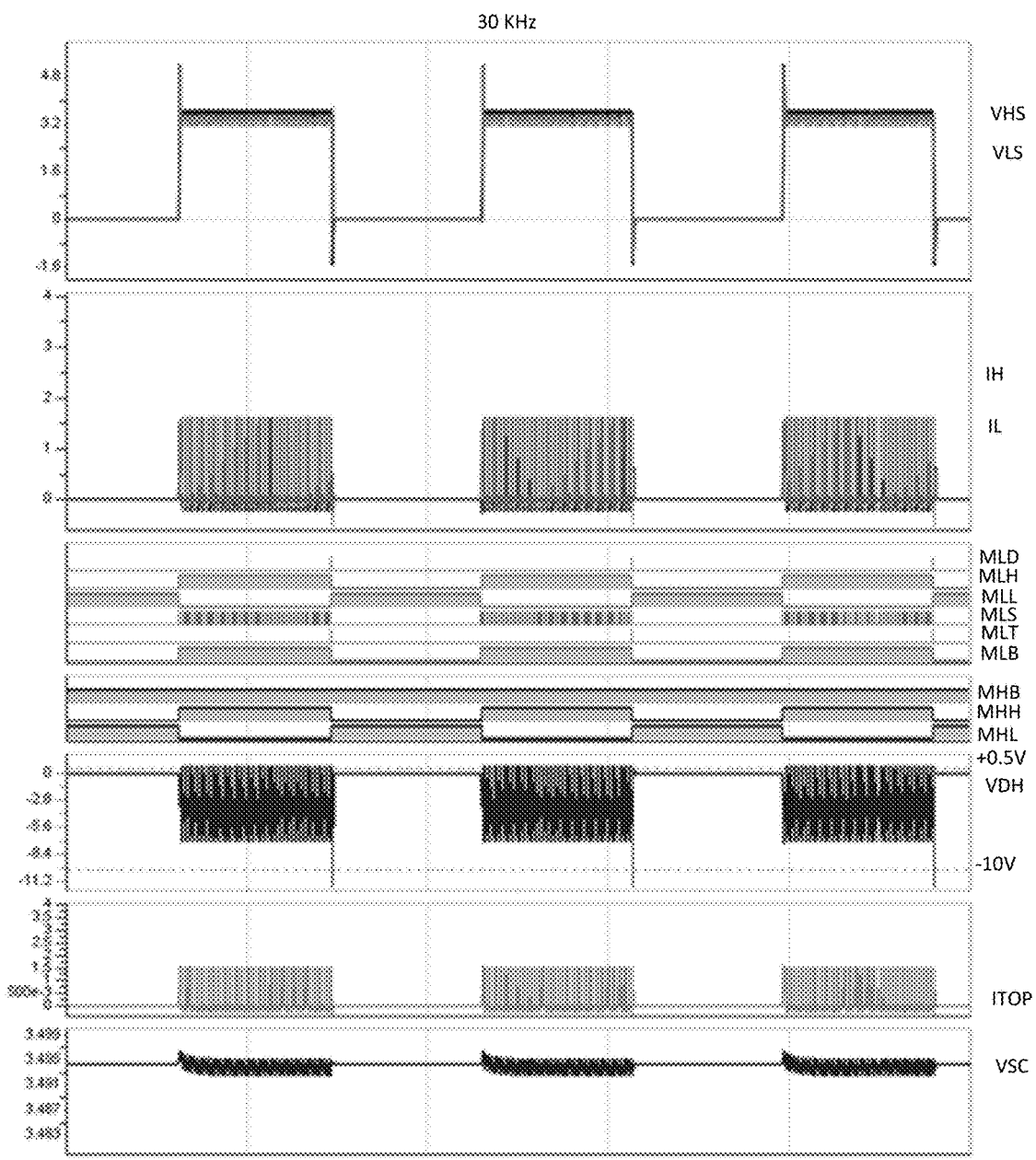

FIG. 22f is a waveform diagram that illustrates the switching operation of switching system 2000 when it is driving a 30 KHz switching signal to bidirectional GaN switch 1902. As shown, switching signals VLS and VLH operate at the switching frequency of 30 KHz. However, control signal MLS is toggled at a switching frequency of 3 MHz whenever switching signal VLH is high in order to top up capacitor 134 and ensure that there is adequate current provided to the gate of transistor 1904 to keep it on. In various embodiments, the frequency at which control signal MLS is pulsed depends on the amount of gate current consumed by transistor 1904. In some embodiments, this gate current may be appreciable and be on the order of a few tens of milliamps. Thus, the top-off frequency may depend on the particular application and its specifications.

Figure 22G:
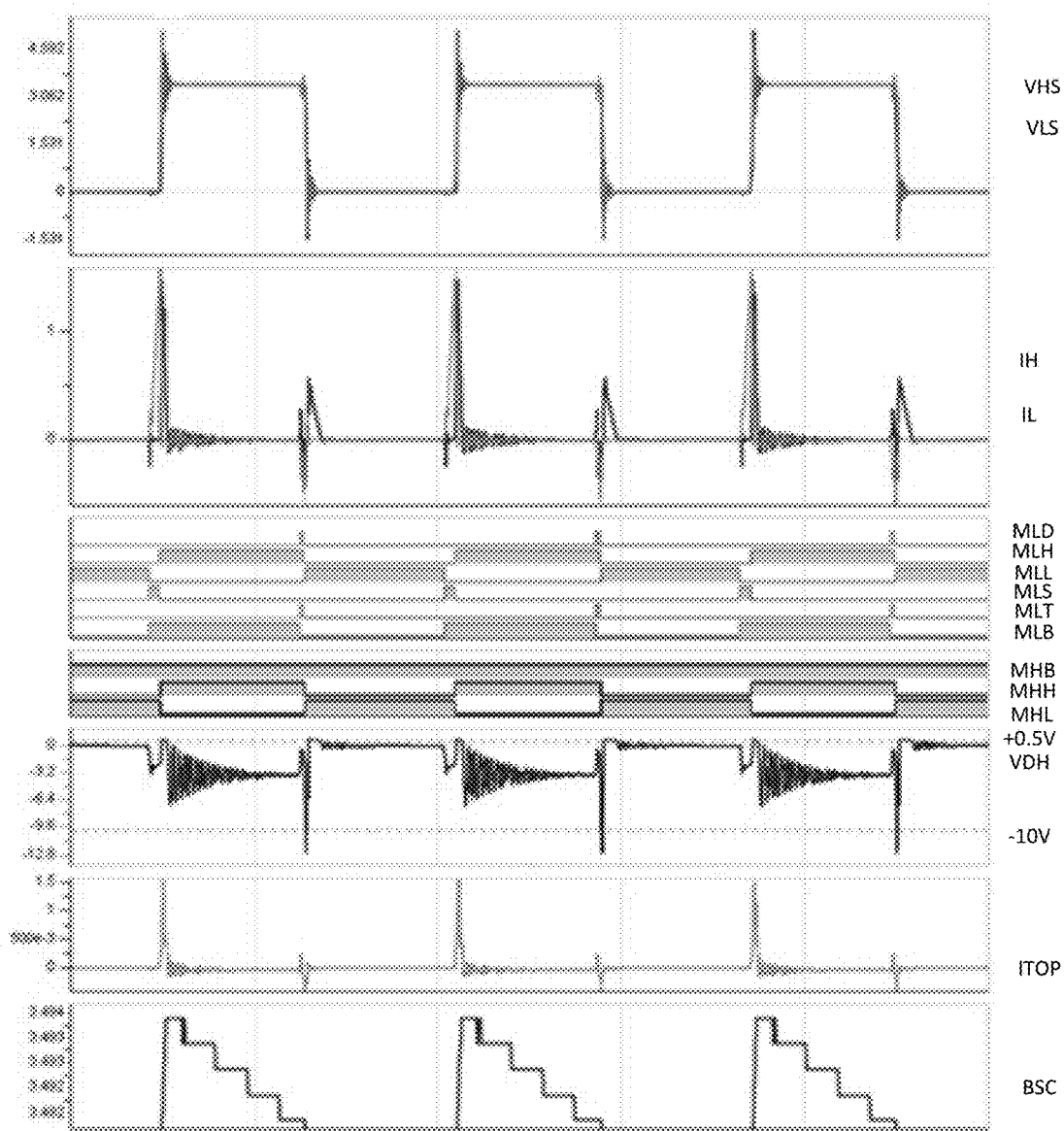

FIG. 22g is a waveform diagram that illustrates the switching operation of switching system 2000 when it is driving a 3 MHz switching signal to bidirectional GaN switch 1902. As shown, switching signals VLS and VLH operate at the switching frequency of 3 MHz. Because of its relatively high frequency of operation, adequate charge is provided to the floating capacitor 134 during each switching cycle, so no additional top up pulses are provided via control signal MLS.

Figure 23A:
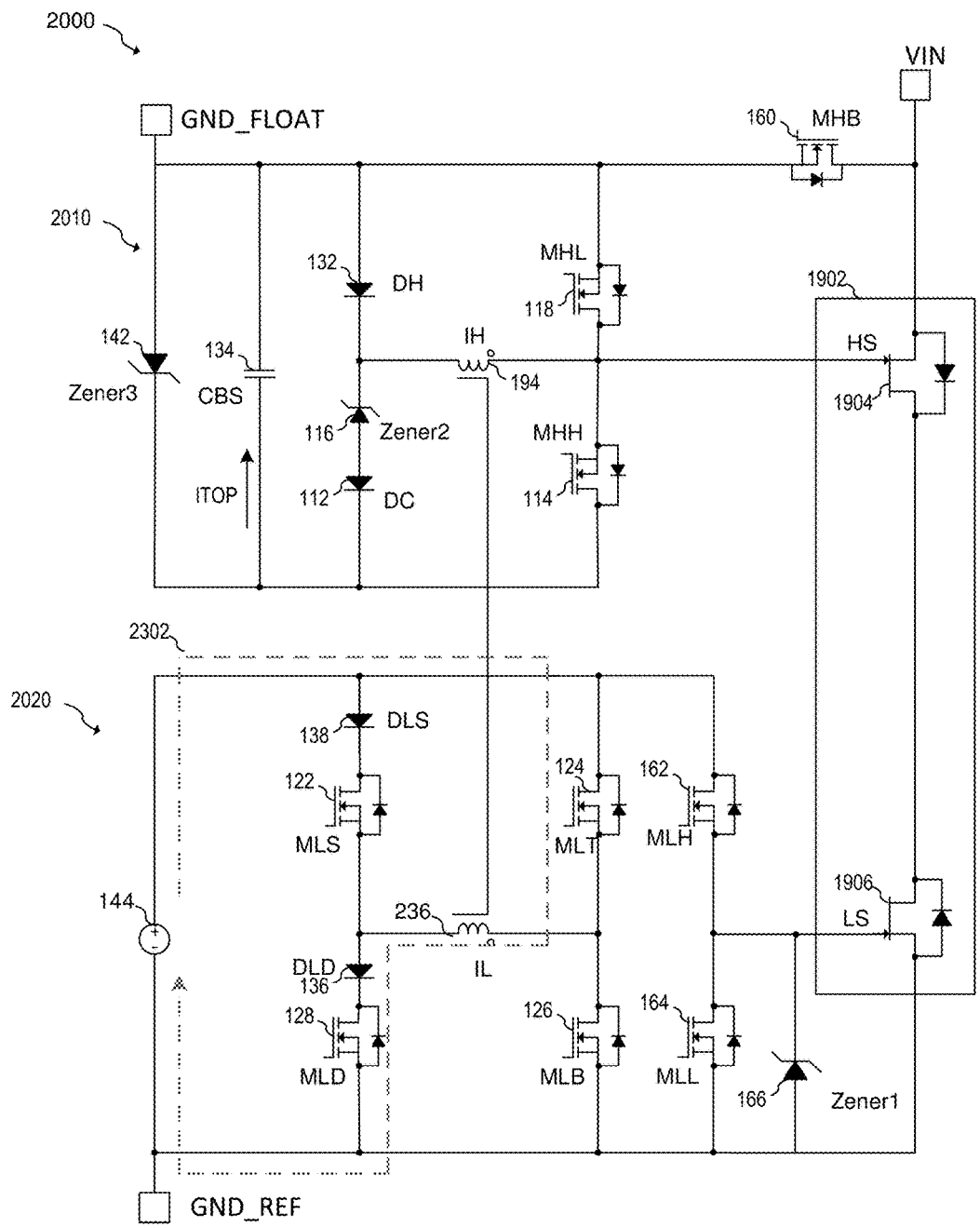
FIGS. 23a and 23b illustrate annotated schematics of embodiment switch driving circuit.
Figure 23B:
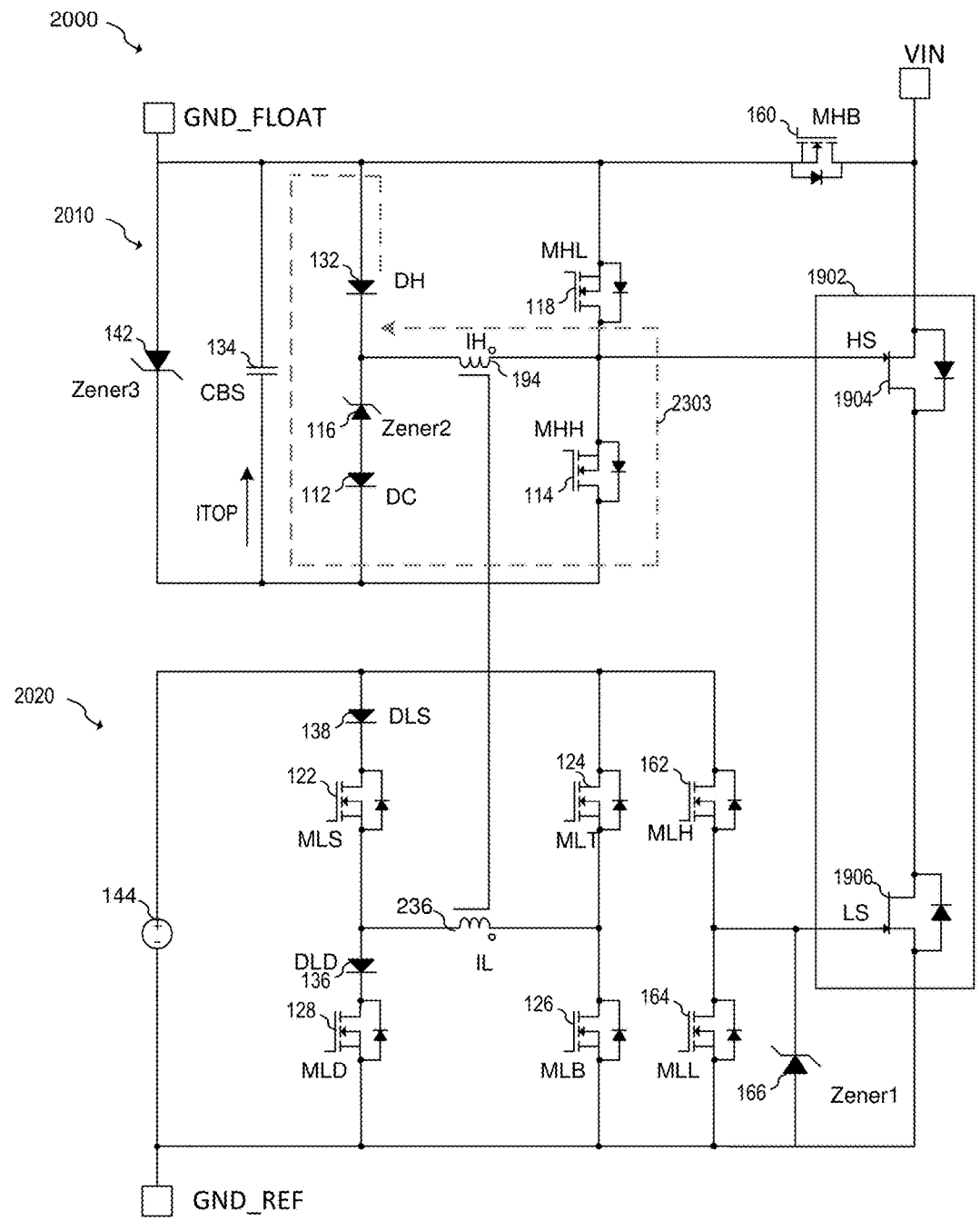
Figure 23C:
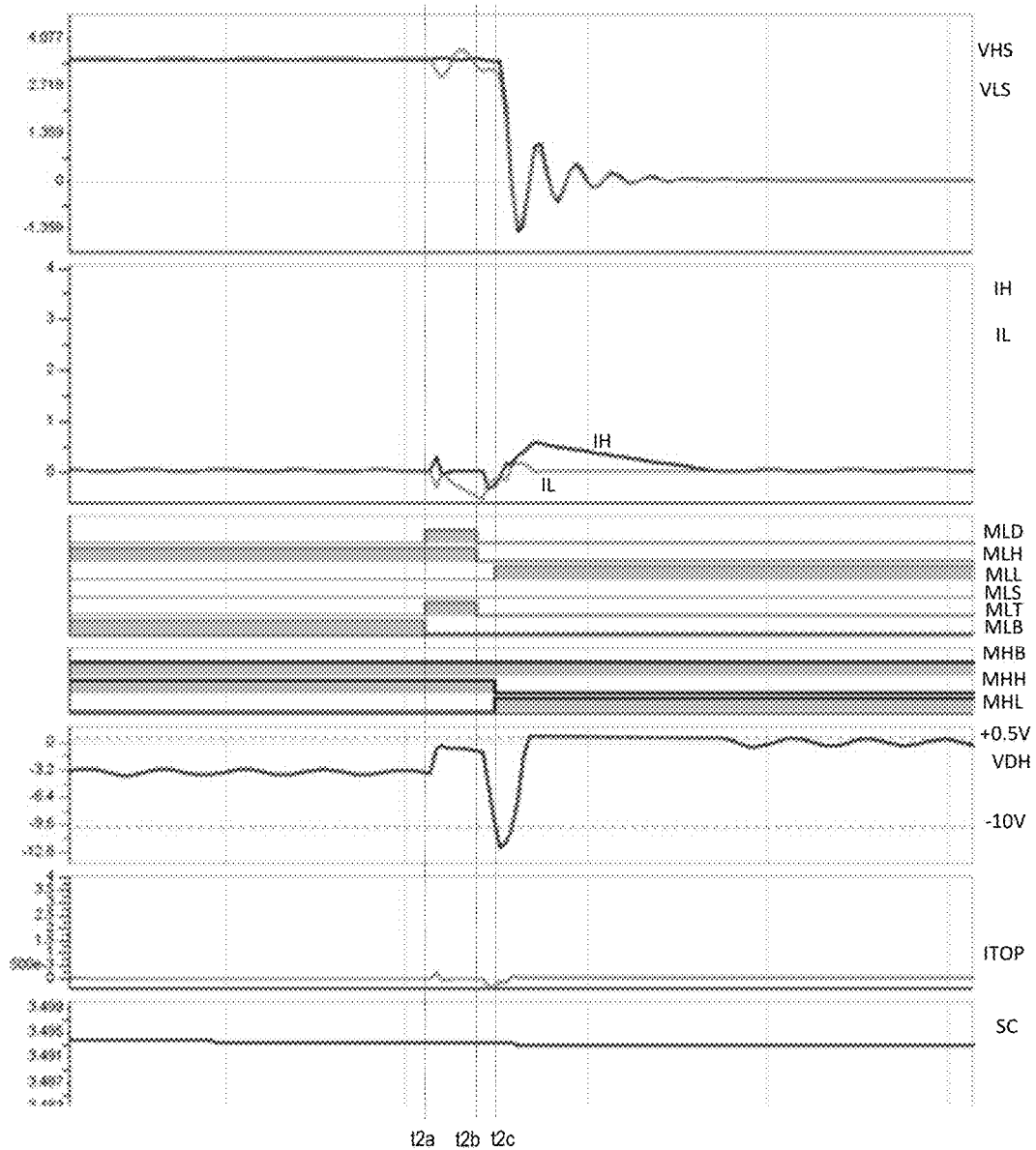
FIG. 23c illustrates a waveform diagram of an embodiment switch driving circuit.

FIGS. 23a and 23b illustrate annotated schematics that show how switching system 2000 deactivates bidirectional GaN switch 1902, and FIG. 23c illustrates an accompanying waveform diagram showing the operation of switching system 2000 when bidirectional GaN switch 1902 is deactivated.

Turning to FIG. 23a, a turn off sequence of bidirectional GaN switch 1902 is initiated when transistors 124 and 128 are activated via control signals MLT and MLD to form current loop 2302. During this time, inductor 236 is magnetized from energy provided by voltage source 144 as current flows through transistor 124, diode 136 and transistor 128. The turning on of transistors 124 and 128 corresponds to time t2a in the waveform diagram of FIG. 23c. As shown, the current IL through the inductor 236 increases linearly with time in the negative direction as control signals MLT and MLD are asserted. Because current is introduced to inductor 236 in the opposite direction as during the turn on sequence shown in FIG. 22a, the polarity of the current through inductor 236 is reversed with respect to its polarity during the turn on sequence.

At time t2b, control signals MLT and MLD are de-asserted, thereby turning off transistors 124 and 128. Current loop 2303 is formed during a short dead zone period to achieve the large negative voltage across diode DH. Once this negative voltage across diode DH is detected, MHH is switched off and MHL is turned on to switch off transistor 1904 of bidirectional GaN switch 1902 as shown in FIG. 23b. Transistor 1906 of bidirectional GaN switch 1902 is turned off at the same by turning on transistor 164 via control signal MLL and turning off transistor 162 via control signal MLH.

Figure 24A:
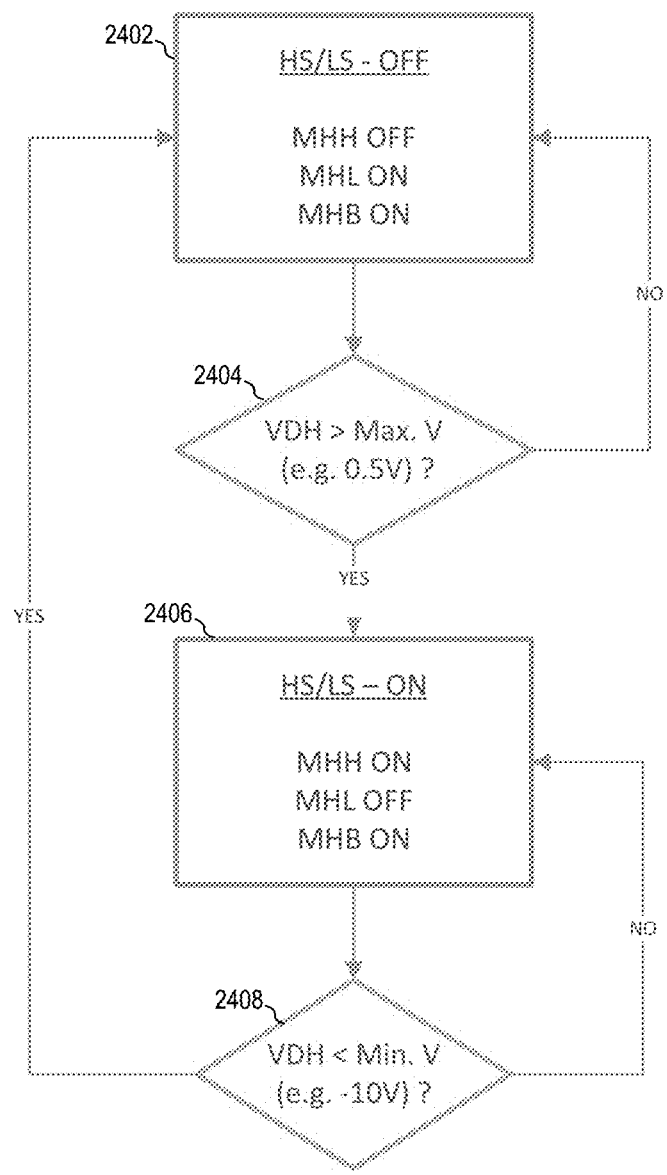
FIGS. 24a and 24b illustrate flowcharts describing the operation of an embodiment controller.

FIG. 24a illustrates a switching logic flow chart that may be used to implement the logic of the floating controller 2011 shown in FIG. 20. In step 2402, the floating transistor 1904 is turned off by asserting control signals MHL and MHB, which turn on transistors 118 and 160, and de-asserting control signal MHH, which turns off transistor 114. In step 2404, comparator CMP of the floating controller 2011 compares the voltage VDH across diode 132 with a first threshold Max V of about 0.5 V. Alternatively, other threshold voltages may be used depending on the particular system and its specifications. Once voltage VDH across diode 132 exceeds threshold Max V, the floating transistor 1904 is turned on in step 2406, during which control signals MHH and MHB are asserted to turn on transistors 114 and 160 and control signal MHL is de-asserted to turn off transistor 118.

In step 2408, comparator CMP of the floating controller 2011 compares the voltage VDH across diode 132 with a second threshold Min V of about −10 V. Alternatively, other threshold voltages may be used depending on the particular system and its specifications. Once voltage VDH across diode 132 is less than threshold Min V, the floating transistor 1904 is turned off in step 2402 as described above. It should be understood that the flow diagram of FIG. 24a may be implemented using digital logic techniques known in the art. For example, in some embodiments, flow diagram may be implemented using a controller such as a microcontroller or by using custom logic or standard cell logic.

Figure 24B:
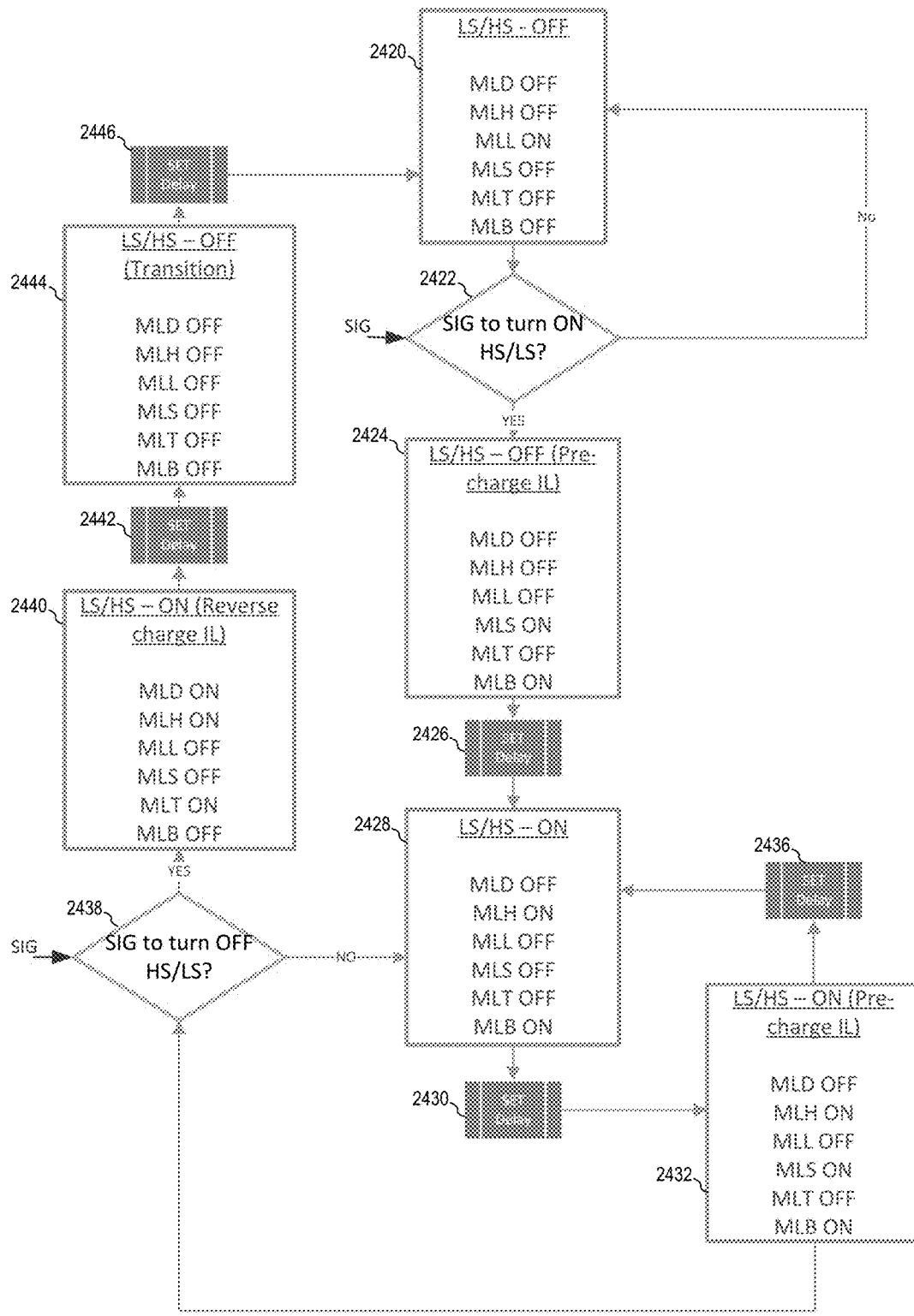

FIG. 24b illustrates a switching logic flow chart that may be used to implement the logic of the ground referenced controller 2021 shown in FIG. 20. In step 2420, the ground referenced transistor 1906 is shut off by asserting control signal MLL that turns on transistor 164 and de-asserting control signals MLD, MLH, MLS, MLT and MLB that turns off transistors 128, 162, 122, 124 and 126, respectively. In step 2422 input voltage signal SIG is monitored to determine whether there is a command present to turn on bidirectional GaN switch 1902. If SIG is active, inductor 236 is magnetized by activating transistor 122 via control signal MLS and activating transistor 126 via MLB in step 2424. Remaining control signals MLD, MLH, MLL and MLT are de-asserted, thereby turning off or keeping off transistors 128, 162, 164 and 124, respectively. After a set delay in step 2426, the ground referenced transistor 1906 and the floating transistor 1904 are turned on in step 2428. During step 2428, transistors 162 and 126 are turned on by asserting control signals MLH and MLB, and transistors 128, 164, 122 and 124 are turned off by de-asserting control signals MLD, MLL, MLS and MLT.

During step 2438, input signal SIG is monitored to determine whether or not there is a request to turn off bidirectional GaN switch 1902. If the state of SIG has not changed after a set delay of step 2430, capacitor 134 is topped up in step 2432, during which, transistors 162, 122 and 126 are turned on by asserting control signals MLH, MLS and MLB, and transistors 128, 164 and 124 are turn off by de-asserting control signals MLD, MLL and MLT. After a set delay of step 2436, control is passed again to step 2428 in which bidirectional GaN switch 1902 remains on.

When step 2438 determines that the state of SIG has changed to indicate the bidirectional GaN switch 1902 is to be turned off, the inductor 236 is magnetized in the reverse direction in step 2440. During step 2440, transistors 128, 162 and 124 are turned on by asserting control signals MLD, MLH and MLT, and transistors 164, 122 and 124 are turned off by de-asserting control signals MLL, MLS and MLB. After a set delay in step 2442 transistors 128, 162, 164, 122, 124 and 126 are shut off by de-asserting control signals MLD, MLH, MLL, MLS, MLT and MLB in step 2444. These transistors are turned off to transfer the energy from IL to IH to signal the floating side to switch off MHH and turn on MHL. After a further set delay in step 2446, the floating transistor 1904 and the ground referenced transistor 1906 of bidirectional GaN switch 1902 are turned off via step 2420 described above.

The set delays in steps 2426, 2430, 2436, 2442 and 2446 are used to set times for transferring energy or for setting a constant time period between "topping up" floating capacitors. In various embodiments these delays may be between about a few nanoseconds and a few hundreds of nanoseconds; however, delays outside of these ranges may also be used depending on the specific embodiment and its specifications.

Figure 25A:
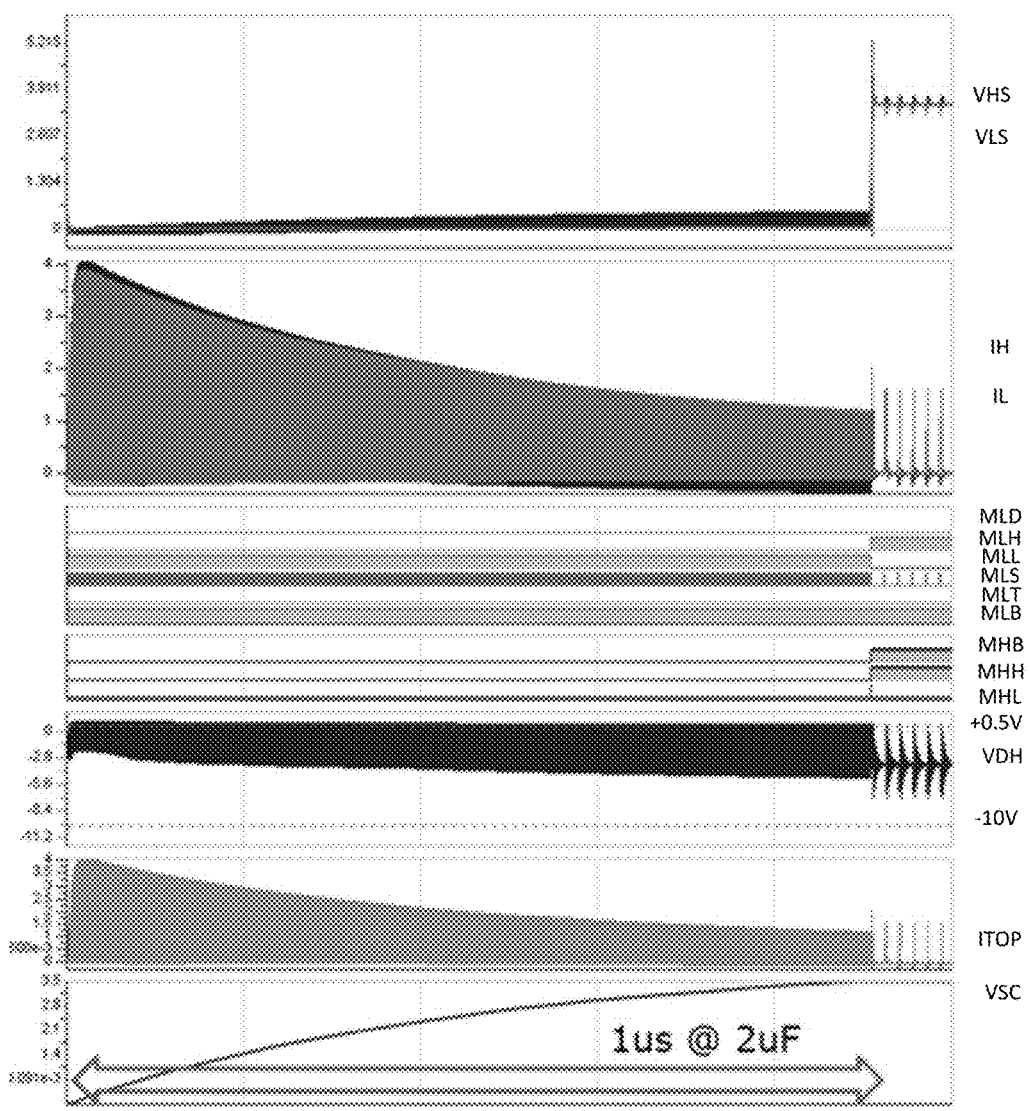
FIG. 25a illustrate a waveform diagram of a start-up sequence for an embodiment switch driving circuit and FIGS. 25b and 25c illustrate flowcharts describing the start-up sequence of the embodiment switch driver circuit.
Figure 25B:
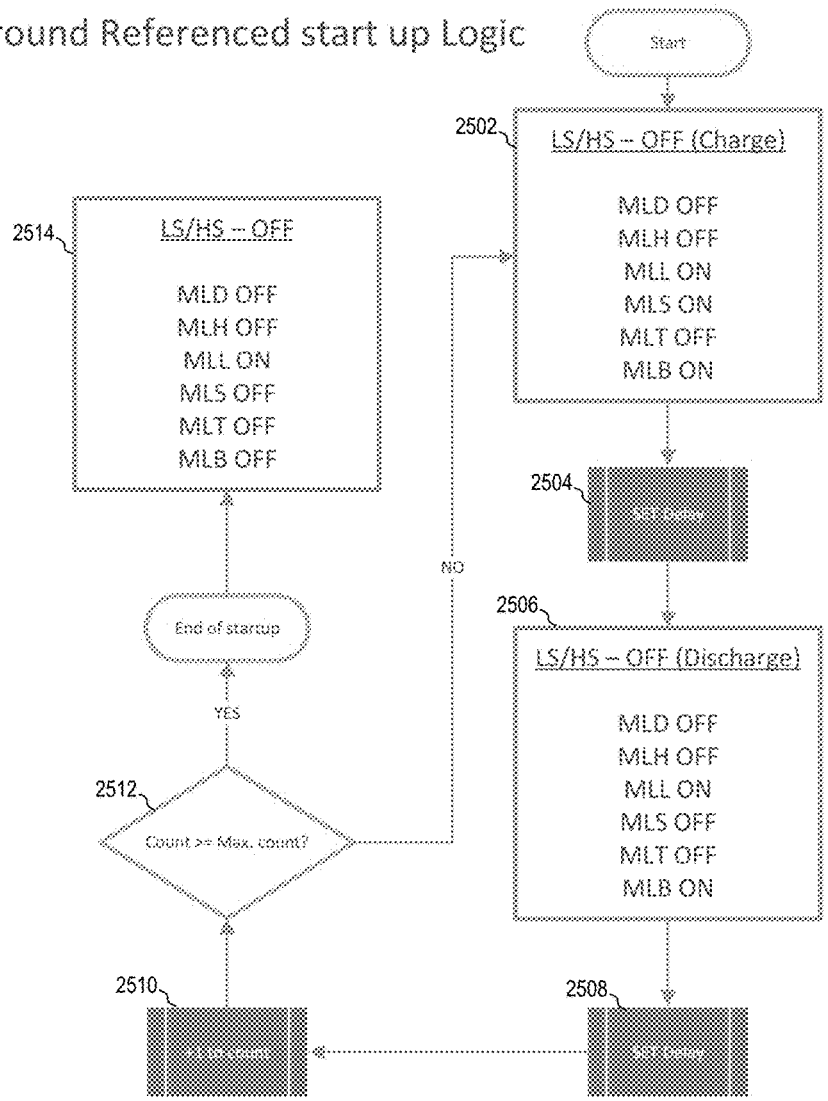
Figure 25C:
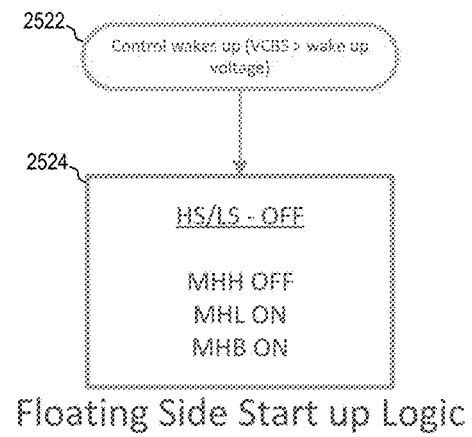

FIG. 25a illustrates a waveform diagram showing a start-up sequence of switching system 2000. FIGS. 25b and 25c illustrate flowcharts of a start-up sequence that may be used by the logic of the floating controller 2011 and the ground referenced controller 2021 shown in FIG. 20. As shown in FIG. 25a, the gate drive voltage VHS of the floating transistor 1904 and the gate drive voltage VLS of the ground referenced transistor 1906 remain low during a first portion of the start-up sequence. In the illustrated embodiment, this first portion of the start-up sequence is about 1 μs assuming a value of 2 μF for the floating capacitor 134. In alternative embodiments, the first portion of the start-sequence may be less than or greater than 1 μs depending on the particular embodiments, its specification, and the size of the floating capacitor 134. During this first portion of the start-up sequence, transistor 122 is turned on and off by pulsing control signal MLS. Pulsing control signal MLS causes the inductor 236 to be successively magnetized, and causes energy to be transferred from the inductor 236 to the inductor 194 via magnetic coupling between the inductors. As a result, capacitor 134 charges, which causes voltage VSC across capacitor 134 to steadily increase while control signal MLS is being pulsed. In some embodiments, the start-up sequence ends after voltage VSC across the floating capacitor 134 exceeds a wake up voltage. In some embodiments, this wake up voltage may be between about 3.5V and about 15V. Alternatively, other voltages may be used depending on the particular system and its specifications.

FIG. 25b illustrates a switching logic flowchart that may be used to implement the logic of the ground referenced controller 2021 shown in FIG. 20 with respect to the start-up sequence of FIG. 25a. The flowchart of FIG. 25 starts at step 2502 in which the inductor 236 is magnetized by turning on transistors 126 and 122 by activating control signals MLB and MLS, and the ground referenced transistor 1906 is shut off by shorting its gate to ground by activating transistor 164 via control signal MLL. Remaining transistors 128, 162 and 124 are shut off by de-asserting control signals MLD, MLH and MLT. After a set delay in step 2504, transistor 122 is shut off by de-asserting control signal MLS. The remaining transistors 124, 126, 128, 162 and 164 in the ground referenced driver 2020 maintain the same state as during step 2502. After a set delay in step 2508, a counter is incremented in step 2510, and the value of the counter is compared with a value Max.count in step 2512. In one example, Max.count is set to about 1000 Alternatively other values for Max.count may be used depending on the particular system and its specifications. If the counter value does not exceed Max.count, inductor 236 is once again magnetized by repeating steps 2502, 2504, 2506, 2508 and 2510. When the counter value exceeds Max.count in step 2512, the start-up phase is terminated and the bidirectional GaN switch is placed in an OFF state by activating transistor 164 via control signal MLL and turning off the remaining transistors in the ground referenced drive 2020 by deactivating remaining transistors 122, 124, 126, 128 and 162 in step 2514. In alternative embodiments, other conditions may be used to terminate the start-up sequence. For example, in one embodiment, the start-up sequence is terminated when the voltage across the floating capacitor exceeds a predetermined voltage FIG. 25c illustrates a switching logic flow chart that may be used to implement the logic of the floating controller 2011 shown in FIG. 20 with respect to the start-up sequence illustrated in the waveform diagram of FIG. 25a. In step 2522, a determination is made to power up controller 2011 when voltage VCBS across the floating capacitor 134 exceeds a predetermined wakeup voltage. In one example, the predetermined wake up voltage is about 3.5 V. Alternatively, other wake up voltage values may be used depending on the particular system and is specifications. In step 2524, the floating gate driver 2010 is initialized such that the floating transistor 1904 is in the off state. Control signal MHH is de-asserted to turn off transistor 114 and control signals MHL and MHB are asserted to turn on transistors 118 and 160, which coupled the gate of the floating transistor 1904 to its source.

In the embodiment of FIG. 20, the ground referenced gate driver 2020 is referenced to ground and the floating gate driver 2010 is referenced to a floating ground. However, in some embodiments, both the floating gate driver and the ground referenced gate driver may be independently referenced to their own floating power supplies, such as the embodiment described below with respect to FIG. 31 that includes two control full bridges. In such embodiments, bidirectional switch 1902 may be used in systems in which one or both terminals of switch 1902 is floating and/or non-ground referenced.

Figure 26A:
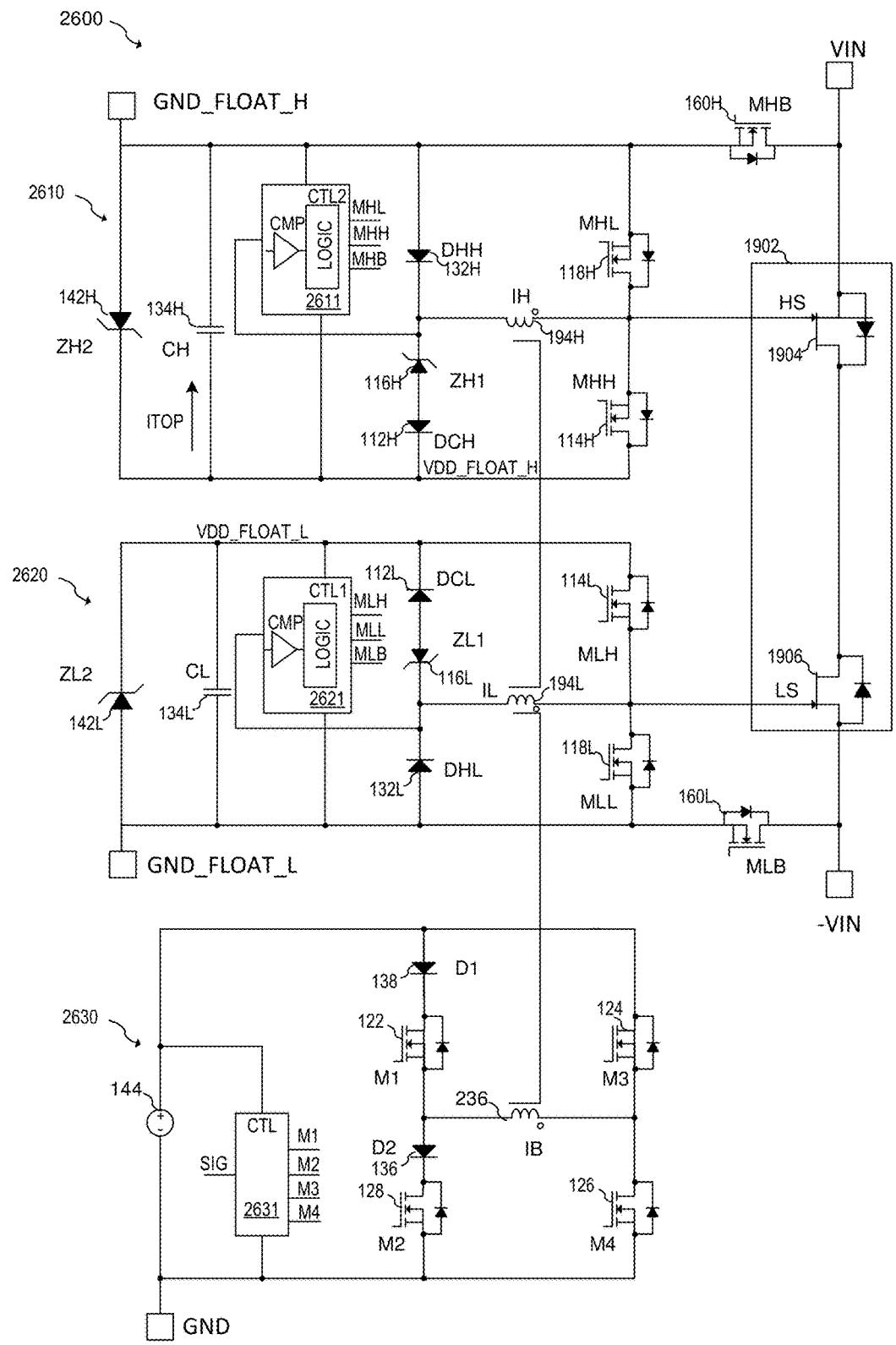
FIG. 26a illustrates a schematic of a further embodiment bidirectional switch driver circuit.

FIG. 26a illustrates switching system 2600 according to such an embodiment of the present invention in which the floating gate driver circuit 2610 for the floating transistor 1904, as well as another floating gate driver circuit 2620 for the floating transistor 1906. Accordingly, bidirectional switch 1902 may be used in systems in which neither terminals VIN and −VIN are connected and/or referenced to ground.

As shown, both the floating gate drivers 2610 and 2620 include circuits that are similar to the floating gate driver circuit 2010 shown in FIG. 20 and described above. In some embodiments, the floating gate drivers 2610 and 2620 may be implemented using symmetric and/or identical circuitry. Each of the floating gate drivers 2610 and the ground 2620 are referenced to their own individual floating power supplies, with the floating gate driver 2610 referenced to a floating power supply between nodes VDD_FLOAT_H and GND_FLOAT_H, and the gate driver circuit 2620 referenced to a floating power supply between nodes VDD_FLOAT_L and GND_FLOAT_L. Moreover, each floating gate drivers 2610 and 2620 receive energy and signaling via magnetic coupling from ground side circuit 2630. In the illustrated embodiment, inductor 194H in the floating gate driver 2610 and inductor 194L in floating the gate driver circuit 2620 are magnetically coupled to inductor 236 in ground referenced circuit 2630. Each floating driver 2610 and 2620 has a respective control circuit 2611 and 2621 that may be implemented, for example, using controller 2011 of FIG. 20 described above. Also, the operation of the floating gate driver circuits 2610 and 2620 proceeds in a similar fashion to the floating gate driver circuit 2010 of FIG. 20 described above.

During operation, when turning on bidirectional GaN switch 1902, controller 2631 of ground side circuit 2630 magnetizes inductor 236 in a first direction by activating transistors 122 and 126 via control signals M1 and M4. Energy is transferred from inductor 236 to inductor 194H of the floating gate driver circuit 2610 and to inductor 194L of the floating gate driver circuit 2620 via magnetic coupling. Controller 2611 of the floating gate driver 2610 and controller 2621 of the floating gate driver circuit 2620 each sense when the voltage across respective diodes 132H and 132L exceed a first predetermined threshold. In some embodiments this first predetermined threshold is about 0.5 V; however, other voltages may be used in alternative embodiments. Once this condition is sensed, the floating controller 2611 of the floating gate driver circuit 2610 deactivates transistor 118H via control signal MHL and activates transistor 114H via control signal MHH in order to pull the gate of the floating transistor 1904 to floating power supply node VDD_FLOAT_H. Similarly, the floating controller 2621 of the floating gate driver circuit 2620 deactivates transistor 118L via control signal MLL activates transistor 114L via control signal MLH in order to pull the gate of the transistor 1906 to floating power supply node VDD_FLOAT_L.

When turning off bidirectional GaN switch 1902, controller 2631 of ground side circuit 2630 magnetizes inductor 236 in a second direction by activating transistors 128 and 124 via control signals M2 and M3. Energy is transferred from inductor 236 to inductor 194H of the floating gate driver circuit 2610 and to inductor 194L of the floating gate driver circuit 2620 via magnetic coupling. Controller 2611 of the floating gate driver circuit 2610 and controller 2621 of the floating gate driver circuit 2620 each sense when the voltage across respective diodes 132H and 132L is less than a second predetermined threshold. In some embodiments this second predetermined threshold is about −10 V; however, other voltages may be used in alternative embodiments. Once this condition is sensed, the floating controller 2611 of the floating gate driver circuit 2610 deactivates transistor 114H via control signal MHH and activates transistor 118H via control signal MHL in order to pull the gate of the floating transistor 1904 to floating ground reference GND_FLOAT_H. Similarly, the controller 2621 of the gate driver circuit 2620 deactivates transistor 114L via control signal MLH and activates transistor 118L via control signal MLL in order to pull the gate of the transistor 1906 to floating ground reference GND_FLOAT_L. Transistors 160H and 160L controlled by control signals MHB and MLB remain on during normal operation, but may be turned off prior to starting up the circuit.

In some embodiments, the floating gate drivers 2610, 2620 and ground side circuit 2630 may be implemented on separate integrated circuits. In some embodiments, inductors 236, 194H and 194L are implemented using a three winding transformer separate from the three integrated circuits implementing the floating gate drivers 2610, 2620 and ground side circuit 2630. Alternatively, the floating gate drivers 2610, 2620 and ground side circuit 2630 may be partitioned in a different manner, such as using discrete components. Bidirectional GaN switch may be integrated separately or along with one or more of the floating gate driver circuits 2610, 2620 and ground side circuit 2630.

Figure 26B:
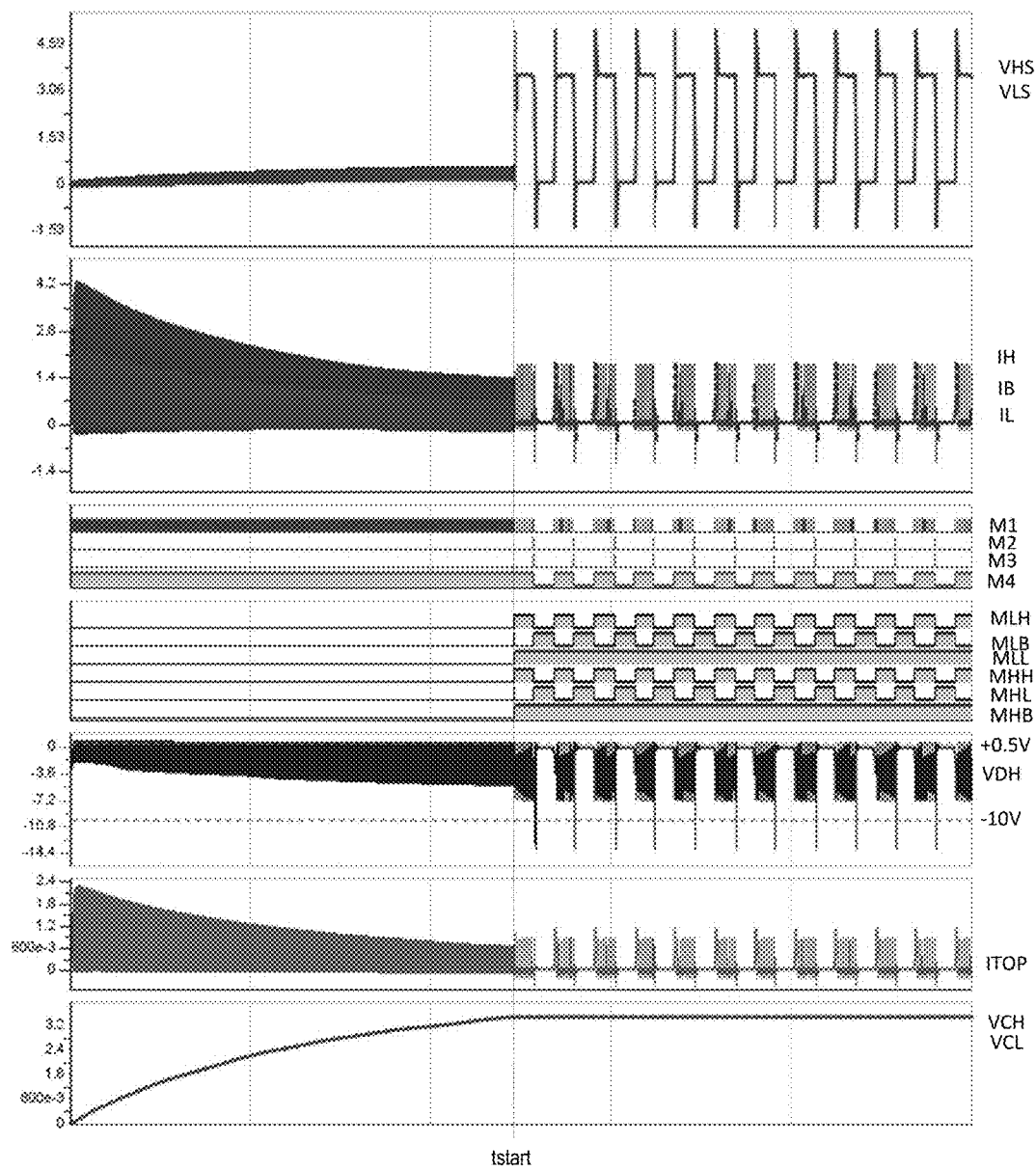
FIGS. 26b and 26c illustrate waveform diagrams of the further embodiments bidirectional switch driver circuit.

FIG. 26b illustrates a waveform diagram of a start-up sequence of switching system 2600. As shown, transistor 122 is repetitively pulsed via control signal M1 until time tstart. Pulsing transistor 122 repeatedly magnetizes inductor 236 and repeatedly transfers energy to the floating gate driver circuit 2610 and the gate driver 2620 in order to charge respective the floating capacitors 134H and 134L. As shown, voltage VCH, which represents the voltage across the floating capacitor 134H in the floating gate driver 2610 and voltage VCL, which represents the voltage across the floating capacitor 134L in the gate driver circuit 2620 smoothly increases as energy is transferred from ground side circuit 2630 to the floating gate driver circuit 2610 and the gate driver circuit 2620 via the magnetic coupling between inductors.

Figure 26C:
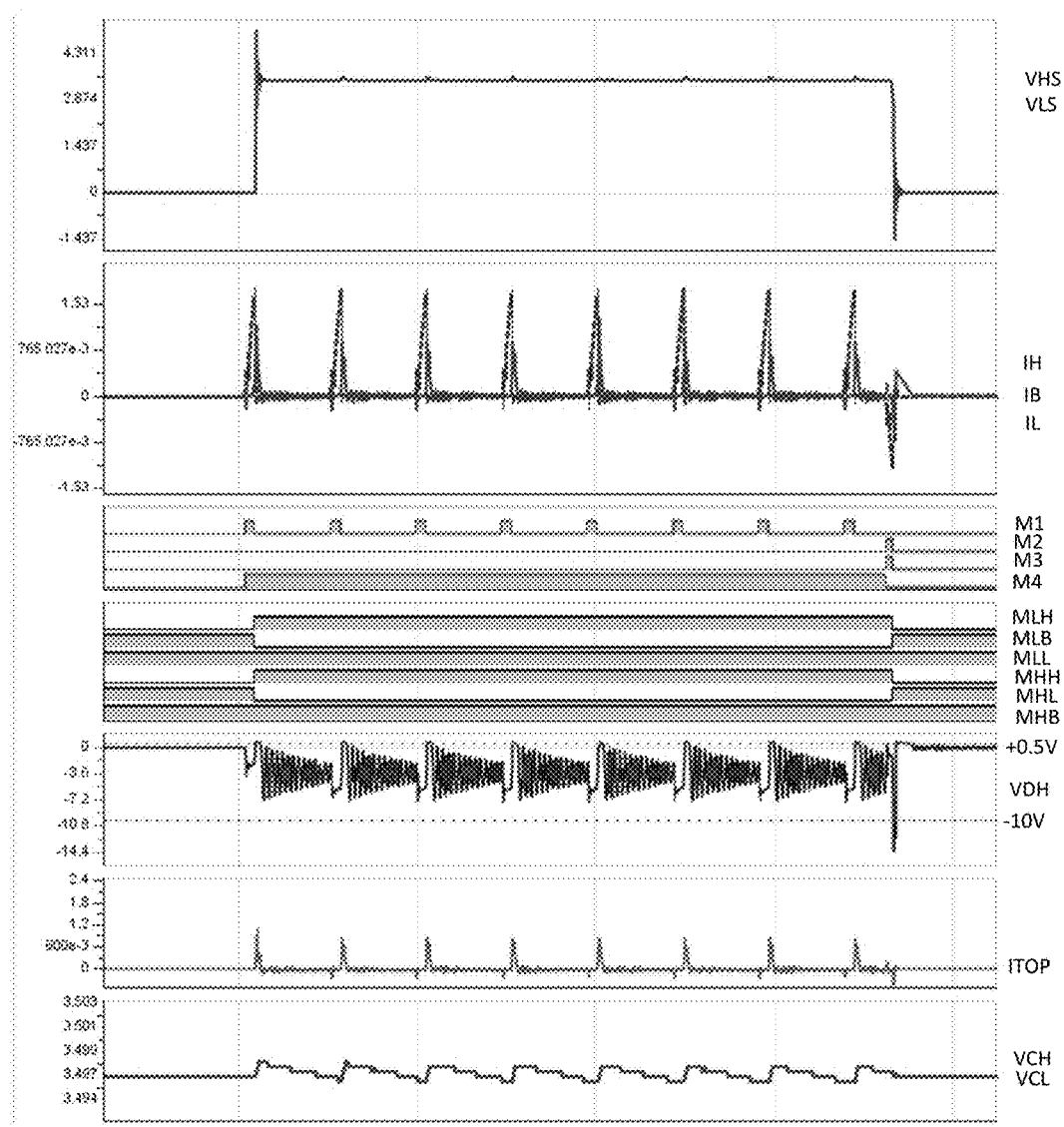

In various embodiments, energy may be periodically transferred from ground side circuit 2630 to the floating gate driver circuit 2610 and the floating gate driver circuit 2620 when bidirectional GaN switch 1902 is on, in order to top up the floating capacitors 134H and 134L and provide current to the respective gates of transistors 1904 and 1906. FIG. 26c illustrates a waveform diagram that shows various signals of switching system 2600 during such a periodic energy transfer. As shown, when gate drive voltages VHS and VLS are asserted, transistor 122 is periodically pulsed via control signal M1. This periodic pulsing of control signal M1 causes a corresponding current ITOP that represents the current in the floating capacitor 134H. A similar current (not shown) also charges the floating capacitor 134L.

In various embodiments, the switching logic of controllers 2611 and 2621 shown in FIG. 26a may be implemented using the floating switching logic described in FIG. 24a hereinabove and the floating startup logic described in FIG. 25c hereinabove. For floating controller 2621, control signal MLH operates according to control signal MHH, control signal MLL operates according to control signal MHL and control signal MLB operates according to control signal MHB according to the block diagrams of FIGS. 24a and 25c.

Figure 27A:
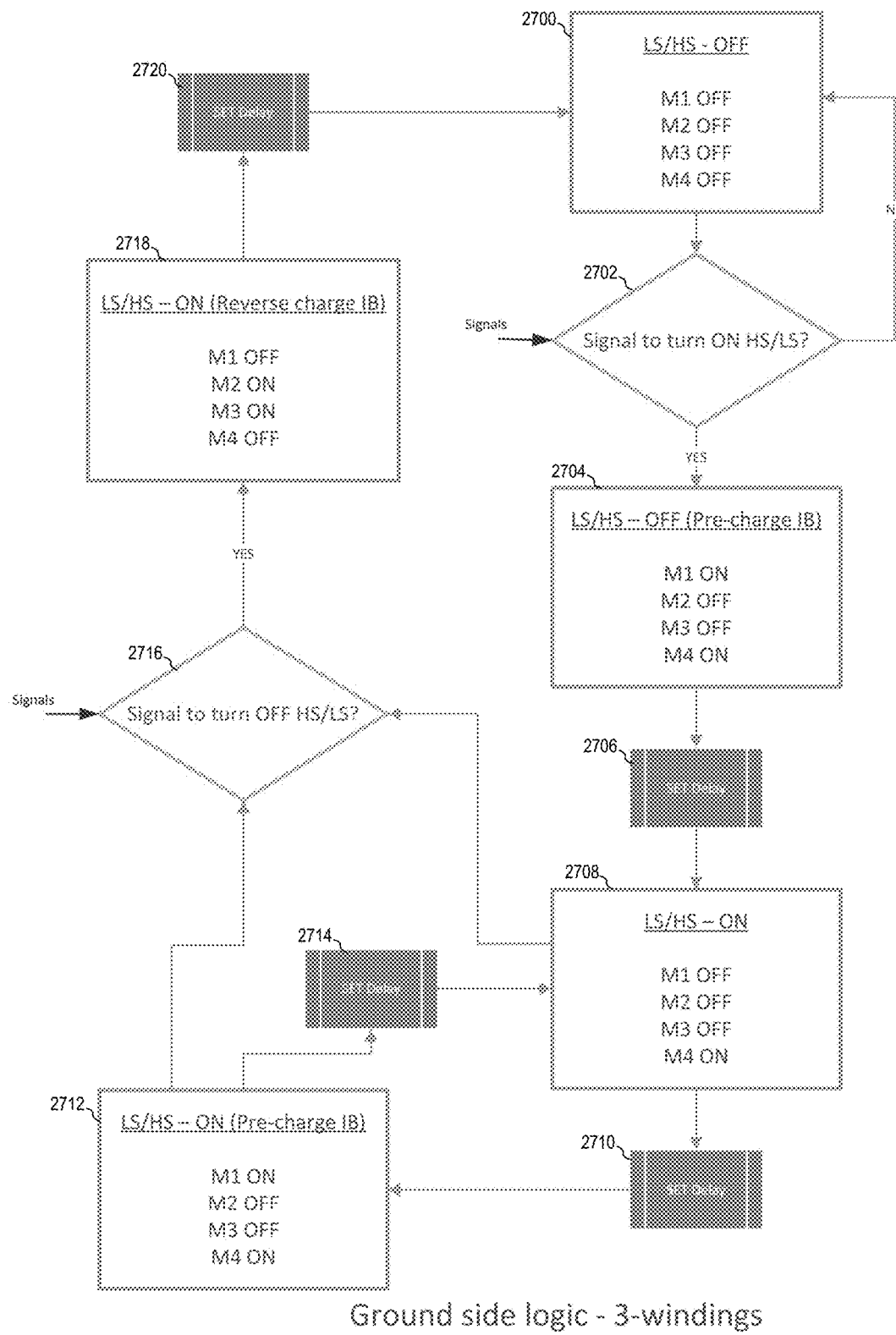
FIGS. 27a and 27b illustrate flowcharts describing the operation of embodiment controllers for the further embodiment bidirectional switch driver circuit.

FIG. 27a illustrates a switching logic flow chart that may be used to implement controller 2631 logic of ground side circuit 2630 shown in FIG. 26a. In step 2700, all control signals M1, M2, M3 and M4 that control transistors 122, 128, 124 and 126, respectively are de-asserted to shut these transistors off. In step 2702 input signal SIG is monitored to determine whether there is a command present to turn on bidirectional GaN switch 1902. If input signal SIG is active, inductor 236 is magnetized by activating transistor 122 via control signal M1 and activating transistor 126 via control signal M4 in step 2704 and control signals M2 and M3 are de-asserted to turn off or keep off transistors 128 and 124, respectively. After a set delay in step 2706, transistor 122 is turned off by de-asserting control signal M1 while transistors 124 and 128 remain off and transistor 126 remains on in step 2708.

After a further set delay in step 2710, transistor 122 is again turned on by asserting control signal M1 while transistors 124 and 128 remain off and transistor 126 remains on in step 2712. During step 2716, input signal SIG is monitored to determine whether or not there is a request to turn off bidirectional GaN switch 1902. If the state of SIG has not changed after a set delay of block 2710, the floating capacitors 134H and 134L are effectively topped up by repeating steps 2708, 2710 and 2712 after a set delay in step 2714 while bidirectional GaN switch 1902 remains on.

When step 2716 determines that the state of input signal SIG has changed to indicate the bidirectional GaN switch 1902 is to be turned off, the inductor 236 is magnetized in the reverse direction in step 2718. During step 2718, transistors 128 and 124 are turned on by asserting control signals M2 and M3 and 122 and 126 are turned off by de-asserting control signals M1 and M4. After a set delay in step 2720, control is again passed to step 2700 in which transistors 122, 128, 124 and 126 are shut off by de-asserting control signals M1, M2, M3 and M4.

In various embodiments, the set delays in steps 2706, 2710, 2714 and are used to energy transferred or during "top-ups", for a constant time period between "top-ups In various embodiments these delays may be between about a few nanoseconds and about a few hundreds of nanoseconds. However, delays outside of these ranges may also be used depending on the specific embodiment and its specifications.

Figure 27B:
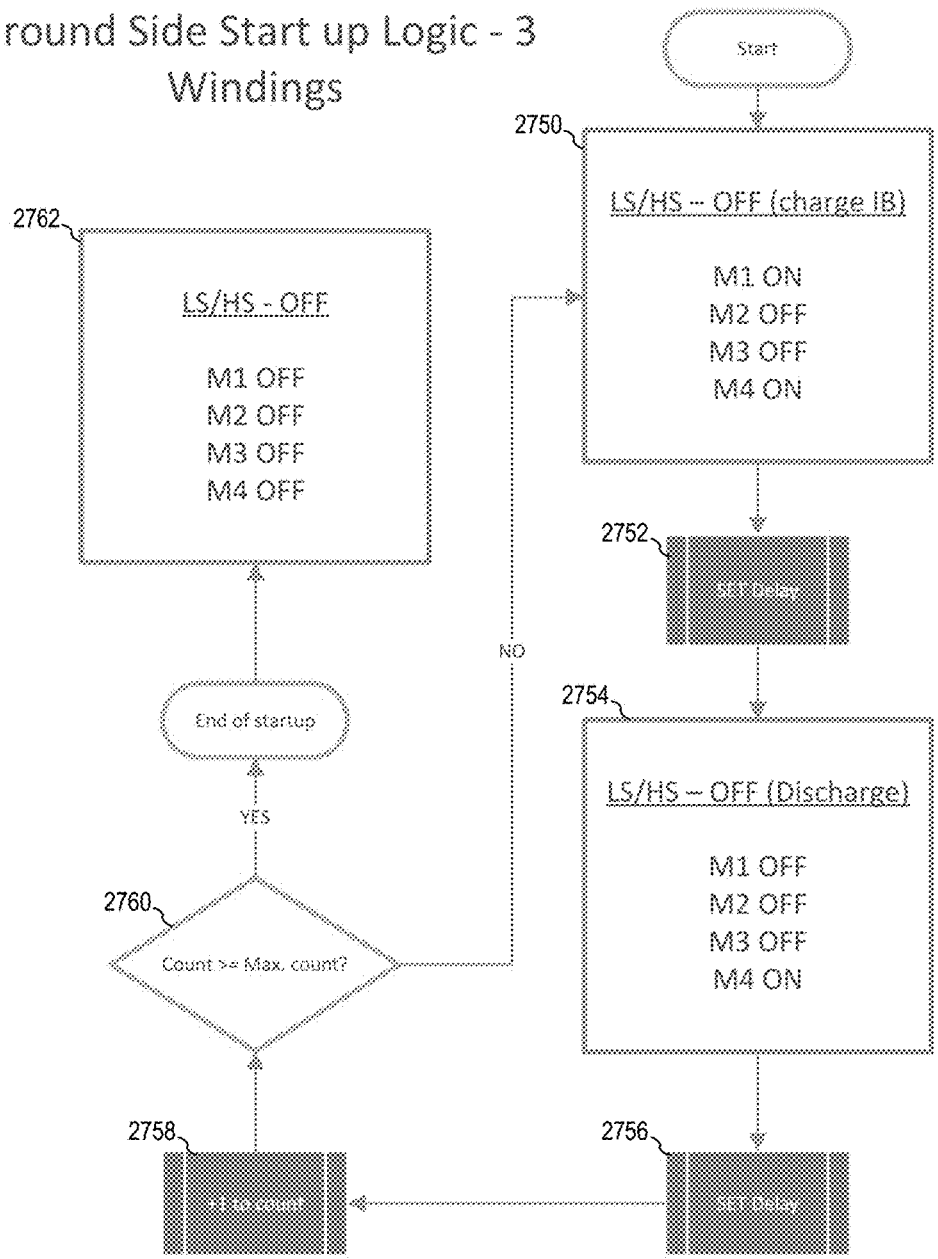

FIG. 27b illustrates a switching logic flowchart that may be used to implement the logic of ground side controller 2631 shown in FIG. 26a with respect to the start-up sequence illustrated in the waveform diagram of FIG. 26b. The flowchart of FIG. 27b starts at step 2750 in which the inductor 236 is magnetized by turning on transistors 122 and 126 by activating control signals M1 and M4. Remaining transistors 128 and 124 are shut off by de-asserting control signals M2 and M3. After a set delay in step 2752, transistor 122 is shut off by de-asserting control signal M1. The remaining transistors 124, 126 and 128 in ground side driver 2630 maintain the same state as during step 2750. After a set delay in step 2756, a counter is incremented in step 2758, and the value of the counter is compared with a value Max.count in step 2760. In one example, Max.count is set to about 1000. Alternatively other values for Max.count may be used depending on the particular system and its specifications. If the counter value does not exceed Max.count, inductor 236 is once again magnetized by repeating steps 2750, 2752, 2754, 2756 and 2758. When the counter value exceeds Max.count, the start-up phase is terminated and transistors 122, 128, 124 and 126 are turned off by deactivating control signals M1, M2, M3 and M4 in step 2762.

Figure 28A:
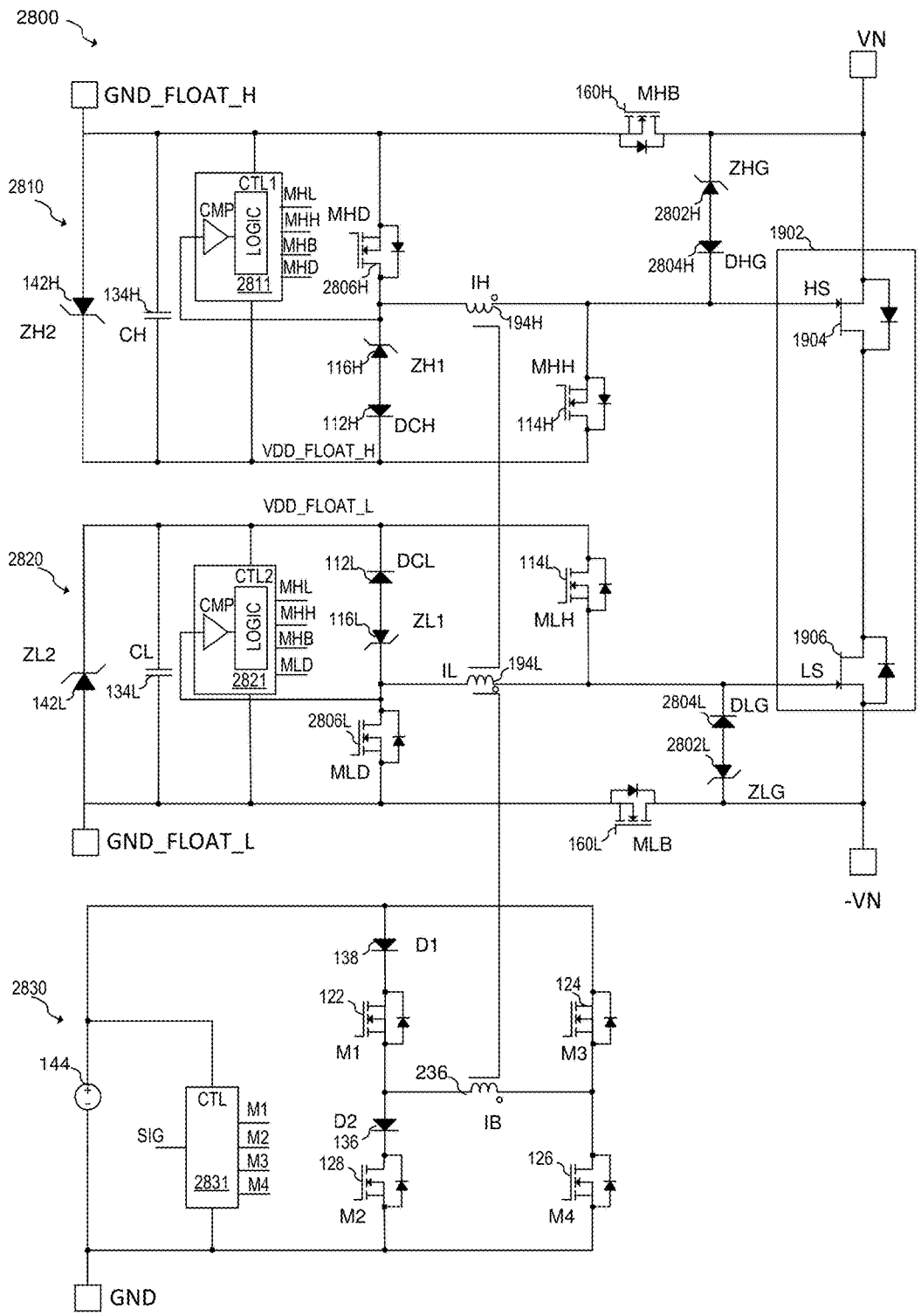
FIG. 28a illustrates a schematic of another embodiment bidirectional switch driver circuit.

In some embodiments, the floating gate driver circuit 2610 and switching system 2600 illustrated in FIG. 26a may be modified such that a negative voltage with respect to the source terminals of transistors 1904 and 1906 in bidirectional GaN switch 1902 is applied. As shown in FIG. 28a, the floating gate driver circuit 2810 is similar to the floating gate driver circuit 2610 illustrated in FIG. 26a with the exception that diode 132H is replaced by transistor 2806H controlled by control signal MHD and transistor 118H is removed. In order to prevent the gate-source voltage of transistor 1904 from becoming too high, and a series combination of diode 2804H and zener diode 2802H is coupled between the gate and source of transistor 1904. Moreover, the other floating gate driver circuit 2820 is similar to the gate driver circuit 2620 illustrated in FIG. 26a with the exception that diode 132L is replaced by transistor 2806L controlled by control signal MLD and transistor 118L is removed. In order to prevent the gate-source voltage of transistor 1906 from becoming too high, and a series combination of diode 2804L and zener diode 2802L is coupled between the gate and source of transistor 1906. Ground side circuit 2830 includes control circuit 2831, transistors 122, 124, 126 and 128 and diodes 138 and 136 and operates according to a similar principle as ground side circuit 2630 described above with respect to FIG. 26a.

In some embodiments, transistors 114H and 114L may be implemented using PMOS transistors as well as NMOS transistors.

Figure 28B:
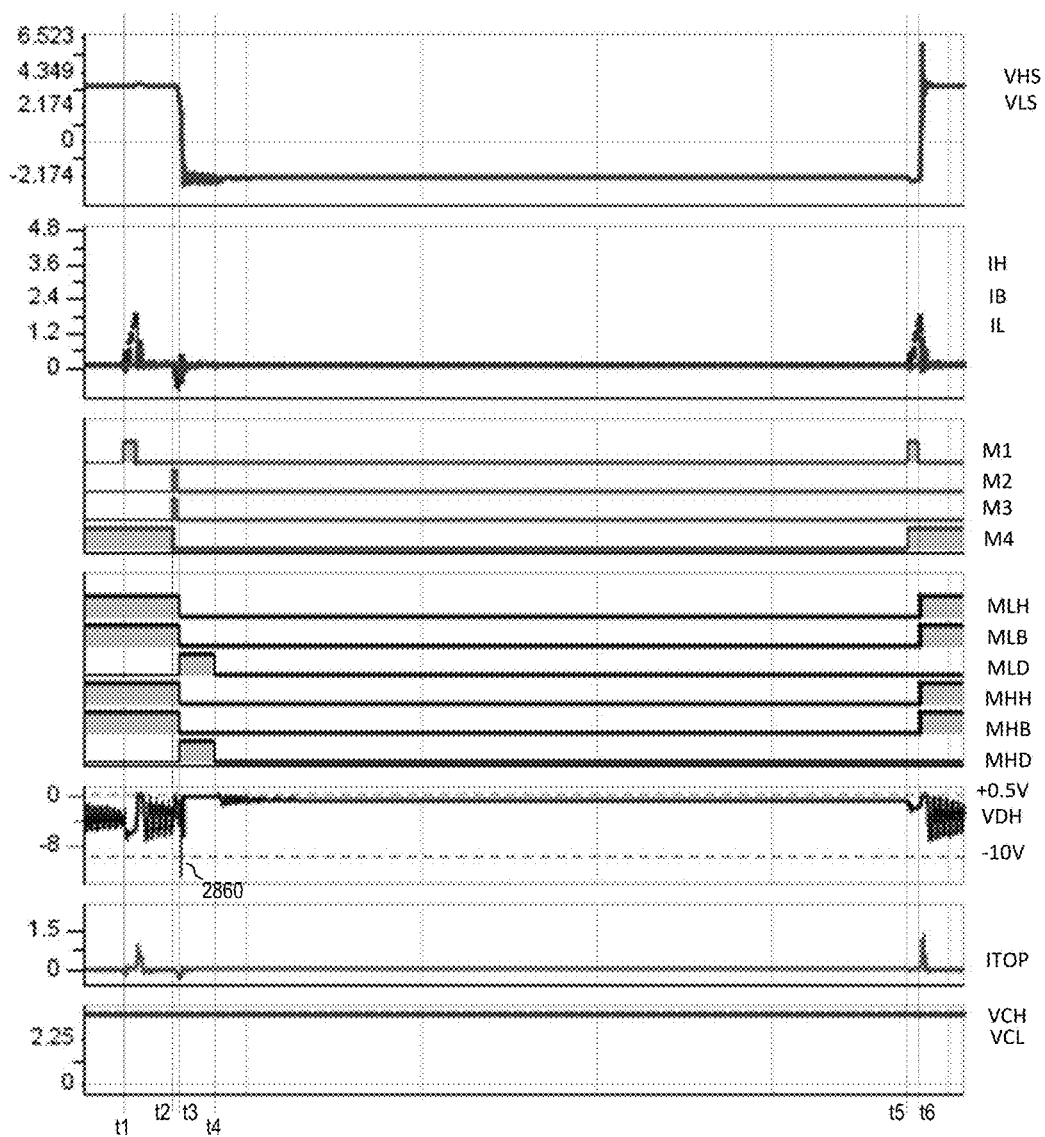
FIGS. 28b and 28c illustrate waveform diagrams of the bidirectional switch driver circuit.

FIG. 28b shows a waveform diagram that illustrates the operation of switching circuit 2800 in producing a negative gate drive voltage when bidirectional switch 1902 is shut off. At time t1, transistor 122 is turned on for a short period of time via control signal M1 in order to magnetize inductor 236 in a first direction. This is performed, for example, to top off the floating capacitors 134H and 134L when bidirectional GaN switch is on. Next, transistors 128 and 124 are turned on momentarily via control signals M2 and M3 in order to magnetize inductor 236 in a second direction that is opposite to the first direction at time t2. This magnetization of inductor 236 is sensed by the floating gate driver circuits 2810 and 2820 as a negative voltage transient 2860 across transistors 2806H and 2806L at time t3. When the floating gate driver circuits 2810 and 2820 sense transient 2860, for example by comparing the voltages across transistors 2806H and 2806L with a negative voltage threshold, transistors 2806H and 2806L which allows nodes HS and LS to be charged to a negative voltage with respect to floating ground references GND_FLOAT_H and GND_FLOAT_L. During this time, a positive current flows through transistors 2806H and 2806L and through the transistors 160H and 160L, which are already ON in the reverse direction, not through the body diode. In various embodiments, the negative voltage may be adjusted by adjusting the time during which inductor 236 is magnetized in the opposite direction.

From time t4 to time t5 when bidirectional GaN switch is off, all control signals are de-asserted to shut off their associated transistors. At time t5, control signal M1 and M4 are asserted to turn-on transistors 122 and 126 to magnetize inductor 236. Control signal M1 is then de-asserted to turn off transistor 122 at time t6. The current induced in inductors 194H and 194L is detected by the floating controllers 2811 in the floating gate driver circuit 2810 and by the floating controller 2821 in the floating gate driver circuit 2820 and transistors 114H, 114L, 160H and 160L are turned on via control signals MHH, MLH, MHB and MLB. This asserts drive voltages VHS and VLS, which turn on bidirectional GaN switch 1902 as described with respect to the embodiment of FIG. 26a described above.

Figure 28C:
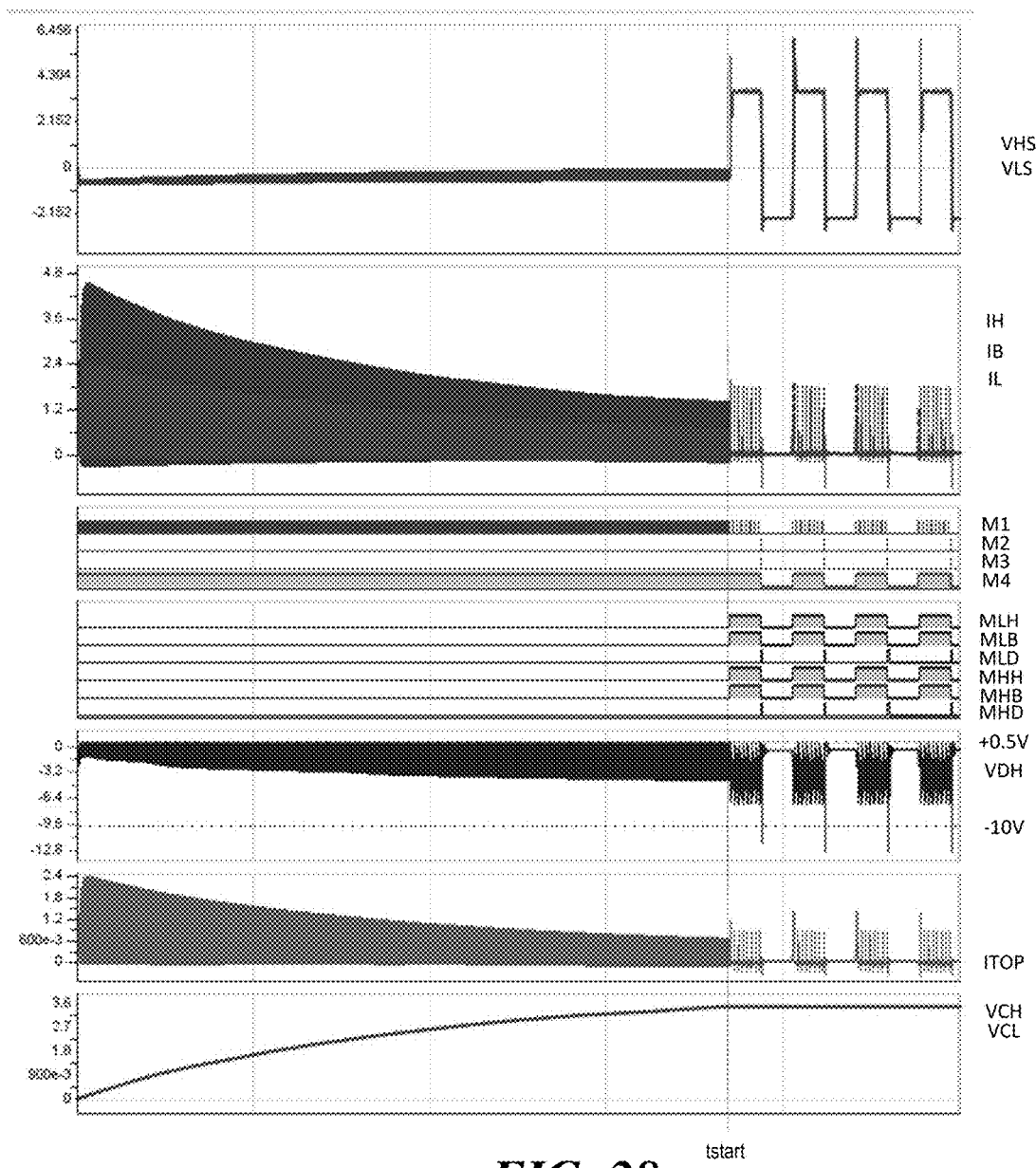

FIG. 28c illustrates a waveform diagram of a start-up sequence of switching system 2800. As shown, transistor 122 is repetitively pulsed via control signal M1 until time tstart. Pulsing transistor 122 repeatedly magnetizes inductor 236 and repeatedly transfers energy to the floating gate drivers 2810 and 2820 in order to charge respective the floating capacitors 134H and 134L. As shown, voltage VCH, which represents the voltage across the floating capacitor 134H in the floating gate driver 2810 and voltage VCL, which represents the voltage across the floating capacitor 134L in the floating gate driver 2820 smoothly increases as energy is transferred from ground side circuit 2830 to the floating gate driver circuits 2810 and 2820 via the magnetic coupling between inductors. At time tstart, normal operation of switching system 2800 proceeds as described above. In various embodiments, the logic of ground side controller 2831 has a same implementation as the logic of ground side controller 2631 illustrated in FIG. 26a and described with respect to FIG. 27a for nominal operation and with respect to FIG. 27b for startup operation.

Figure 29:
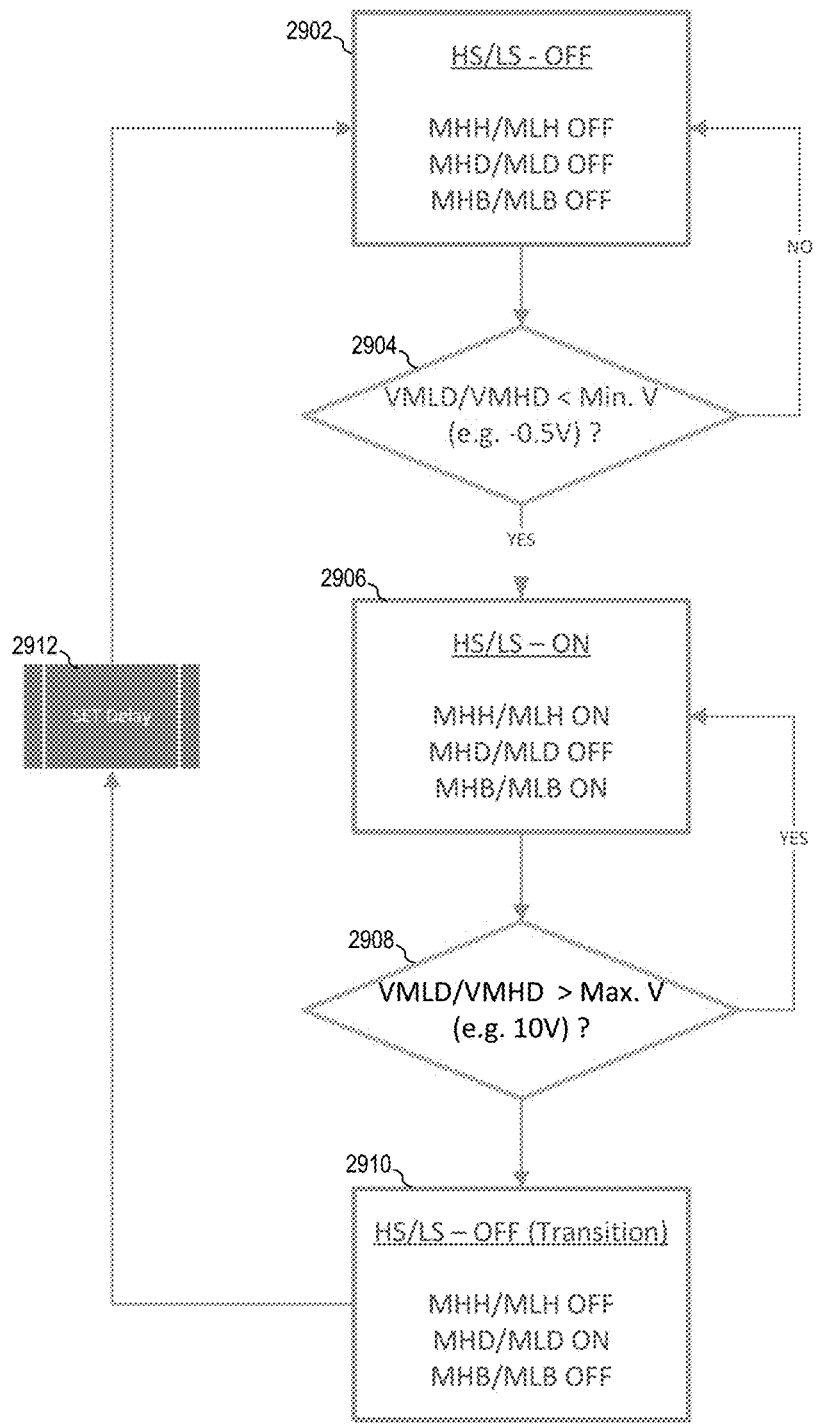
FIG. 29 illustrates a flowchart describing the operation of an embodiment controller of the bidirectional switch driver circuit.

FIG. 29 illustrates a switching logic flow chart that may be used to implement the logic of the floating controllers 2811 and 2821 in switching system 2800 illustrated in FIG. 28a. Each of floating controllers 2811 and 2821, while being separate blocks, may be implemented using the same control logic. In step 2902, the floating transistor 1904 in the off state while control signals MHH, MHD, and MHB are de-asserted, which effectively keeps transistors 114H, 2806H, and 160H off. In step 2904, comparator CMP of the floating controller 2811 compares the voltage VMHD across transistor 2806H with a first threshold Min.V of about −0.5 V. Alternatively, other threshold voltages may be used depending on the particular system and its specifications. Once voltage VMHD across transistor 2806H is less than threshold Min.V, the floating transistor 1904 is turned on in step 2906, during which control signals MHH and MHB are asserted to turn on transistors 114H and 160H and control signal MHD is de-asserted to keep transistor 2806H off. Similarly, in step 2904, comparator CMP of the controller 2821 compares the voltage VMLD across transistor 2806L with the first threshold Min.V. Once voltage VMLD across transistor 2806L is less than threshold Min.V, the transistor 1906 is turned on in step 2906, during which control signals MLH and MLB are asserted to turn on transistors 114L and 160L and control signal MLD is de-asserted to keep transistor 2806L off.

In step 2908, comparator CMP of the floating controller 2811 compares the voltage VMHD across transistor 2806H with a second threshold Max/V of about 10 V. Alternatively, other threshold voltages may be used depending on the particular system and its specifications. Once voltage VMHD across transistor 2806H is greater threshold Max.V, the floating transistor 1904 is turned off starting with step 2910. Similarly, comparator CMP of the controller 2821 compares the voltage VMLD across transistor 2806L with the second threshold Max.V. Once voltage VMLD across transistor 2806H is greater threshold Max.V, the transistor 1906 is turned off starting with step 2910.

In step 2910, control signals MHD and MLD are asserted, which turns on transistors 2806H and 2806L, and control signals MHH, MLH, MHB and MLB are de-asserted, which turns off transistors 114H, 114L, 160H and 160L. After a set delay in step 2912, control is passed back to step 2902 as described above. It should be understood that the flow diagram of FIG. 29 may be implemented using digital logic techniques known in the art. For example, in some embodiments, flow diagram may be implemented using a controller such as a microcontroller or by using custom logic or standard cell logic.

In various embodiments, bidirectional GaN switch 1902 may be operated using zero voltage switching (ZVS) concepts by sensing the voltage across and/or current through bidirectional GaN switch 1902 and closing the switch when the voltage across and/or current through bidirectional GaN switch 1902 is about zero and/or at a minimum. By applying such zero voltage switching concepts, power dissipation due to charge across bidirectional GaN switch 1902 being dissipated through bidirectional GaN switch 1902 may be reduced.

Figure 30A:
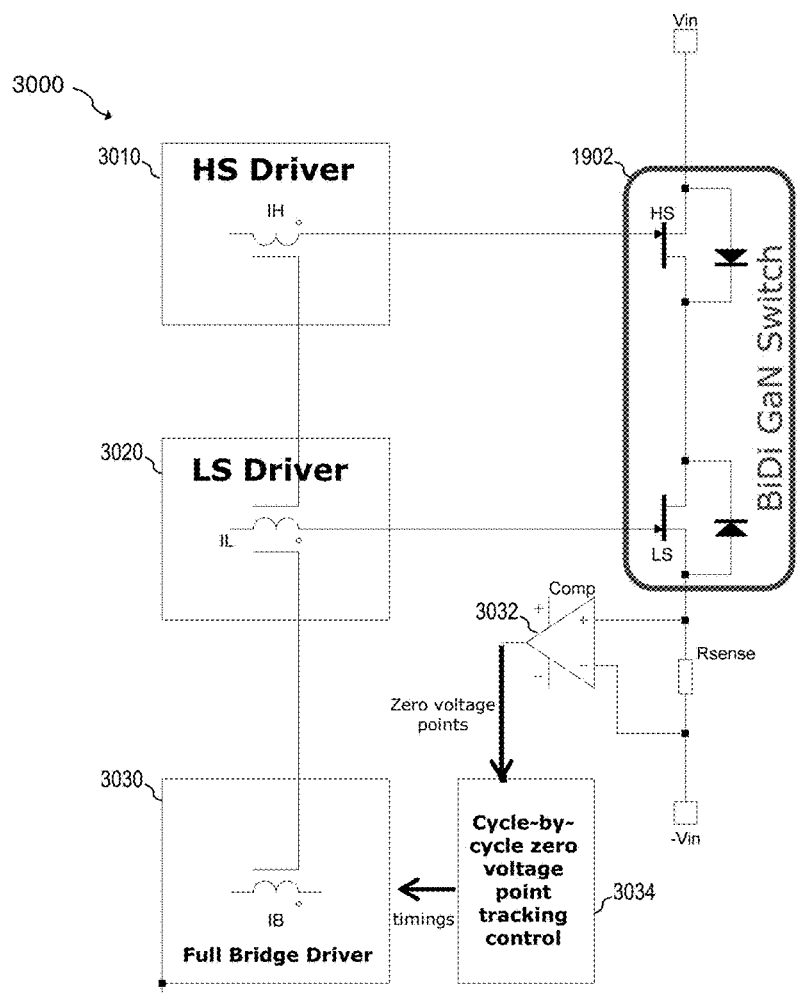
FIG. 30a illustrates a schematic of an embodiment switch driver circuit utilizing zero voltage switching.

FIG. 30a illustrates switching system 3000 that implements zero voltage switching by monitoring a current through switch 1902 and then advancing or retarding the timing of when bidirectional GaN switch 1902 relative to the switching cycle. As shown, switching system 3000 includes the floating driver 3010, the floating driver 3020 and ground referenced circuit 3030 used to provide power and timing information to the floating driver 3010, the floating driver 3020. The floating driver 3010, the floating driver 3020 and ground referenced circuit 3030 may be implemented, for example, according to embodiments described above with respect to FIGS. 26a and 28a. Alternatively, zero voltage switching concepts may be applied to other disclosed embodiments.

In accordance with an embodiment, resistor Rsense is coupled in series with bidirectional GaN switch 1902 and the voltage across resistor Rsense is measured using comparator 3032. When comparator 3032 senses that the voltage across comparator 3032 is zero, tracking control circuit 3034 adjusts the timing of when ground referenced circuit 3030 relative to the switching cycle.

Figure 30B:
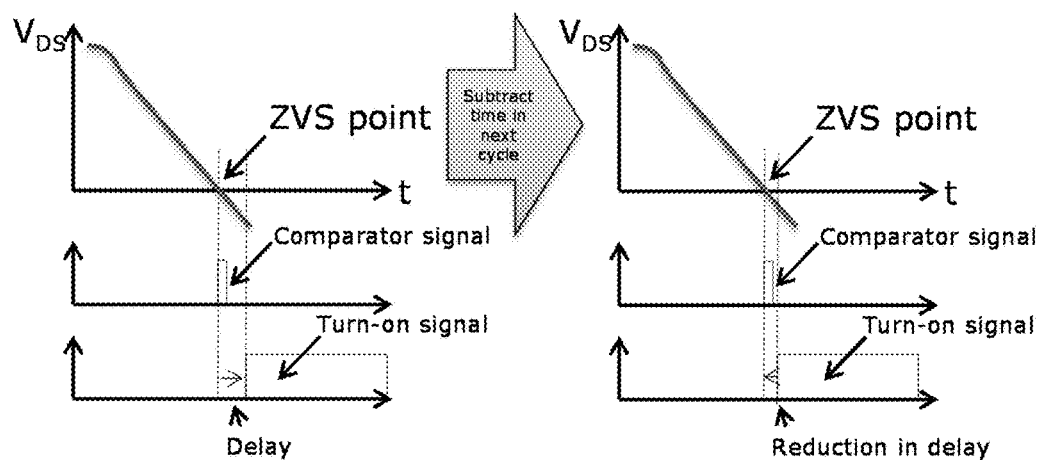
FIG. 30b illustrates a timing diagram of the switch driver circuit.

FIG. 30b shows timing diagrams that illustrates the operation of tracking control circuit 3034. In an embodiment, ground referenced circuit 3030 is activated via a turn-on signal at a predetermined time delay relative to when comparator 3032 detects a zero crossing. When the detected zero voltage point (comparator signal) is detected prior to when ground referenced circuit 3030 is activated (turn-on signal), the predetermined time delay is increased at the next cycle. Conversely, when the detected zero voltage point (comparator signal) is detected after the ground referenced circuit 3030 is activated (turn-on signal), the predetermined time delay is decreased at the next cycle. In some embodiments, tracking control circuit 3034 measures the actual phase or time difference that the zero voltage point leads or lags the turn-on signal and then adjusts the turn-on time in accordance with the measured phase or time difference. Alternatively, tracking point control circuit 3034 determines only whether the detected zero voltage point leads or lags the turn-on signal and adds or subtracts a fixed time adjustment at the next cycle depending on the measurement.

Figure 30C:
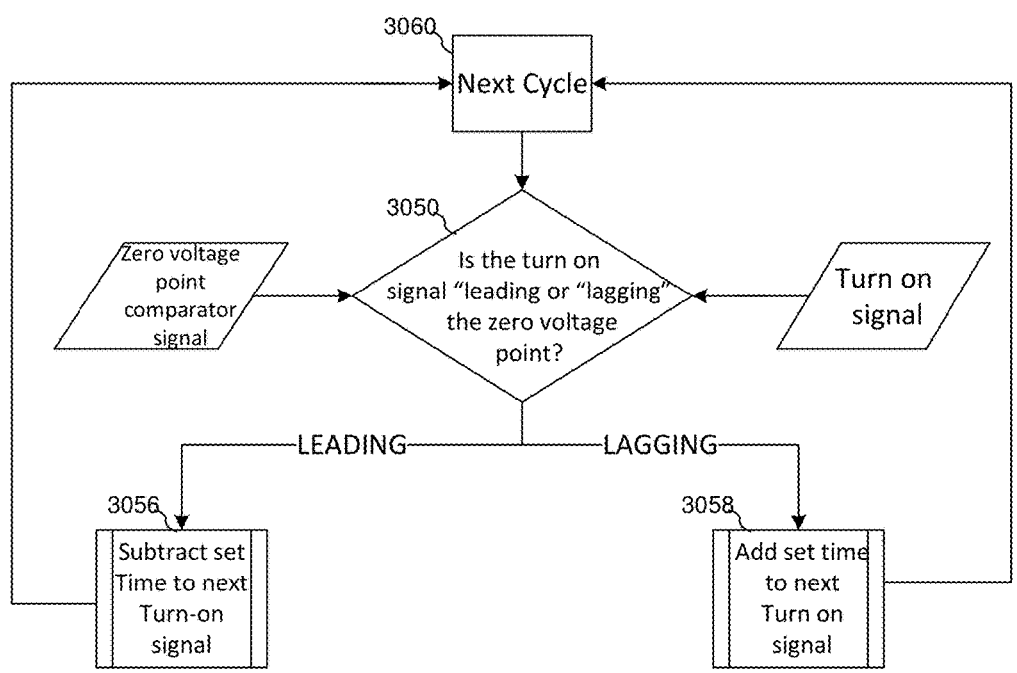
FIG. 30c illustrates a flowchart describing the operation of zero voltage switching tracking controller of the embodiment switch driver circuit.

FIG. 30c illustrates a flow chart of an embodiment method of performing zero voltage switching for an embodiment bidirectional switch driver. In step 3050 a determination is made whether or the zero voltage comparator signal is leading or lagging with response to the turn-on signal. If the comparator signal is leading the turn-on time, a set amount of time is subtracted from the amount of time until the next turn-on signal. On the other hand, if the comparator signal is lagging the turn-on time, a set amount of time is added to the amount of time until the next turn-on signal. During step 3060, the turn-on signal is asserted based on the timing adjusted during steps 3056 and 3058.

Figure 31:
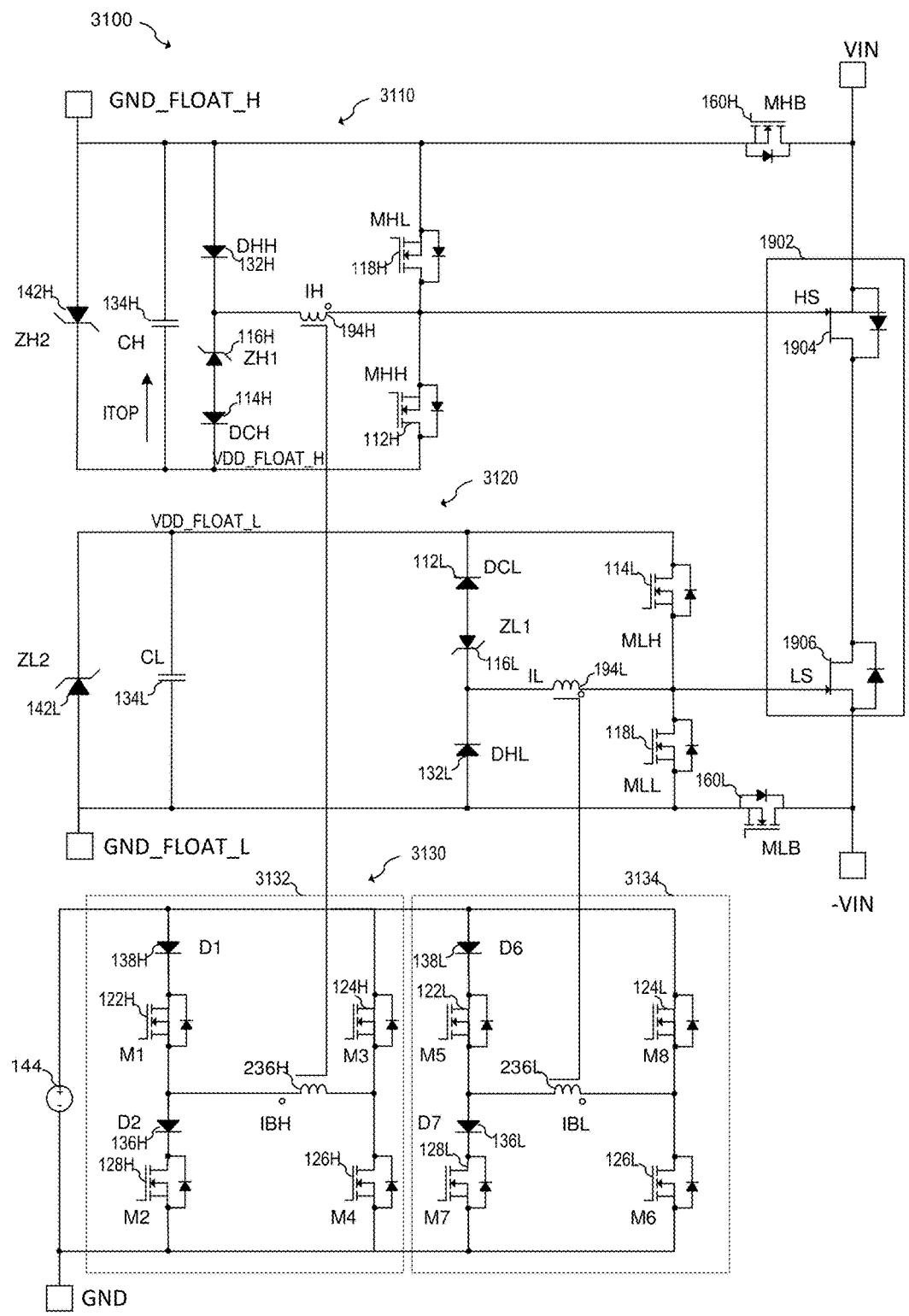
FIG. 31 illustrates a schematic of an embodiment bidirectional switch driver circuit in which each transistor in the bidirectional switch is driven independently.

FIG. 31 illustrates a further embodiment bidirectional switch driver 3100 that may be used, for example, to independently control the floating GaN transistor 1904 and GaN transistor 1906. As shown the floating gate driver 3110 and the ground referenced gate driver 3130 are similar in structure and operation as the floating driver 2010 shown in FIG. 20 and the floating drivers 2610 and 2620 shown in FIG. 26 and described above. In some embodiments, the floating gate driver 3110 and 3120 may be implemented using symmetric and/or identical circuitry. Each of the floating gate driver 3110 and 3120 are referenced their own individual floating power supplies, with the floating gate driver 3110 referenced to a floating power supply between nodes VDD_FLOAT_H and GND_FLOAT_H, and the floating gate driver circuit 3120 referenced to a floating power supply between nodes VDD_FLOAT_L and GND_FLOAT_L. Moreover, each of the floating gate driver 3110 and 3120 receives energy and signaling via magnetic coupling from ground side circuit 3130 in a similar manner as the embodiment of FIG. 26 as described above. However, in the case of bidirectional switch driver 3100, ground referenced circuit 3130 includes two independent driving circuits 3132 and 3134 that independently control the floating gate driver 3110 and 3120 via coupled inductors 194H and 194L, respectively. In some embodiments, the floating gate driver 3110 and the ground referenced gate driver 3130 may each further include a control circuit (not shown) similar to controllers 2611 and 2621 shown and described above with respect to FIG. 26a. Each of these controllers may utilize the floating switching logic described in FIG. 24a hereinabove and the floating startup logic described in FIG. 25c hereinabove.

Independent driving circuit 3132, which is configured to control high-side gate driver circuit gate driver circuit 3110 includes an H-bridge having transistors 122H, 124H, 126H and 128H coupled to inductor 236H. Diode 138H is coupled in series with transistor 122H and diode 136H is coupled in series with transistor 128H. During operation, independent driving circuit 3132 controls the floating gate drive circuit 3110 via coupled inductors 236H and 194H in a similar manner as how ground side circuit 2630 controls the floating gate driver circuit 2610 as described above with respect to FIG. 26. In some embodiments, independent driving circuit 3132 may have a controller (not shown) that activates transistors 122H, 124H, 126H and 128H according to the methods described above with respect to FIG. 27a for nominal operation and FIG. 27b for startup operation.

Similar to independent driving circuit 3132, independent driving circuit 3134 which is configured to control low-side gate driver circuit gate driver circuit 3120 includes an H-bridge having transistors 122L, 124L, 126L and 128L coupled to inductor 236L. Diode 138L is coupled in series with transistor 122L and diode 136L is coupled in series with transistor 128L. During operation, independent driving circuit 3134 controls the floating gate drive circuit 3120 via coupled inductors 236L and 194L in a similar manner as how ground side circuit 2630 controls the floating gate driver circuit 2610 as described above with respect to FIG. 26. In some embodiments, independent driving circuit 3134 may have a controller (not shown) that activates transistors 122L, 124L, 126L and 128L according to the methods described above with respect to FIG. 27a for nominal operation and FIG. 27b for startup operation.

In various embodiments, independent drivers 3132 and 3134 of the ground referenced circuit 3130 are used to active transistors 1904 and 1906 at different times via the floating gate driver circuits 3110 and 3120, respectively. Activating and deactivating transistors 1904 and 1906 independently from the other one allows for clamping the voltage across the reverse characteristic of transistors 1904 and 1906 switch and for the turning on of the other one of transistors 1904 and 1906 under zero voltage conditions. In some embodiments, bidirectional switch driver 3100 may be used to implement zero voltage switching methods described hereinabove with respect to FIGS. 30a-30c described above. Bidirectional switch driver 3100 may be further applied, for example, to the operation of a matrix converter or a ZVS AC flyback converter.

Embodiments of the present invention are summarized here. Other embodiments can also be understood form the entirety of the specification and the claims filed herein. One general aspect includes a method of controlling a switch driver that includes energizing a first inductor in a first direction with a first energy, where the first inductor is coupled between a first switch-driving terminal of the switch driver and a first internal node; transferring the first energy from the first inductor to a second inductor, where the second inductor is coupled between a second switch-driving terminal of the switch driver and a second internal node, and the second inductor is magnetically coupled to the first inductor; asserting a first turn-on signal at the second switch-driving terminal using the transferred first energy; energizing the first inductor in a second direction opposite the first direction with a second energy after asserting the first turn-on signal at the second switch-driving terminal; transferring the second energy from the first inductor to the second inductor; and asserting a first turn-off signal at the second switch-driving terminal using the transferred second energy.

Implementations may include one or more of the following features. The method where energizing the first inductor in the first direction includes asserting a second turn-off signal at the first switch-driving terminal. The method further including charging a bootstrap or floating capacitor using the transferred first energy in the second inductor, where the bootstrap or floating capacitor is coupled between a second supply node and a second reference node of the switch driver. The method further including: monitoring a first voltage at the second internal node; and asserting the first turn-on signal at the second switch-driving terminal based on the first voltage crossing a first threshold. The method further including monitoring a voltage across a sensing diode. The method further including: driving a gate node of a first switching transistor of a half H-bridge via the first switch-driving terminal; and driving a gate node of a second switching transistor of the half H-bridge via the second switch-driving terminal.

In some embodiments, the first switch-driving terminal is a ground referenced or low side switch-driving terminal; and the second switch-driving terminal is a floating or high side switch-driving terminal. Asserting the turn-off signal may include charging the second internal node; monitoring the voltage at the second internal node; and comparing the monitored voltage to a second threshold voltage. In some embodiments, monitoring the voltage at the second internal node includes monitoring a voltage between the second internal node and a floating reference terminal.

The method may also perform a start-up sequence including: energizing the first inductor in the second direction with a third energy for a first time interval while the first switch is turned off; transferring the third energy stored in the first inductor to the second inductor while the second switch is turned off; charging a floating or bootstrap capacitor using the transferred third energy in the second inductor, where the floating or bootstrap capacitor is coupled between a second supply node and a second reference node of the switch driver; and terminating the start-up sequence when a voltage across the floating or bootstrap capacitor crosses a first level. In some embodiments, terminating the start-up sequence occurs after a predetermined time. The method may further include determining the first time interval based on a value of a peak current flowing through the first inductor. In some examples, the method also includes turning off a reference switch during the start-up sequence, where the reference switch is coupled between a second terminal of the second switch and a second terminal of a sensing diode. In some embodiments, the method further includes: energizing the second inductor with a fourth energy; and transferring the fourth energy from the second inductor to the first inductor.

Another general aspect includes a circuit including: a first switching circuit having a first switch-driving terminal configured to be coupled to a gate node of a first switching transistor; a first inductor having a first terminal coupled to a first internal node of the first switching circuit and a second terminal coupled to a first switch-driving terminal of the first switching circuit; a second switching circuit having a second switch-driving terminal configured to be coupled to a gate node of a second switching transistor; a second inductor having a first terminal coupled to a second internal node of the second switching circuit and a second terminal coupled to a second switch-driving terminal of the second switching circuit, where the second inductor is magnetically coupled to the first inductor; and a second switching transistor having a gate terminal configured to be coupled to the second switch-driving terminal of the second switch circuit.

Implementations may include one or more of the following features. The circuit further including a floating or bootstrap capacitor having a first terminal coupled to a third internal node of the second switching circuit and a second terminal coupled to a fourth internal node of the second switching circuit. In some embodiments, the circuit further includes a controller circuit coupled to the first switching circuit, where the controller circuit is configured to: energize the first inductor in a first direction with a first energy via the first switching circuit; and energize the first inductor in a second direction with a second energy via the first switching circuit. The first switching circuit may include, for example, a first pull-up switch having a first terminal coupled to a first power supply terminal and a second terminal coupled to the first switch-driving terminal; a first pull-down switch having a first terminal coupled to the first switch-driving terminal and a second terminal coupled to a reference terminal of the first switching circuit; a second pull-up switch having a first terminal coupled to the first power supply terminal and a second terminal coupled to the first internal node; and a second pull-down switch having a first terminal coupled to the first internal node and a second terminal coupled to the reference terminal.

In some embodiments, the circuit further includes: a first blocking diode coupled in series with the second pull-down switch; and a second blocking diode coupled in series with the second pull-up switch. The second switching circuit may also include: a third pull-up switch having a first terminal coupled to a first terminal of a floating or bootstrap capacitor and a second terminal coupled to the second switch-driving terminal; a third pull-down switch having a first terminal coupled to the second switch-driving terminal and a second terminal coupled to a reference terminal of the second switching circuit; a third blocking diode coupled between the first terminal of the floating or bootstrap capacitor and a third internal node; a sensing diode having an anode coupled between the second internal node and a fourth internal node; and a reference switch having a first terminal coupled to a second terminal of the second switching transistor and a second terminal coupled to the second terminal of the floating or bootstrap capacitor. In some cases, the third pullup switch is turned-on when the second internal node crosses a first threshold; and the third pull-down switch is turned-off when the second internal node crosses a second threshold, where the first threshold is of the opposite polarity of the second threshold. The second switching circuit may further include: a first Zener diode having an anode coupled to the anode of the third blocking diode and a cathode coupled to the second internal node; and a second Zener diode coupled across the floating or bootstrap capacitor.

During a start-up sequence, in some embodiments, the first switching circuit is configured to: energize the first inductor with a third energy for a predetermined period of time by the first switching circuit; transfer the third energy from the first inductor to the second inductor; and pre-charge a floating or bootstrap capacitor using the transferred third energy in the second inductor. In some embodiments, the first switching circuit is configured to energize the first inductor for multiple times until a voltage of the floating or bootstrap capacitor crosses a fixed threshold during the start-up sequence. The circuit may further include the first switching transistor and the second switching transistor, which may be connected in series to form a half H-bridge. The circuit may further including a bootstrap diode coupled between a supply node of the first switching circuit and a bootstrap capacitor coupled across the second switching circuit.

A further general aspect may include a switch driver system having: a first integrated circuit including a first switch-driving terminal configured to be coupled to a control terminal of a first switch and a first terminal of a first inductor that is magnetically coupled to a second inductor; a first inductor connection terminal configured to be coupled to a second terminal of the first inductor, a floating or bootstrap capacitor coupled between a reference connection terminal and a floating power supply node, a first switching circuit coupled to the reference connection terminal, the floating power supply node, the first switch driving terminal, and the first inductor connection terminal, and a first switch controller coupled to the first switching circuit, the first switch controller to activate the first switching circuit based on sensing a signal coupled from the first inductor.

Implementations may include one or more of the following features. The switch driver system further including: a second integrated circuit including a second switch-driving terminal configured to be coupled to a control terminal of a second switch and a first terminal of a second inductor, a second inductor connection terminal configured to be coupled to a second terminal of the second inductor, a second switching circuit coupled to a power supply terminal, a ground reference terminal, the second switch driving terminal and the second inductor connection terminal, and a second controller coupled to the second switching circuit, the second switch controller configured to energize the second inductor in a first direction, and energize the second inductor in a second direction. In some embodiments, energy transferred from the first inductor to the second inductor is used by the second switch driving circuit to charge the floating capacitor. The first switching circuit may include: a first transistor coupled between the first switch driving terminal and the reference connection terminal; and a second transistor coupled between the floating power supply node and the first switch driving terminal. In some implementations, the switch driver system further includes: a first diode coupled between the first inductor connection terminal and the reference connection terminal; and a second diode coupled between the floating power supply node and the first inductor connection terminal.

In some embodiments, the first switch controller is configured to: turn on the first transistor and turn off the second transistor when a voltage of the first inductor connection terminal crosses a first threshold; and turn on the second transistor and turn off the first transistor when a voltage of the first inductor connection terminal crosses a second threshold. The first threshold may be, for example, about −10 V, and the second threshold may be, for example, about +5 V.

A further general aspect includes a method of operating a switch driver for a bidirectional switch, the method including: turning on the bidirectional switch by energizing a first source inductor in a first direction with a first energy, transferring a first portion of the first energy from the first source inductor to a first target inductor coupled between a first switch driving terminal of the switch driver and a first internal node, where the first target inductor is magnetically coupled to the first source inductor, asserting a first turn-on signal at the first switch driving terminal using the transferred first portion of the first energy, and asserting a second turn-on signal at a second switch driving terminal; and turning off the bidirectional switch by: energizing the first source inductor in a second direction opposite the first direction with a second energy, transferring a first portion of the second energy from the first source inductor to the first target inductor, and asserting a first turn-off signal at the first switch driving terminal using the transferred first portion of the second energy, and asserting a second turn-off signal at the second switch driving terminal.

Implementations may include one or more of the following features. The method where asserting the second turn-on signal at the second switch driving terminal includes asserting the second turn-on signal when asserting the first turn-on signal; and asserting the second turn-off signal at the second switch driving terminal includes asserting the second turn-off signal when asserting the first turn-off signal. Asserting the second turn-on signal may include transferring a second portion of the first energy from the first source inductor to a further target inductor coupled between the second switch driving terminal of the switch driver and a second internal node, where the further target inductor is magnetically coupled to the first source inductor, and using the transferred second portion of the first energy to assert the second turn-on signal; and asserting the second turn-off signal includes transferring a second portion of the second energy from the first source inductor to the further target inductor, and using the transferred second portion of the second energy to assert the second turn-off signal. In some embodiments, a polarity of the first turn-on signal is opposite a polarity of the first turn-off signal with respect to a reference node of a first switch of the bidirectional switch; and a polarity of the second turn-on signal is opposite a polarity of the second turn-off signal with respect to a reference node of a second switch of the bidirectional switch.

The method may further include performing zero voltage switching, where performing zero voltage switching includes: turning-on the bidirectional switch at a first phase of a switching cycle; determining a first time point when a current through the bidirectional switch reverses polarity; increasing the first phase when the first time point leads the turning-on of the bidirectional switch; and decreasing the first phase when the first time point lags the turning-on of the bidirectional switch. The method may also include monitoring the current through the bidirectional switch.

In an embodiment, monitoring the current through the bidirectional switch includes monitoring a voltage across a resistor coupled in series with the bidirectional switch. The method may also include topping-off a floating capacitor coupled to the first target inductor, wherein topping-off the floating capacitor includes energizing the first source inductor in the first direction with a third energy, transferring the third energy from the first source inductor to the floating capacitor via the first target inductor. Topping-off is performed, for example, when asserting the first turn-on signal and the second turn-on signal. Asserting the second turn-on signal may include energizing a second source inductor in the first direction with a third energy, transferring a first portion of the third energy from the second source inductor to a second target inductor coupled between a second switch driving terminal of the switch driver and a second internal node, where the second target inductor is magnetically coupled to the second source inductor, and asserting the second turn-on signal at the second switch driving terminal using the transferred first portion of the third energy; and asserting the second turn-off signal includes energizing the second source inductor in the second direction with a fourth energy, transferring a first portion of the fourth energy from the second source inductor to the second target inductor, and asserting the second turn-off signal at the first switch driving terminal using the transferred first portion of the fourth energy.

The method may further include driving a first transistor of the bidirectional switch from the first switch driving terminal; and driving a second transistor of the bidirectional switch from the second switch driving terminal. In some embodiments, the first transistor and the second transistor are gallium nitride (GaN) transistors. Asserting the second turn-on signal may include activating a pullup switch coupled between the second switch driving terminal and a source supply node; and asserting the second turn-off signal includes activating a pulldown switch coupled between the second switch driving terminal and a source reference node.

In some embodiments, the method further includes delaying activating the pulldown switch for a first delay time to synchronize the second turn-off signal with the first turn-off signal. Asserting the first turn-on signal may include activating a pullup switch coupled between the first switch driving terminal and a target supply node; and asserting the first turn-off signal may include activating a pulldown switch coupled between the first switch driving terminal and a target reference node. The method may also include monitoring a first voltage between the first internal node and the target reference node; determining when the first voltage exceeds a first negative threshold; and asserting the first turn-off signal may further include activating the pulldown switch when the first voltage exceeds the first negative threshold based on the determining.

In an embodiment, the method further including repeatedly performing a startup sequence, where the startup sequence includes energizing the first source inductor in the second direction with a third energy for a first time interval while the bidirectional switch is turned off, transferring the third energy stored in the first source inductor to the first target inductor while the bidirectional switch is turned off, and charging a floating capacitor using the transferred third energy, where the floating capacitor is coupled between a second supply node and a second reference node of the switch driver; and terminating the startup sequence when a voltage across the floating capacitor crosses a first level.

Another general aspect includes a circuit for driving a bidirectional switch including: a first switch driver circuit having a first switch driving terminal configured to be coupled to a gate node of a first switch of the bidirectional switch; a second switch driver circuit having a second switch driving terminal configured to be coupled to a gate node of a second switch of the bidirectional switch; a first source inductor driving circuit; a first source inductor having a first terminal coupled to a first inductor node of the first source inductor driving circuit and a second terminal coupled to a second inductor node of the first source inductor driving circuit; a first target inductor having a first terminal coupled to a first internal node of the first switch driver circuit and a second terminal coupled to the first switch driving terminal, where the first source inductor is magnetically coupled to the first target inductor; and a first floating capacitor coupled between a floating reference node of the first switch driver circuit and a floating supply node of the first switch driver circuit.

Implementations may include one or more of the following features. The circuit further including: a second source inductor driving circuit; a second source inductor having a first terminal coupled to a first inductor node of the second source inductor driving circuit and a second terminal coupled to a second inductor node of the second source inductor driving circuit; and a second target inductor having a first terminal coupled to a first internal node of the second switch driver circuit and a second terminal coupled to the second switch driving terminal, where the second source inductor is magnetically coupled to the second target inductor; and a second floating capacitor coupled between a floating reference node of the second switch driver circuit and a floating supply node of the second switch driver circuit. The circuit where the first source inductor driving circuit is configured to: energize the first source inductor in a first direction with a first energy, where the first energy is transferred to the first switch driver circuit via the first target inductor; and energize the first source inductor in a second direction opposite the first direction with a second energy, where the second energy is transferred to the first switch driver circuit via the first target inductor. In some embodiments, the first switch driver circuit is configured to: receive the first energy via the first target inductor; use the first energy to assert a first turn-on signal at the first switch driving terminal; receive the second energy via the first target inductor; and use the second energy to assert a first turn-off signal at the first switch driving terminal.

In some embodiments, the first switch driver circuit includes: a fourth pull-up switch coupled between the supply node of the first switch driver circuit and the first switch driving terminal; a fourth pull-down switch coupled between a reference node of the first switch driving circuit and the first switch driving terminal; a first diode coupled between supply node of first switch driver circuit and the first internal node of the first switch driver circuit; and a first diode coupled between the first internal node of the first switch driving circuit and the first internal node of the first switch driver circuit. In an embodiment, the first turn-on signal has a polarity opposite the first turn-off signal.

In an embodiment, the first switch driver circuit includes: a fourth pull-up switch coupled between the supply node of the first switch driver circuit and the first switch driving terminal; a fourth pull-down switch coupled between the supply node of the first switch driving terminal and the first internal node of the first switch driving circuit; and a reference node of the first switch driving circuit and the first switch driving terminal. The first source inductor driving circuit may include a first pullup switch coupled between a first power supply node and the first inductor node; a second pullup switch coupled between the first power supply node and the second inductor node; a first pulldown switch coupled between the first inductor node and a first reference node; and a second pulldown switch coupled between the second inductor node and the first reference node. The circuit my also include: a first blocking diode coupled in series with the first pulldown switch; and a second blocking diode coupled in series with the first pullup switch.

In some embodiments, the second switch driver circuit includes: a third pullup switch coupled between a first power supply node and the second switch driving terminal; and a third pulldown switch coupled between a first reference supply node and the second switch driving terminal. The first switch driver circuit may include: a fourth pull-up switch coupled between the supply node of the first switch driver circuit and the first switch driving terminal; a fourth pull-down switch coupled between a reference node of the first switch driving circuit and the first switch driving terminal; a first diode coupled between supply node of first switch driver circuit and the first internal node of the first switch driver circuit; and a first diode coupled between the first internal node of the first switch driving circuit and the first internal node of the first switch driver circuit.

In an embodiment, the circuit further includes a controller configured to: turn-on the fourth pullup switch when a voltage of the first internal node crosses a first threshold; and turn-off the fourth pullup switch when the first internal node crosses a second threshold, where the first threshold has an opposite polarity of the second threshold. In some embodiments, the first switch and the second switch each include a bi-directional gallium nitride (GaN) switch. The circuit may further include a further target inductor having a first terminal coupled to a first internal node of the second switch driver circuit and a second terminal coupled to the second switch driving terminal, where the first source inductor is magnetically coupled to the further target inductor.

The second switch driver circuit may include a second floating capacitor coupled between a supply node of the second switch driver circuit and a reference node of the second switch driver circuit; a fifth pull-up switch coupled between the supply node of the second switch driver circuit and the second switch driving terminal; a fifth pull-down switch coupled between the reference node of the second switch driver circuit and the second switch driving terminal; and a second diode coupled between the reference node of the second switch driver circuit and the first internal node of the second switch driver circuit.

In some embodiments, the circuit further includes a current sensor configured to be coupled to the bidirectional switch; a controller configured to: turn-on the bidirectional switch at a first phase of a switching cycle; determine a first time point when a current through the bidirectional switch reverses polarity; increase the first phase when the first time point leads the turn-on of the bidirectional switch; and decrease the first phase when the first time point lags the turn-on of the bidirectional switch. The circuit may also include a controller configured to: receive a turn-on command; energize the first source inductor in a first direction with a first energy upon receipt of the turn-on command; receive a turn-off command; and energize the first source inductor in a second direction opposite the first direction with a second energy upon receipt of the turn-off command.

A further aspect includes a switch driver system including: a first integrated circuit including a first switch driving terminal configured to be coupled to a control terminal of a first switch of a bidirectional switch and a first terminal of a first inductor that is magnetically coupled to a second inductor; a first inductor connection terminal configured to be coupled to a second terminal of the first inductor; a floating capacitor coupled between a reference connection terminal and a floating power supply node; a first switching circuit coupled to the reference connection terminal, the floating power supply node, the first switch driving terminal, and the first inductor connection terminal; and a first switch controller coupled to the first switching circuit, the first switch controller configured to assert a first turn-on signal at the first switch driving terminal via the first switching circuit upon sensing a coupled signal of a first polarity at the first inductor; assert a first turn-off signal at the first switch driving terminal via the first switching circuit upon sensing a coupled signal of a second polarity at the first inductor.

Implementations may include one or more of the following features. The switch driver system where the first switch controller is further configured to top-off the floating capacitor via the first switching circuit upon sensing the coupled signal of the first polarity at the first inductor and when the first turn-on signal is asserted. The switch driver system where the first integrated circuit is configured to use energy transferred from the second inductor to the first inductor to assert the first turn-on signal. In an embodiment, the first switch controller is configured to: assert the first turn-on signal when a voltage of the first inductor connection terminal crosses a first threshold; and de-assert the first turn-on signal when a voltage of the first inductor connection terminal crosses a second threshold, where the second threshold has an opposite polarity of the first threshold.

The switch driver system may further include a second integrated circuit including a first inductor connection terminal configured to be coupled to a first terminal of the second inductor, a second inductor connection terminal configured to be coupled to a second terminal of the second inductor, a second switching circuit coupled to a power supply terminal, a ground reference terminal, the first inductor connection terminal and the second inductor connection terminal, and a second switch controller coupled to the second switching circuit, the second switch controller configured to energize the second inductor in a first direction upon receipt of a turn-on command, and energize the second inductor in a second direction upon receipt of a turn-off command. In an embodiment, the second integrated circuit further includes a second switch-driving terminal configured to be coupled to a control terminal of a second switch and a first terminal of a second inductor; and the second switch controller is configured to assert a second turn-on signal at the second switch driving terminal upon receipt of the turn-on command, and assert a second turn-off signal at the second switch driving terminal upon receipt of the turn-off command.

Another general aspect includes a method of controlling a switch driver, the method including: energizing a first inductor in a first direction with a first energy; transferring the first energy from the first inductor to a second inductor, where the second inductor is coupled between a second switch-driving terminal of the switch driver and a second internal node, and the second inductor is magnetically coupled to the first inductor; asserting a first turn-on signal at the second switch-driving terminal using the transferred first energy; energizing the first inductor in a second direction opposite the first direction with a second energy after asserting the first turn-on signal at the second switch-driving terminal; transferring the second energy from the first inductor to the second inductor; and asserting a first turn-off signal at the second switch-driving terminal using the transferred second energy.

Implementations may include one or more of the following features. The method where: the first inductor is coupled between a first switch-driving terminal of the switch driver and a first internal node; and energizing the first inductor in the first direction includes asserting a second turn-off signal at the first switch-driving terminal. The method further including charging a capacitor using the transferred first energy in the second inductor, where the capacitor is coupled between a second supply node and a second reference node of the switch driver. The method may also include monitoring a first voltage at the second internal node; and asserting the first turn-on signal at the second switch-driving terminal based on the first voltage crossing a first threshold.

In an embodiment, the method further includes monitoring the first voltage across a sensing diode or switch. The method may also include driving a gate node of a first switching transistor of a half H-bridge via the first switch-driving terminal; and driving a gate node of a second switching transistor of the half H-bridge via the second switch-driving terminal. Asserting the turn-off signal may include charging the second internal node; monitoring the voltage at the second internal node; and comparing the monitored voltage to a second threshold voltage. In an embodiment, monitoring the voltage at the second internal node includes monitoring a voltage between the second internal node and a floating reference terminal. The method may further include energizing the second inductor with a fourth energy; and transferring the fourth energy from the second inductor to the first inductor.

A further general aspect includes a circuit including: a first switching circuit having a first switch-driving terminal configured to be coupled to a gate node of a first switching transistor; a first inductor; a second switching circuit having a second switch-driving terminal configured to be coupled to a gate node of a second switching transistor; a second inductor having a first terminal coupled to a second internal node of the second switching circuit and a second terminal coupled to a second switch-driving terminal of the second switching circuit, where the second inductor is magnetically coupled to the first inductor; and a second switching transistor having a gate terminal configured to be coupled to the second switch-driving terminal of the second switch circuit.

Implementations may include one or more of the following features. The circuit further including a capacitor having a first terminal coupled to a third internal node of the second switching circuit and a second terminal coupled to a fourth internal node of the second switching circuit. The circuit may further include a controller circuit coupled to the first switching circuit, where the controller circuit is configured to: energize the first inductor in a first direction with a first energy via the first switching circuit; and energize the first inductor in a second direction with a second energy via the first switching circuit, where a first terminal of the first inductor is coupled to a first internal node of the first switching circuit and a second terminal of the first inductor is coupled to a first switch-driving terminal of the first switching circuit.

The first switching circuit may include a first pull-up switch having a first terminal coupled to a first power supply terminal and a second terminal coupled to the first switch-driving terminal; a first pull-down switch having a first terminal coupled to the first switch-driving terminal and a second terminal coupled to a reference terminal of the first switching circuit; a second pull-up switch having a first terminal coupled to the first power supply terminal and a second terminal coupled to the first internal node; and a second pull-down switch having a first terminal coupled to the first internal node and a second terminal coupled to the reference terminal. In some embodiments, the circuit further includes a first blocking diode coupled in series with the second pull-down switch; and a second blocking diode coupled in series with the second pull-up switch.

In various embodiments, the second switching circuit further includes: a third pull-up switch having a first terminal coupled to a first terminal of a bootstrap capacitor and a second terminal coupled to the second switch-driving terminal; a third pull-down switch having a first terminal coupled to the second switch-driving terminal and a second terminal coupled to a reference terminal of the second switching circuit; a third blocking diode coupled between the first terminal of the bootstrap capacitor and a third internal node; a sensing diode having an anode coupled between the second internal node and a fourth internal node; and a reference switch having a first terminal coupled to a second terminal of the second switching transistor and a second terminal coupled to the second terminal of the bootstrap capacitor. In some embodiments, the third pullup switch is turned-on when the second internal node crosses a first threshold; and the third pull-down switch is turned-off when the second internal node crosses a second threshold, where the first threshold is of the opposite polarity of the second threshold.

The second switching circuit may further include: a first zener diode having an anode coupled to the anode of the third blocking diode and a cathode coupled to the second internal node; and a second zener diode coupled across the bootstrap capacitor. In some embodiments, the first switching transistor and the second switching transistor are connected in series to form a half H-bridge. The circuit further may further include a bootstrap diode coupled between a supply node of the first switching circuit and a bootstrap capacitor coupled across the second switching circuit.

Another general aspect includes a switch driver system including: a first integrated circuit including a first switch-driving terminal configured to be coupled to a control terminal of a first switch and a first terminal of a first inductor that is magnetically coupled to a second inductor; a first inductor connection terminal configured to be coupled to a second terminal of the first inductor, a capacitor coupled between a reference connection terminal and a floating power supply node, a first switching circuit coupled to the reference connection terminal, the floating power supply node, the first switch driving terminal, and the first inductor connection terminal, and a first switch controller coupled to the first switching circuit, the first switch controller to activate the first switching circuit based on sensing a signal coupled from the first inductor.

Implementations may include one or more of the following features. The switch driver system further including: a second integrated circuit including a second switch-driving terminal configured to be coupled to a control terminal of a second switch and a first terminal of a second inductor, a second inductor connection terminal configured to be coupled to a second terminal of the second inductor, a second switching circuit coupled to a power supply terminal, a ground reference terminal, the second switch driving terminal and the second inductor connection terminal, and a second controller coupled to the second switching circuit, the second switch controller configured to energize the second inductor in a first direction, and energize the second inductor in a second direction. In some embodiments, energy transferred from the first inductor to the second inductor is used by the second switch driving circuit to charge the capacitor.

The switch driver system may include a first transistor coupled between the first switch driving terminal and the reference connection terminal; and a second transistor coupled between the floating power supply node and the first switch driving terminal. In some embodiments, the switch driver system further includes a first diode coupled between the first inductor connection terminal and the reference connection terminal; and a second diode coupled between the floating power supply node and the first inductor connection terminal. In some embodiments, the first switch controller is configured to: turn on the first transistor and turn off the second transistor when a voltage of the first inductor connection terminal crosses a first threshold; and turn on the second transistor and turn off the first transistor when a voltage of the first inductor connection terminal crosses a second threshold.

An advantage of some embodiments of the present invention includes the ability to transfer energy from a low side driver to a high side driver using magnetically coupled low side inductor and a high side inductor. A high voltage bootstrap diode that is used between the low side gate driver and the high side driver can be eliminated by transferring energy via magnetically coupled inductors. The transferred energy may also be used to charge a bootstrap capacitor in the high side gate driver and increase efficiency of the switch driver. Another advantage of the present embodiment is the ability to control high side gate driver from the low side gate driver.

A further advantage of some embodiments include driving a half H-bridge implemented by GaN switch and replenishing the floating capacitor during the time when the high side switch remains turned on. A further advantage includes an ability to transfer energy back and forth between the low side inductor and the high side inductor. Thus, using energy from the gate charge, an efficiency of the switch driver may be increased.

Another advantage of the present embodiment includes reducing power losses in the gate driver circuit by transferring energy from the low side inductor to the high side inductor and recharging the floating capacitor using the transferred energy. The high side gate driver switch control signals are generated based on the actions of the low side control signals and also by monitoring an internal node in the high side gate driver. Thus, separate control signals for high side gate driver are not necessary to drive high side gate driver. High side control signals are generated by the high side gate driver. A high side control circuit may be powered from the floating capacitor. Another advantage of the present embodiment is the ability to eliminate the need for using level shifter circuit and avoid using high voltage transistors to implement level shifter circuits. Yet, another advantage of the present embodiment is the ability to control dead time by adjusting control signals and adding suitable delay between turning off a low side switch and turning on a high side switch or vice versa.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of controlling a switch driver, the method comprising:
   energizing a first inductor in a first direction with a first energy;
   transferring the first energy from the first inductor to a second inductor, wherein the second inductor is coupled between a second switch-driving terminal of the switch driver and a second internal node, and the second inductor is magnetically coupled to the first inductor;
   asserting a first turn-on signal at the second switch-driving terminal using the transferred first energy;
   energizing the first inductor in a second direction opposite the first direction with a second energy after asserting the first turn-on signal at the second switch-driving terminal;
   transferring the second energy from the first inductor to the second inductor; and
   asserting a first turn-off signal at the second switch-driving terminal using the transferred second energy.

2. The method of claim 1, wherein:
   the first inductor is coupled between a first switch-driving terminal of the switch driver and a first internal node; and
   energizing the first inductor in the first direction comprises asserting a second turn-off signal at the first switch-driving terminal.

3. The method of claim 1, further comprising charging a capacitor using the transferred first energy in the second inductor, wherein the capacitor is coupled between a second supply node and a second reference node of the switch driver.

4. The method of claim 1, further comprising:
   monitoring a first voltage at the second internal node; and
   asserting the first turn-on signal at the second switch-driving terminal based on the first voltage crossing a first threshold.

5. The method of claim 4, further comprising monitoring the first voltage across a sensing diode or switch.

6. The method of claim 2, further comprising:
   driving a gate node of a first switching transistor of a half H-bridge via the first switch-driving terminal; and
   driving a gate node of a second switching transistor of the half H-bridge via the second switch-driving terminal.

7. The method of claim 1, wherein asserting the first turn-off signal comprises:
   charging the second internal node;
   monitoring the voltage at the second internal node; and
   comparing the monitored voltage to a second threshold voltage.

8. The method of claim 7, wherein monitoring the voltage at the second internal node comprises monitoring a voltage between the second internal node and a floating reference terminal.

9. The method of claim 1, further comprising:
   energizing the second inductor with a fourth energy; and
   transferring the fourth energy from the second inductor to the first inductor.

10. A circuit comprising:
    a first switching circuit having a first switch-driving terminal configured to be coupled to a gate node of a first switching transistor;
    a first inductor coupled to the first switching circuit;
    a second switching circuit having a second switch-driving terminal configured to be coupled to a gate node of a second switching transistor;
    a second inductor having a first terminal coupled to a second internal node of the second switching circuit and a second terminal coupled to the second switch-driving terminal of the second switching circuit, wherein the second inductor is magnetically coupled to the first inductor.

11. The circuit of claim 10, further comprising a capacitor having a first terminal coupled to a third internal node of the second switching circuit and a second terminal coupled to a fourth internal node of the second switching circuit.

12. The circuit of claim 10, further comprises a controller circuit coupled to the first switching circuit, wherein the controller circuit is configured to:
    energize the first inductor in a first direction with a first energy via the first switching circuit; and
    energize the first inductor in a second direction with a second energy via the first switching circuit, wherein a first terminal of the first inductor is coupled to a first internal node of the first switching circuit and a second terminal of the first inductor is coupled to the first switch-driving terminal of the first switching circuit.

13. The circuit of claim 12, wherein the first switching circuit comprises:
a first pull-up switch having a first terminal coupled to a first power supply terminal and a second terminal coupled to the first switch-driving terminal;
a first pull-down switch having a first terminal coupled to the first switch-driving terminal and a second terminal coupled to a reference terminal of the first switching circuit;
a second pull-up switch having a first terminal coupled to the first power supply terminal and a second terminal coupled to the first internal node; and
a second pull-down switch having a first terminal coupled to the first internal node and a second terminal coupled to the reference terminal.

14. The circuit of claim 13, further comprising:
a first blocking diode coupled in series with the second pull-down switch; and
a second blocking diode coupled in series with the second pull-up switch.

15. The circuit of claim 10, wherein the second switching circuit further comprises:
a third pull-up switch having a first terminal coupled to a first terminal of a bootstrap capacitor and a second terminal coupled to the second switch-driving terminal;
a third pull-down switch having a first terminal coupled to the second switch-driving terminal and a second terminal coupled to a reference terminal of the second switching circuit;
a third blocking diode coupled between the first terminal of the bootstrap capacitor and a third internal node;
a sensing diode having an anode coupled between the second internal node and a fourth internal node; and
a reference switch having a first terminal coupled to a second terminal of the second switching transistor and a second terminal coupled to the second terminal of the bootstrap capacitor.

16. The circuit of claim 15, wherein:
the third pull-up switch is turned-on when the second internal node crosses a first threshold; and
the third pull-down switch is turned-off when the second internal node crosses a second threshold, wherein the first threshold is of the opposite polarity of the second threshold.

17. The circuit of claim 15, wherein the second switching circuit further comprising:
a first zener diode having an anode coupled to the anode of the third blocking diode and a cathode coupled to the second internal node; and
a second zener diode coupled across the bootstrap capacitor.

18. The circuit of claim 10, further comprising the first switching transistor and the second switching transistor.

19. The circuit of claim 18, wherein the first switching transistor and the second switching transistor are connected in series to form a half H-bridge.

20. The circuit of claim 10, further comprising a bootstrap diode coupled between a supply node of the first switching circuit and a bootstrap capacitor coupled across the second switching circuit.

21. A switch driver system comprising:
a first integrated circuit comprising
a first switch-driving terminal configured to be coupled to a control terminal of a first switch and a first terminal of a first inductor that is magnetically coupled to a second inductor;
a first inductor connection terminal configured to be coupled to a second terminal of the first inductor,
a capacitor coupled between a reference connection terminal and a floating power supply node,
a first switching circuit coupled to the reference connection terminal, the floating power supply node, the first switch driving terminal, and the first inductor connection terminal, and
a first switch controller coupled to the first switching circuit, the first switch controller to activate the first switching circuit based on sensing a signal coupled from the first inductor.

22. The switch driver system of claim 21, further comprising:
a second integrated circuit comprising
a second switch-driving terminal configured to be coupled to a control terminal of a second switch and a first terminal of a second inductor,
a second inductor connection terminal configured to be coupled to a second terminal of the second inductor,
a second switching circuit coupled to a power supply terminal, a ground reference terminal, the second switch driving terminal and the second inductor connection terminal, and
a second switch controller coupled to the second switching circuit, the second switch controller configured to energize the second inductor in a first direction, and energize the second inductor in a second direction.

23. The switch driver system of claim 22, wherein energy transferred from the first inductor to the second inductor is used by the second switch driving circuit to charge the capacitor.

24. The switch driver system of claim 21, wherein the first switching circuit comprises:
a first transistor coupled between the first switch driving terminal and the reference connection terminal; and
a second transistor coupled between the floating power supply node and the first switch driving terminal.

25. The switch driver system of claim 24, further comprising:
a first diode coupled between the first inductor connection terminal and the reference connection terminal; and
a second diode coupled between the floating power supply node and the first inductor connection terminal.

26. The switch driver system of claim 25, wherein the first switch controller is configured to:
turn on the first transistor and turn off the second transistor when a voltage of the first inductor connection terminal crosses a first threshold; and
turn on the second transistor and turn off the first transistor when a voltage of the first inductor connection terminal crosses a second threshold.

* * * * *